US006638806B2

(12) United States Patent
Igarashi et al.

(10) Patent No.: US 6,638,806 B2
(45) Date of Patent: Oct. 28, 2003

(54) SEMICONDUCTOR DEVICE AND METHOD OF FABRICATING THE SAME

(75) Inventors: Takayuki Igarashi, Hyogo (JP); Yoshitaka Ootsu, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/140,942

(22) Filed: May 9, 2002

(65) Prior Publication Data

US 2002/0192893 A1 Dec. 19, 2002

(30) Foreign Application Priority Data

Jun. 13, 2001 (JP) ....................................... 2001-178229

(51) Int. Cl.[7] ........................................... H01L 21/8238
(52) U.S. Cl. ....................................... 438/234; 438/202
(58) Field of Search ................................ 438/202, 234, 438/203, 204, 205, 365; 257/273, 274, 378, 370

(56) References Cited

U.S. PATENT DOCUMENTS

| | | | | |
|---|---|---|---|---|
| 5,354,699 A | * | 10/1994 | Ikeda et al. | 438/234 |
| 6,027,962 A | * | 2/2000 | Igarashi et al. | 438/202 |
| 6,066,521 A | * | 5/2000 | Yokoyama et al. | 438/202 |
| 6,281,060 B1 | * | 8/2001 | Igarashi et al. | 438/202 |
| 6,426,533 B2 | * | 7/2002 | Igarashi et al. | 257/378 |

FOREIGN PATENT DOCUMENTS

JP 11-265953 A 9/1999

* cited by examiner

*Primary Examiner*—Tuan H. Nguyen
(74) *Attorney, Agent, or Firm*—McDermott, Will & Emery

(57) ABSTRACT

A collector region is formed on a semiconductor substrate. An emitter electrode, an external base electrode and a gate electrode are formed on the semiconductor substrate. The position of the interface between the gate electrode and the semiconductor substrate is rendered higher than the position of the interface between the external base electrode and the semiconductor substrate. Thus provided is a semiconductor device so improved that dispersion of the withstand voltage of a gate oxide film and dispersion of characteristics such as a threshold voltage and a drain-to-source current are reduced.

10 Claims, 82 Drawing Sheets

SEMICONDUCTOR DEVICE AND METHOD OF FABRICATING THE SAME

BACKGROUND OF THE INVENTION

1. Field of the Invention

The present invention generally relates to a method of fabricating a semiconductor device, and more specifically, it relates to a method of fabricating a BiCMOS (Bipolar-Complementary Metal Oxide Semiconductor) device having a bipolar transistor and a CMOS (Complementary Metal Oxide Semiconductor) transistor. The present invention also relates to a semiconductor device obtained by this method.

2. Description of the Prior Art

A BiCMOS device provided with both of a bipolar transistor having high-speed performance and excellent drivability and CMOS transistors allowing high integration and having low power consumption is generally employed as a semiconductor device.

FIG. 82 is a sectional view of a conventional BiCMOS device.

First, a bipolar transistor part is described.

An $N^+$-type embedded layer 3 is formed on a P-type silicon substrate 1, and an N-type epitaxial layer 4 is further formed on the upper surface thereof. A field oxide film 7, a P-type well region 12 and a P-type isolation region 5 are formed for element isolation. A base region, consisting of a P-type intrinsic base region 16 and a $P^+$-type external base region 18, and an $N^+$-type emitter region 19 are formed on a surface part of the N-type epitaxial layer 4. The field oxide film 7 is held between an $N^+$-type collector region 2 and the epitaxial layer 4. The $N^+$-type collector region 2 reaches the $N^+$-type embedded layer 3.

A $P^+$-type external base draw-out electrode 13 is provided on the external base region 18. The external base draw-out electrode 13 extends onto the field oxide film 7. An $N^+$-type emitter electrode 20 is formed in an emitter opening of the external base draw-out electrode 13. The emitter electrode 20 and the external base draw-out electrode 13 are electrically isolated from each other by side wall oxide films 17 and an oxide film 14. An interlayer isolation film 32 covers the external base draw-out electrode An interlayer isolation film 32 covers the external base draw-out electrode 13, the emitter electrode 20 and the $N^+$-type collector region 2. Contact holes 6 are formed in the interlayer isolation film 32. Metal wires 33 (aluminum wires, for example) are formed in the contact holes 6.

CMOS transistor parts are now described.

First, a PMOS (P channel Metal Oxide Semiconductor) part is described. An $N^+$-type embedded layer 3 is formed on the P-type silicon substrate 1. An N-type well region 10 is formed on the upper surface of the $N^+$-type embedded layer 3. A field oxide film 7 is formed for element isolation. A gate electrode 22 ($N^+$-type polysilicon film, for example) is formed on the surface of the N-type well region 10. $P^+$-type source/drain regions 31 are formed on the surface of the N-type well region 10 on both sides of the gate electrode 22. The interlayer isolation film 32 covers the $P^+$-type source/drain regions 31 and the gate electrode 22. Contact holes 6 are formed in the interlayer isolation film 32. Metal wires 33 (aluminum wires, for example) are formed in the contact holes 6.

An NMOS (N channel Metal Oxide Semiconductor) part is now described. A P-type isolation region 5 is formed on the P-type silicon substrate 1. A P-type well region 12 is formed on the upper surface of the P-type isolation region 5. A field oxide film 7 is formed for element isolation. A gate electrode 22 ($N^+$-type polysilicon film) is formed on the surface of the P-type well region 12. $N^+$-type source/drain regions 30 are formed on the surface of the P-type well region 12 on both sides of the gate electrode 22. The interlayer isolation film 32 covers the $N^+$-type source/drain regions 30 and the gate electrode 22. Contact holes 6 are formed in the interlayer isolation film 32. Metal wires 33 (aluminum wires, for example) are formed in the contact holes 6.

A method of fabricating the BiCMOS device shown in FIG. 82 is now described.

Referring to FIG. 70, the $N^+$-type embedded layers 3, the P-type isolation regions 5, the N-type epitaxial layer 4, the field oxide films 7 and the $N^+$-type collector region 2 are formed on the P-type silicon substrate 1. Then, an underlayer oxide film 8 is formed on the surface of the silicon substrate 1. The thickness of the underlayer oxide film 8 is 30 nm, for example. A resist mask 9 is formed on the silicon substrate 1 by patterning. N-type impurities 111 are implanted into a region for forming a PMOS transistor through the resist mask 9. The impurities are implanted in a divided manner (phosphorus is implanted at 400 KeV by $2\times10^{12}$ $cm^{-2}$ and at 180 KeV by $4\times10^{12}$ $cm^{-2}$ and boron is implanted at 20 KeV by $3\times10^{12}$ $cm^{-2}$, for example) for forming the N-type well region 10 (see FIG. 71). Thereafter the resist mask 9 is removed.

Referring to FIG. 71, a resist mask 11 is formed on the silicon substrate 1 by patterning. A P-type impurity 222 is implanted into a region for forming an NMOS transistor through the resist mask 11, thereby forming the P-type well region 12 (see FIG. 72). Also in this case, the impurity is implanted in a divided manner (boron is implanted at 300 KeV by $1\times10^{12}$ $cm^{-2}$, at 160 KeV by $3\times10^{12}$ $cm^{-2}$ and at 50 KeV by $6\times10^{12}$ $cm^{-2}$, for example). Thereafter the resist mask 11 is removed.

Referring to FIGS. 71 and 72, the underlayer oxide film 8 is removed and a polysilicon film 13 is deposited on the overall surface by 150 nm, for example, and a P-type impurity is implanted into the polysilicon film 13 ($BF_2$ is implanted at 40 KeV by $4\times10^{15}$ $cm^{-2}$, for example). Then, a CVD (Chemical Vapor Deposition) oxide film 14 is deposited on the overall surface by 300 nm, for example.

Referring to FIGS. 72 and 73, the CVD oxide film 14 and the polysilicon film 13 are patterned by etching, for forming the external base electrode 13. At this time, the surfaces of the collector region 2, the emitter opening, the N-type well region 10 and the P-type well region 12 are etched. Referring to FIG. 73, symbols A-1, B-1, C-1 and D-1 denote the collector region 2, the emitter opening, the N-type well region 10 and the P-type well region 12 respectively.

Referring to FIG. 74, a resist mask 15 is formed on the silicon substrate 1 by patterning. A P-type impurity 333 is implanted into the emitter opening ($BF_2$ is implanted at 25 KeV by $8\times10^{13}$ $cm^{-2}$, for example) through the resist mask 15, for forming the intrinsic base region 16 (see FIG. 75).

Referring to FIG. 75, a CVD oxide film (not shown) is formed on the overall upper surface of the silicon substrate 1 and dry-etched, for forming the side wall oxide films 17 in the emitter opening.

Referring to FIG. 76, a polysilicon film for defining the emitter electrode 20 is deposited on the overall surface by 150 nm, for example, and an N-type impurity is implanted into this polysilicon film (arsenic is implanted at 50 KeV by $1\times10^{16}$ $cm^{-2}$, for example). After this impurity implantation, annealing is performed for diffusing arsenic into the intrinsic base region 16 from the polysilicon film, thereby forming the emitter region 19. At this time, boron diffuses from the external base electrode 13, for forming the external base region 18.

While diffusion of boron takes place also in heat treatment preceding this annealing step, such diffusion is not illustrated. Then, the polysilicon film is etched for forming the emitter electrode 20. At this time, the surfaces of the collector region 2, the N-type well region 10 and the P-type well region 12 are etched. Referring to FIG. 76, symbols A-2, C-2 and D-2 denote the collector region 2, the N-type well region 10 and the P-type well region 12 respectively.

Referring to FIG. 77, gate oxide films 21 are formed in a thickness of 10 nm, for example. Thereafter an N-type polysilicon film for defining the gate electrodes 22 is formed on the overall surface by 300 nm, for example. Then, the N-type polysilicon film is patterned for forming the gate electrodes 22. At this time, the thin oxide films 21 are formed on the surfaces of the N-type well region 10, the P-type well region 12 and the emitter electrode 20, so that the N-type well region 10, the P-type well region 12 and the emitter electrode 20 are not etched due to the difference between the etching rates for silicon and an oxide film (the etching rate for an oxide film is smaller than that for silicon).

Referring to FIG. 78, a resist mask 23 is formed on the silicon substrate 1 by patterning, and an N-type impurity 444 is implanted into the region for forming the NMOS transistor. For example, phosphorus is implanted at 70 KeV by $1.8\times10^{13}$ $cm^{-2}$ through 45° rotational implantation, for example. Thus, $N^-$-type source/drain regions 25 are formed (see FIG. 79). Thereafter the resist mask 23 is removed.

Referring to FIG. 79, a resist mask 24 is formed by patterning for implanting a P-type impurity 555 into the region for forming the PMOS transistor (boron is implanted at 10 KeV by $1\times10^{13}$ $cm^{-2}$ through 7° rotational implantation, for example), for forming $P^-$-type source/drain regions 26 (see FIG. 80). Thereafter the resist mask 24 is removed.

Referring to FIG. 80, a CVD oxide film is deposited and dry-etched, for forming side wall oxide films 27 on the side walls of the gate electrodes 22. Then, a resist mask 28 is formed by patterning and N-type impurities 666 are implanted into the region for forming the NMOS transistor (phosphorus is implanted at 100 KeV by $2\times10^{14}$ $cm^{-2}$ through 60° rotational implantation and arsenic is implanted at 50 KeV by $4\times10^{15}$ $cm^{-2}$, for example), for forming the $N^+$-type source/drain regions 30 (see FIG. 81). Thereafter the resist mask 28 is removed.

Referring to FIG. 81, a resist mask 29 is formed by patterning, and a P-type impurity 777 is implanted into the region for forming the PMOS transistor ($BF_2$ is implanted at 40 KeV by $4\times10^{15}$ $cm^{-2}$, for example) through the resist mask 29, for forming the $P^+$-type source/drain regions 31 (see FIG. 82).

Thereafter the resist mask 29 is removed.

Referring to FIG. 82, the interlayer isolation film 32 is formed on the silicon substrate 1. The contact holes 6 are formed in the interlayer isolation film 32 for defining openings on the emitter region 20, the external base electrode 13, the $N^+$-type collector region 2, the source/drain regions 30 and 31 and the gate electrodes 22. The metal wires 33 are embedded in the contact holes 6, thereby completing the BiCMOS device.

The depths of the diffusion layers such as the emitter region 19 formed by diffusion of arsenic from the emitter electrode 20, the external base region 18 formed by diffusion of boron from the external base electrode 13, the intrinsic base region 16 and the source/drain regions 30 and 31 are decided by heat treatment performed for completing the device.

In the conventional method of fabricating a BiCMOS device, however, the surface parts of the well regions 10 and 12 of the CMOS transistors are remarkably scraped off due to etching for forming the external base electrode 13 and the emitter electrode 20, as shown in FIGS. 73 and 76. In other words, the N-type well region C-1, the P-type well region D-1 as well as the N-type well region C-2 and the P-type well region D-2 are remarkably scraped off. The scraped surface parts of the well regions C-1, D-1, C-2 and D-2 include implantation regions for adjusting threshold voltages Vth and drain-to-source currents Ids of the CMOS transistors. Boron 111 for forming the N-type well region 10 and boron 222 for forming the P-type well region 12 are implanted into the implantation regions at 20 KeV by $3\times10^{12}$ $cm^{-2}$ and at 50 KeV by $6\times10^{12}$ $cm^{-2}$ respectively. However, the characteristic values cannot be adjusted as designed since the surface parts are scraped off.

Even if swelling caused by etching is previously estimated for implanting boron, homogeneity of etching rates is deteriorated and extremely hard to control since etching is performed twice.

Further, the surfaces of the well regions 10 and 12 of the CMOS transistor parts are so inferior in flatness that it is difficult to uniformalize the thickness of the gate oxide film 21. Thus, the withstand voltage of the gate oxide film 21 as well as the characteristics such as the threshold voltages Vth and the drain-to-source currents Ids are dispersed, and the reliability of the gate oxide film 21 is deteriorated.

SUMMARY OF THE INVENTION

The present invention has been proposed in order to solve the aforementioned problems, and an object thereof is to provide a method of fabricating a semiconductor device so improved as to exhibit no dispersion of the withstand voltage of a gate oxide film.

Another object of the present invention is to provide a method of fabricating a semiconductor device so improved as to exhibit no dispersion of characteristics such as a threshold voltage and a source-to-drain current.

Still another object of the present invention is to provide a method of fabricating a semiconductor device improved to be capable of improving the reliability of a gate oxide film.

A further object of the present invention is to provide a semiconductor device fabricated by such a method.

A first aspect of the present invention relates to a method of fabricating a semiconductor device having a bipolar transistor and a field-effect transistor formed on a semiconductor substrate. First, a first oxide film for defining a gate oxide film and a first conductor film for defining a lower portion of a gate electrode are successively formed on the semiconductor substrate formed with a collector region. The aforementioned first conductor film and the aforementioned first oxide film are selectively etched for exposing a surface portion of the aforementioned semiconductor substrate located on a region for forming the aforementioned bipolar transistor. A second conductor film for defining an external base electrode and an upper portion of the gate electrode are formed on the aforementioned semiconductor substrate to come into contact with the aforementioned exposed surface portion and cover a region for forming the aforementioned field-effect transistor and the aforementioned collector region. A second oxide film is formed on the aforementioned semiconductor substrate to cover the aforementioned second conductor film. The aforementioned second conductor film and the aforementioned second oxide film are selectively etched for exposing a surface portion of the aforementioned semiconductor substrate thereby opening an emitter region. A third conductor film for defining an emitter electrode is formed on the aforementioned second oxide film to come into contact with the aforementioned emitter region. The aforementioned third conductor film is patterned for forming the emitter electrode on the aforementioned semiconductor substrate. The aforementioned second oxide film, the aforementioned second conductor film and the aforementioned first conductor film are patterned for simultaneously forming the external base electrode and the gate electrode.

According to a preferred embodiment of this aspect, the aforementioned step of patterning the aforementioned second oxide film, the aforementioned second conductor film and the aforementioned first conductor film for simultaneously forming the aforementioned external base electrode and the aforementioned gate electrode includes a step of first removing the aforementioned second oxide film located on the aforementioned external base electrode and the aforementioned gate electrode by etching and thereafter patterning the aforementioned second conductor film and the aforementioned first conductor film for simultaneously forming the external base electrode and the gate electrode.

According to another preferred embodiment of this aspect, the method of fabricating a semiconductor device further comprises a step of partially removing the aforementioned second conductor film by etching around a portion for defining the aforementioned external base electrode after forming the aforementioned second conductor film in advance of forming the aforementioned second oxide film.

A second aspect of the present invention relates to a method of fabricating a semiconductor device having a bipolar transistor and a field-effect transistor formed on a semiconductor substrate. First, a first oxide film for defining a gate oxide film and a first conductor film for defining a lower portion of a gate electrode are successively formed on the semiconductor substrate formed with a collector region. The aforementioned first conductor film and the aforementioned first oxide film are selectively etched for exposing a surface portion of the aforementioned semiconductor substrate located on a region for forming the aforementioned bipolar transistor. A second conductor film for defining an external base electrode and an upper portion of the gate electrode is formed on the aforementioned semiconductor substrate to come into contact with the aforementioned exposed surface portion and cover a region for forming the aforementioned field-effect transistor and the aforementioned collector region. A second oxide film is formed on the aforementioned semiconductor substrate to cover the aforementioned second conductor film. The aforementioned second conductor film and the aforementioned second oxide film are selectively etched for opening an emitter region while simultaneously partially removing the aforementioned second conductor film by etching around a portion for defining the external base electrode thereby forming the aforementioned external base electrode. A third conductor film for defining an emitter electrode is formed on the aforementioned second oxide film to come into contact with the aforementioned emitter region. The aforementioned third conductor film is patterned for forming the emitter electrode on the aforementioned semiconductor substrate. The aforementioned second oxide film, the aforementioned second conductor film and the aforementioned first conductor film are patterned for forming the gate electrode.

According to a preferred embodiment of this aspect, the aforementioned semiconductor substrate is annealed after simultaneously forming the aforementioned external base electrode and the aforementioned gate electrode.

According to another preferred embodiment of this aspect, the aforementioned second conductor film is patterned to simultaneously form a resistive element in the step of patterning the aforementioned second oxide film, the aforementioned second conductor film and the aforementioned first conductor film.

According to still another preferred embodiment of this aspect, the aforementioned third conductor film is patterned to simultaneously form a resistive element in the step of patterning the aforementioned third conductor film for forming the emitter electrode on the aforementioned semiconductor substrate.

According to a further preferred embodiment of this aspect, the method of fabricating a semiconductor device further comprises a step of forming a silicide film on a surface of the aforementioned emitter electrode, a surface of the aforementioned external base electrode, a surface of the aforementioned gate electrode and a surface of a source/drain region of the aforementioned field-effect transistor.

A third aspect of the present invention relates to a method of fabricating a semiconductor device having a bipolar transistor and a field-effect transistor formed on a semiconductor substrate. A first oxide film for defining a gate oxide film and a first conductor film for defining a lower portion of a gate electrode are successively formed on the semiconductor substrate formed with a collector region. The aforementioned first conductor film and the aforementioned first oxide film are selectively etched for exposing a surface portion of the aforementioned semiconductor substrate located on a region for forming the aforementioned bipolar transistor. A second conductor film for defining an external base electrode and a lower portion of the gate electrode is formed on the aforementioned semiconductor substrate to come into contact with the aforementioned exposed surface portion and cover a region for forming the aforementioned field-effect transistor and the aforementioned collector region. A second oxide film is formed on the aforementioned semiconductor substrate to cover the aforementioned second conductor film. The aforementioned second conductor film and the aforementioned second oxide film are selectively etched for opening an emitter region. A third conductor film for defining an emitter electrode is formed on the aforementioned second oxide film to come into contact with the aforementioned emitter region. The aforementioned third conductor film is patterned for forming the emitter electrode on the aforementioned semiconductor substrate. The aforementioned second oxide film located on the aforementioned external base electrode and the aforementioned gate electrode is removed by etching. The aforementioned second conductor film and the aforementioned first conductor film are patterned for simultaneously forming the external base electrode, the gate electrode and a resistive element. An insulator film is formed on a partial surface of the aforementioned resistive element. A silicide film is formed on a surface of the aforementioned collector region, a surface of the aforementioned emitter electrode, a surface of the aforementioned external base electrode, a surface of the aforementioned gate electrode and a surface of a source/drain region of the aforementioned field-effect transistor.

A fourth aspect of the present invention relates to a semiconductor device having a bipolar transistor and a field-effect transistor formed on a semiconductor substrate.

The semiconductor device comprises the semiconductor substrate formed with a collector region. An emitter electrode, an external base electrode and a gate electrode are formed on the aforementioned semiconductor substrate. The position of the interface between the aforementioned gate electrode and the aforementioned semiconductor substrate is rendered higher than the position of the interface between the aforementioned external base electrode and the aforementioned semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

FIGS. 1 to 8 are sectional views of a semiconductor device successively showing steps in a method of fabricating a BiCMOS device according to a first embodiment of the present invention.

Figure 1:
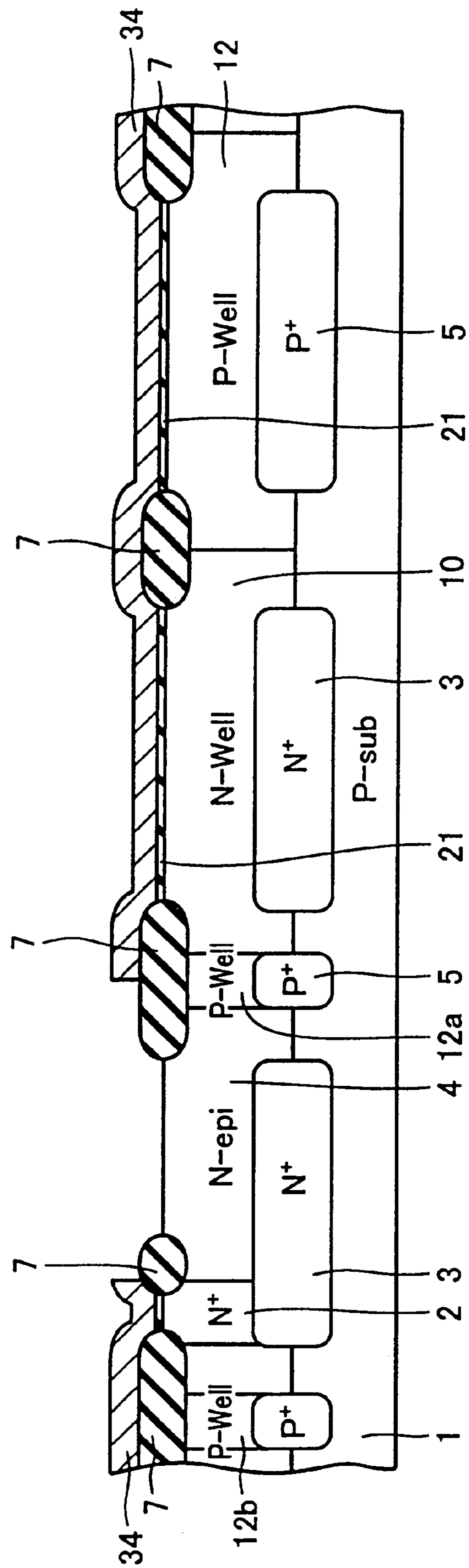
FIGS. 1 to 8 are sectional views of a semiconductor device successively showing first to eighth steps in a method of fabricating a BiCMOS device according to a first embodiment of the present invention.

Referring to FIG. 1, $N^+$-type embedded layers 3, P-type isolation regions 5, an N-type epitaxial layer 4, field oxide films 7, an $N^+$-type collector region 2, an N-type well region 10 and a P-type well region 12 are formed on a P-type silicon substrate 1, similarly to the prior art. An underlayer oxide film (not shown) is removed followed by formation of gate oxide films 21, and an $N^+$-type polysilicon film 34 is deposited on the overall surface by 150 nm, for example.

A part of the polysilicon film 34 located on a bipolar transistor active region is removed by etching. At this time, the gate oxide film 21 formed on the bipolar transistor active region is not etched due to the difference between the etching rates for silicon and an oxide film (the etching rate for an oxide film is smaller than that for silicon). Therefore, the surface of the bipolar transistor active region is not etched. Thereafter the gate oxide film 21 formed on the bipolar transistor active region is removed. FIG. 1 is a sectional view of the semiconductor device showing the final state of this step.

While only the part of the $N^+$-type polysilicon film 34 located on the bipolar transistor active region is removed by etching in FIG. 1, the present invention is not restricted to this but the $N^+$-type polysilicon film 34 may alternatively be etched to remain at least on the $N^+$-type collector region 2 of a bipolar transistor and active regions of CMOS transistors.

Figure 2:
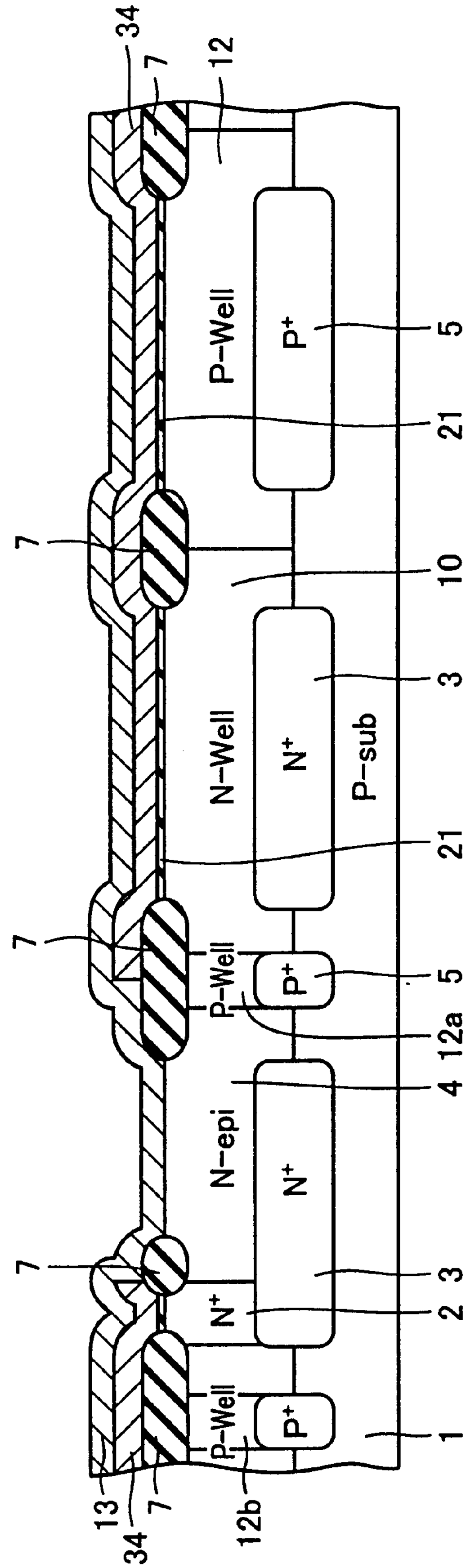

Referring to FIG. 2, a polysilicon film 13 is deposited on the overall upper surface of the silicon substrate 1 by 150 nm, for example.

Figure 3:
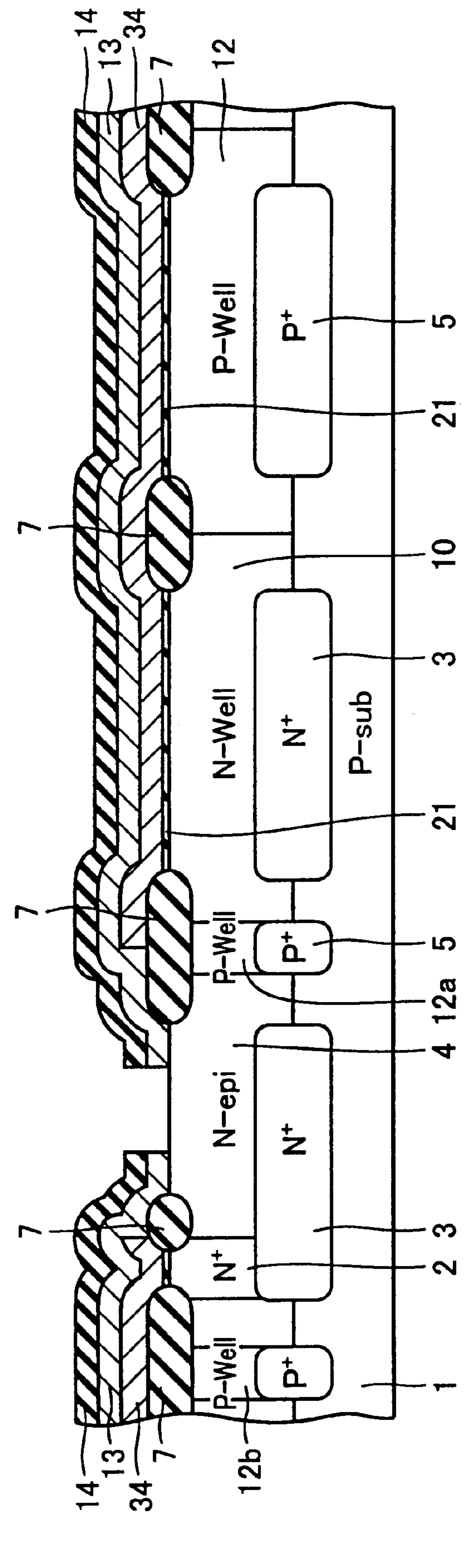

Referring to FIG. 3, a CVD oxide film 14 is formed on the overall surface of the silicon substrate 1 by 300 nm, for example.

Thereafter the CVD oxide film 14 and the polysilicon film 13 are etched for forming an emitter opening.

Figure 4:
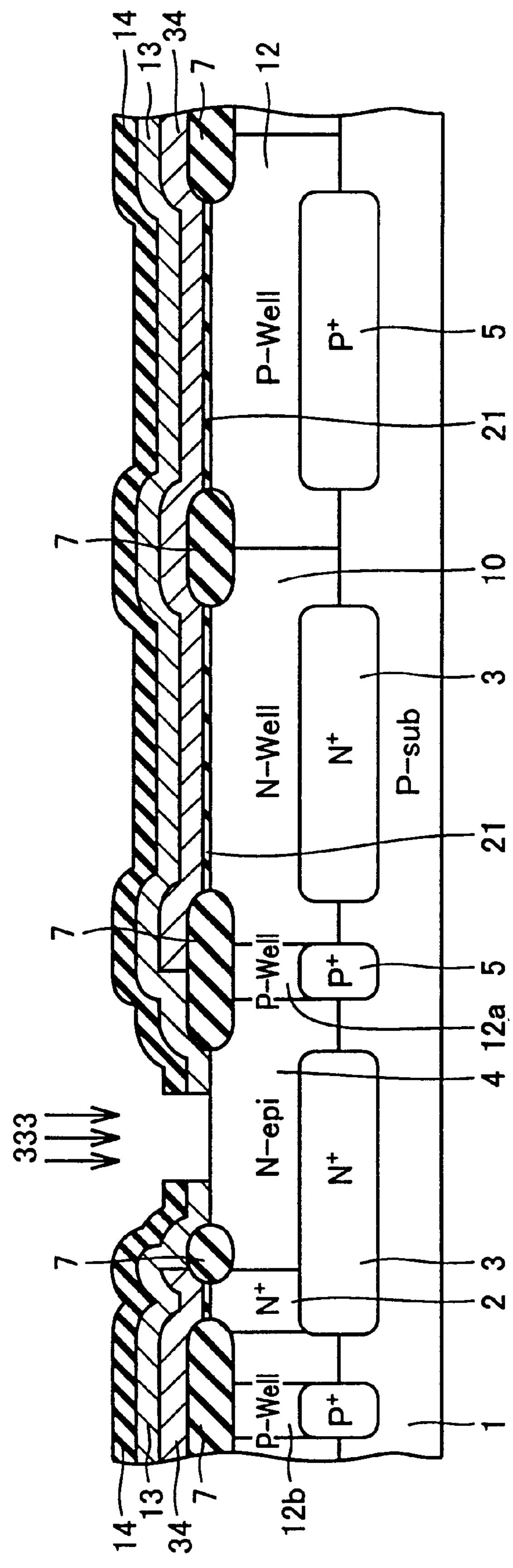

Referring to FIG. 4, a P-type impurity 333 is implanted into the emitter opening ($BF_2$ is implanted at 25 KeV by $8\times10^{13}$ $cm^{-2}$, for example) for forming an intrinsic base region 16 (see FIG. 5) in the emitter opening.

Figure 5:
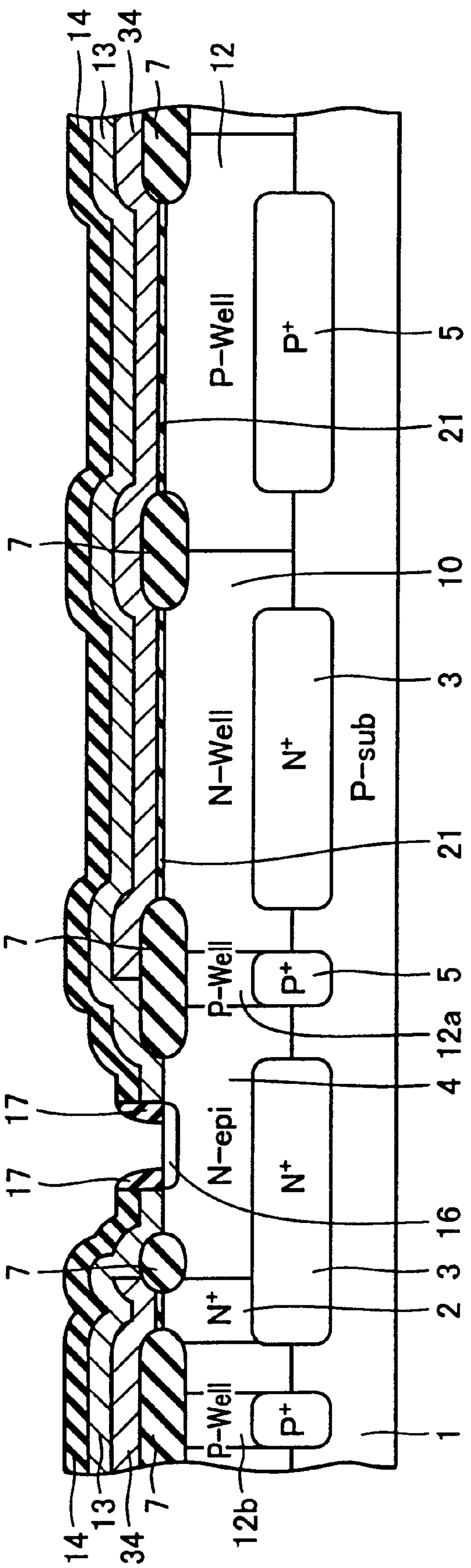

Referring to FIG. 5, a CVD oxide film for defining side wall oxide films 17 is deposited on the overall upper surface of the silicon substrate 1 and dry-etched thereby forming the side wall oxide films 17 in the emitter opening.

Figure 6:
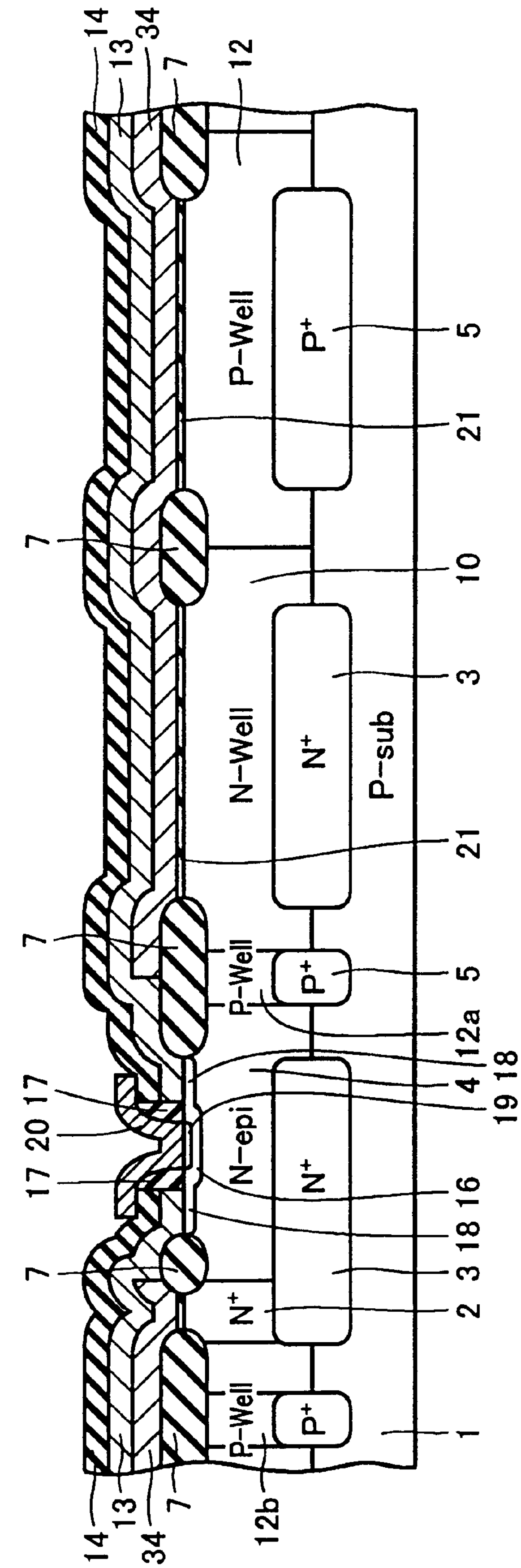

Referring to FIG. 6, a polysilicon film for defining an emitter electrode 20 is deposited by 150 nm, for example, on the overall upper surface of the silicon substrate 1, and an N-type impurity is implanted into the polysilicon film (arsenic is implanted at 50 KeV by $1\times10^{16}$ $cm^{-2}$, for example). Thereafter annealing is performed for diffusing arsenic from the polysilicon film into the intrinsic base region 19, thereby forming an emitter region 19. At this time, boron diffuses from an external base electrode 13, for forming an external base region 18. While diffusion of boron takes place also in heat treatment preceding this annealing step, such diffusion is not illustrated. Then, the polysilicon film is etched for forming the emitter electrode 20.

At this time, the uppermost layers of the $N^+$-type collector region 2, the N-type well region 10 and the P-type well region 12 are covered with the CVD oxide film 14, not to be etched.

Figure 7:
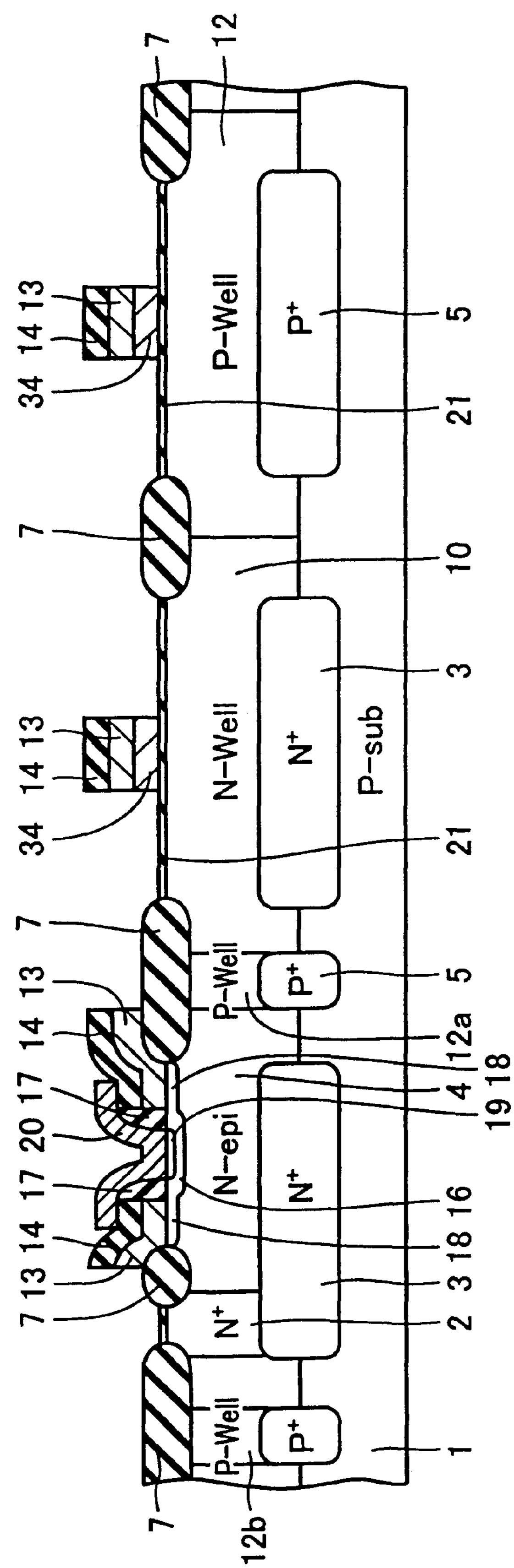

Referring to FIG. 7, gate electrodes (the $N^+$-type polysilicon films 34 and the polysilicon films 13) and the external base electrode 13 are simultaneously patterned. At this time, the gate oxide films 21 are formed on the surfaces of the N-type well region 10, the P-type well region 12 and the emitter electrode 20, so that the surfaces of the N-type well region 10, the P-type well region 12 and the emitter electrode 20 are not etched due to the difference between the etching rates for silicon and an oxide film (the etching rate for an oxide film is smaller than that for silicon).

Thereafter the BiCMOS device according to the first embodiment is completed through steps similar to the conventional steps shown in FIGS. 78 to 82.

According to the first embodiment, as hereinabove described, the active regions of the CMOS transistors are covered with the gate oxide films 21, the $N^+$-type polysilicon films 34, the polysilicon films 13 and the CVD oxide films 14 when the emitter opening and the emitter electrode 20 are formed by etching. The CVD oxide films 14 are located on the uppermost layers so that the active regions are not etched due to the difference between the etching rates for silicon and an oxide film (the etching rate for an oxide film is smaller than that for silicon) when the emitter opening and the emitter electrode 20 are formed by etching.

The external base electrode 13 is etched simultaneously with the gate electrodes (the $N^+$-type polysilicon films 34 and the polysilicon films 13). At this time, the gate oxide films 21 are formed on the surfaces of the N-type well region 10, the P-type well region 12 and the $N^+$-type collector region 2, so that the surfaces of the N-type well region 10, the P-type well region 12 and the $N^+$-type collector region 2 are not etched. Thus, the surface parts of the well regions 10 and 12 of the CMOS transistors are not exposed to polysilicon etching, whereby excellent CMOS transistor characteristics can be effectively attained.

Second Embodiment

In a method of fabricating a semiconductor device according to a second embodiment of the present invention, annealing performed in the step shown in FIG. 6 in the first embodiment is performed in a step similar to that shown in FIG. 7.

Side wall oxide films 17 are formed in an emitter opening through a step similar to that shown in FIG. 5, similarly to the first embodiment.

Figure 9:
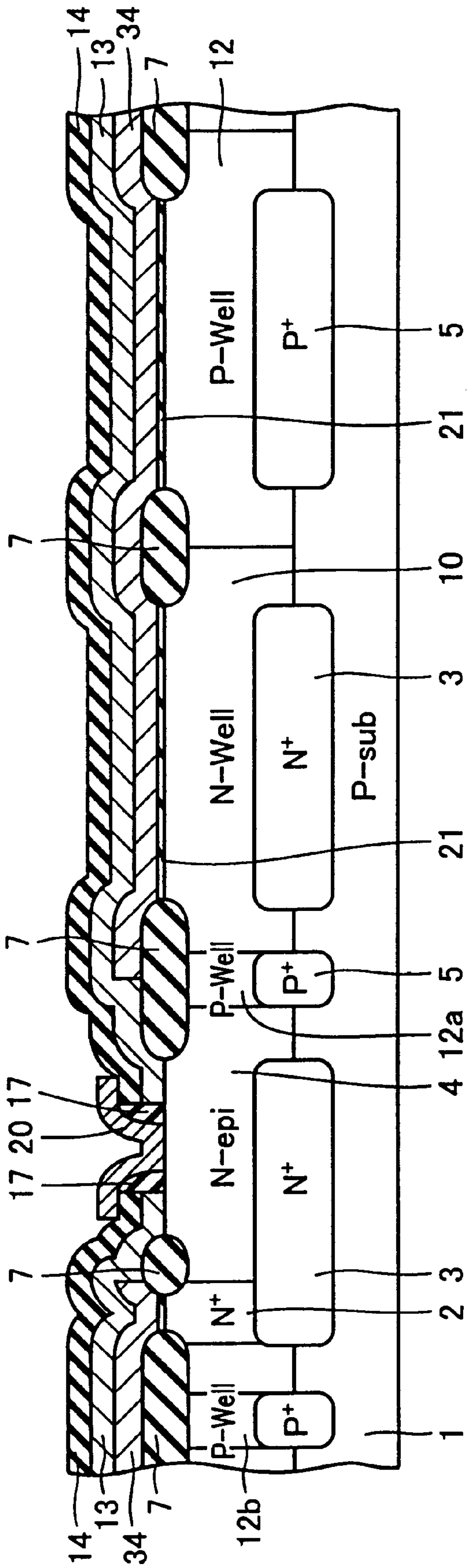
FIGS. 9 and 10 are sectional views of a semiconductor device successively showing first and second steps in a method of fabricating a BiCMOS device according to a second embodiment of the present invention.

Referring to FIG. 9, a polysilicon film for defining an emitter electrode 20 is deposited on the overall surface of a silicon substrate 1 by 150 nm, for example, and an N-type impurity is implanted into the polysilicon film (arsenic is implanted at 50 KeV by $1\times10^{16}$ $cm^{-2}$, for example). Then, the polysilicon film is etched for forming the emitter electrode 20. At this time, the uppermost layers of an $N^+$-type collector region 2, an N-type well region 10 and a P-type well region 12 are covered with a CVD oxide film 14, not to be etched.

Figure 10:
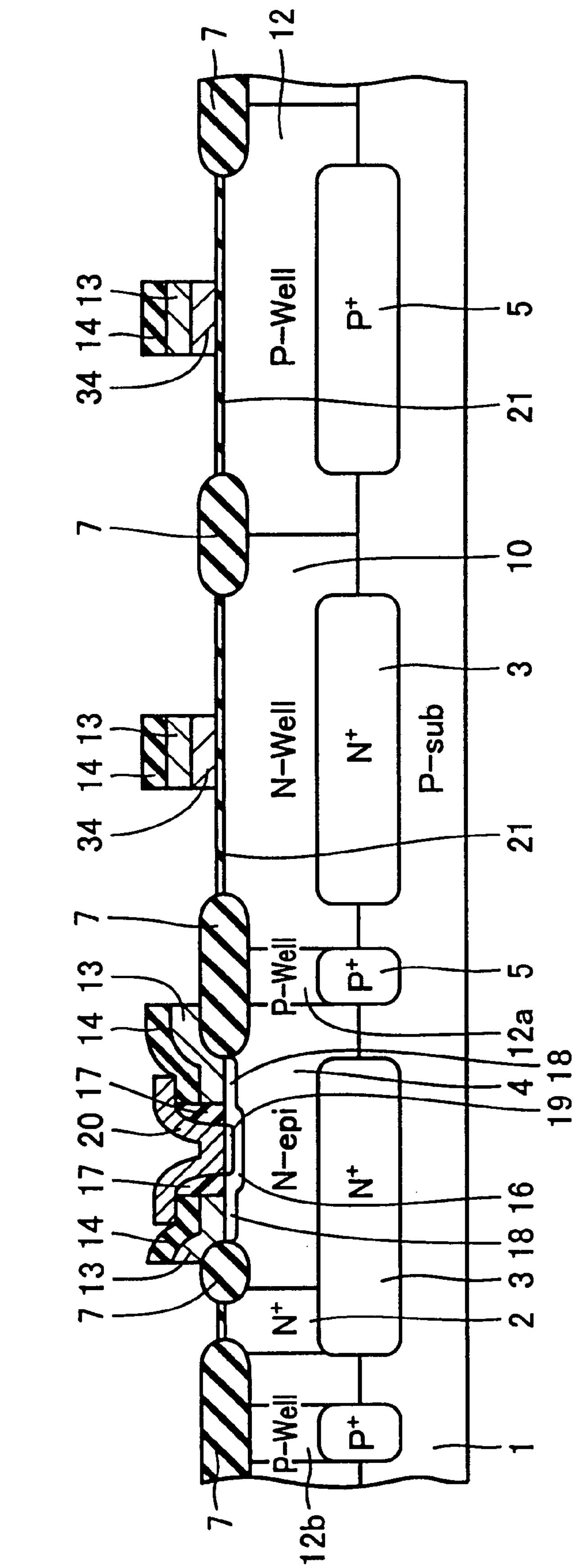

FIG. 10, gate electrodes ($N^+$-type polysilicon films 34 and polysilicon films 13) and an external base electrode 13 are simultaneously patterned. At this time, gate oxide films 21 are formed on the surfaces of the N-type well region 10, the P-type well region 12 and the emitter electrode 20, so that the N-type well region 10, the P-type well region 12 and the emitter electrode 20 are not etched due to the difference between the etching rates for an oxide film and silicon (the etching rate for an oxide film is smaller than that for silicon).

Then, annealing is performed for diffusing arsenic from the emitter electrode 20 into an intrinsic base region 16, thereby forming an emitter region 19. At this time, boron diffuses from the external base electrode 13, for forming an external base region 18. While diffusion of boron takes place also in heat treatment preceding this annealing step, this diffusion is not illustrated.

Thereafter a BiCMOS device according to the second embodiment is completed through steps similar to those of the prior art shown in FIGS. 78 to 82.

In the first embodiment, phosphorus diffuses from the $N^+$-type polysilicon film 34 into the external base electrode 13 and boron diffuses from the external base electrode 13 into the $N^+$-type polysilicon film 34 due to heat treatment following the step shown in FIG. 6.

Such mutual diffusion may increase or disperse base resistance of the bipolar transistor and cause a defective base-to-collector withstand voltage while increasing the gate resistance or dispersing the threshold voltages Vth resulting from depletion of the gate electrodes in the CMOS transistors. In the first embodiment, therefore, a sufficient distance must be provided between the bipolar transistor active region and the $N^+$-type polysilicon film 34, in order to avoid this influence. Such problematic mutual diffusion is remarkably influenced by heat treatment (annealing at 900° C., for example) performed after implanting arsenic into the emitter electrode 20 in the step shown in FIG. 6.

According to the second embodiment, annealing is performed after patterning the emitter electrode 20, the external base electrode 13 and the gate electrodes (the $N^+$-type polysilicon films 34 and the polysilicon films 13), in order to avoid the aforementioned influence. Consequently, the influence by mutual diffusion can be avoided.

According to the second embodiment, as hereinabove described, mutual diffusion of impurities between the $N^+$-type polysilicon film 34 and the external base electrode 13 can be effectively prevented so that stable bipolar and CMOS transistor characteristics can be attained in addition to an effect similar to that attained by the first embodiment.

Third Embodiment

FIGS. 11 to 15 are sectional views of a semiconductor device showing steps in a process of fabricating a BiCMOS device according to a third embodiment of the present invention.

Figure 11:
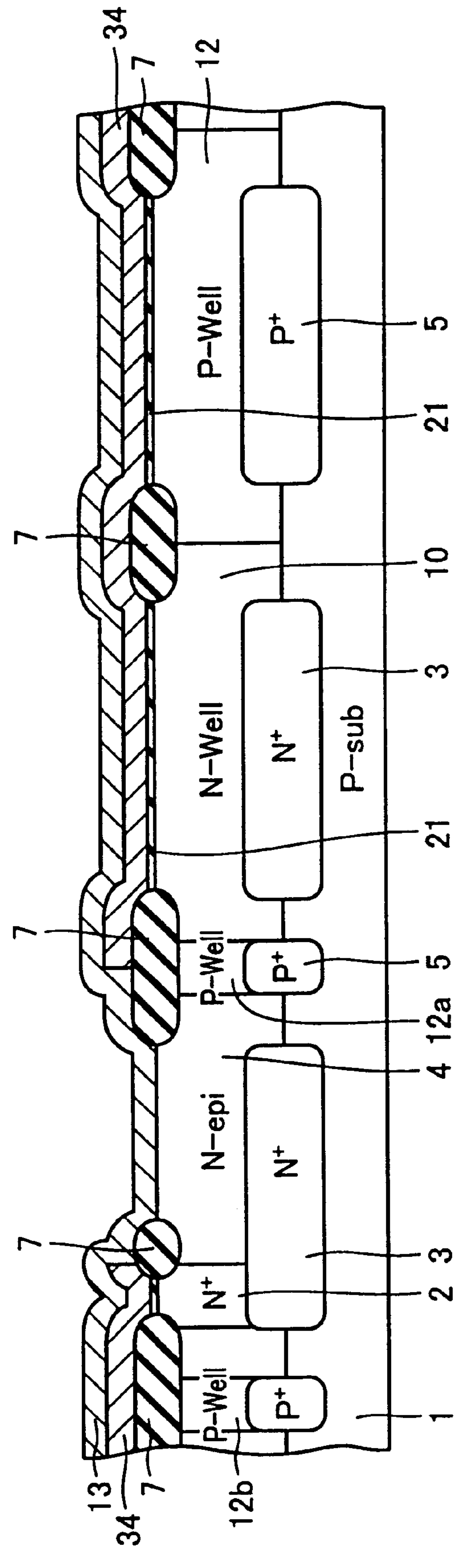
FIGS. 11 to 15 are sectional views of a semiconductor device successively showing first to fifth steps in a method of fabricating a BiCMOS device according to a third embodiment of the present invention.

The semiconductor device shown in FIG. 11 is fabricated through a process similar to that up to FIG. 2, similarly to the first embodiment.

Figure 12:
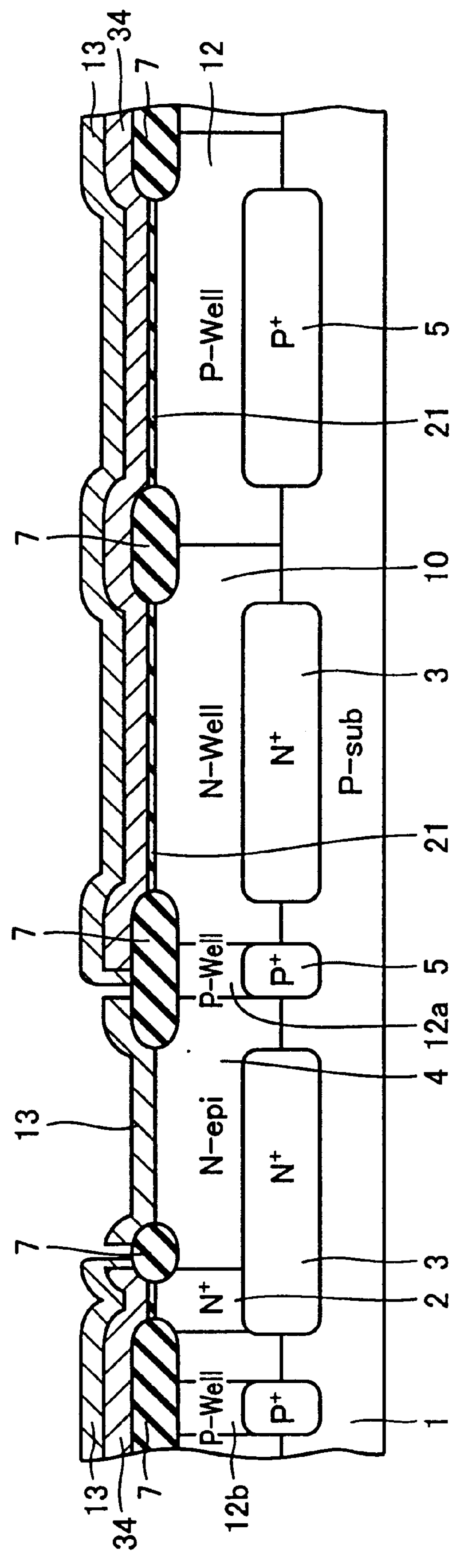

Referring to FIGS. 11 and 12, an external base electrode 13 is formed on a bipolar transistor active region by patterning. At this time, only a peripheral portion of the external base electrode 13 is removed by etching on a field oxide film 17, thereby forming the external base electrode 13.

Figure 13:
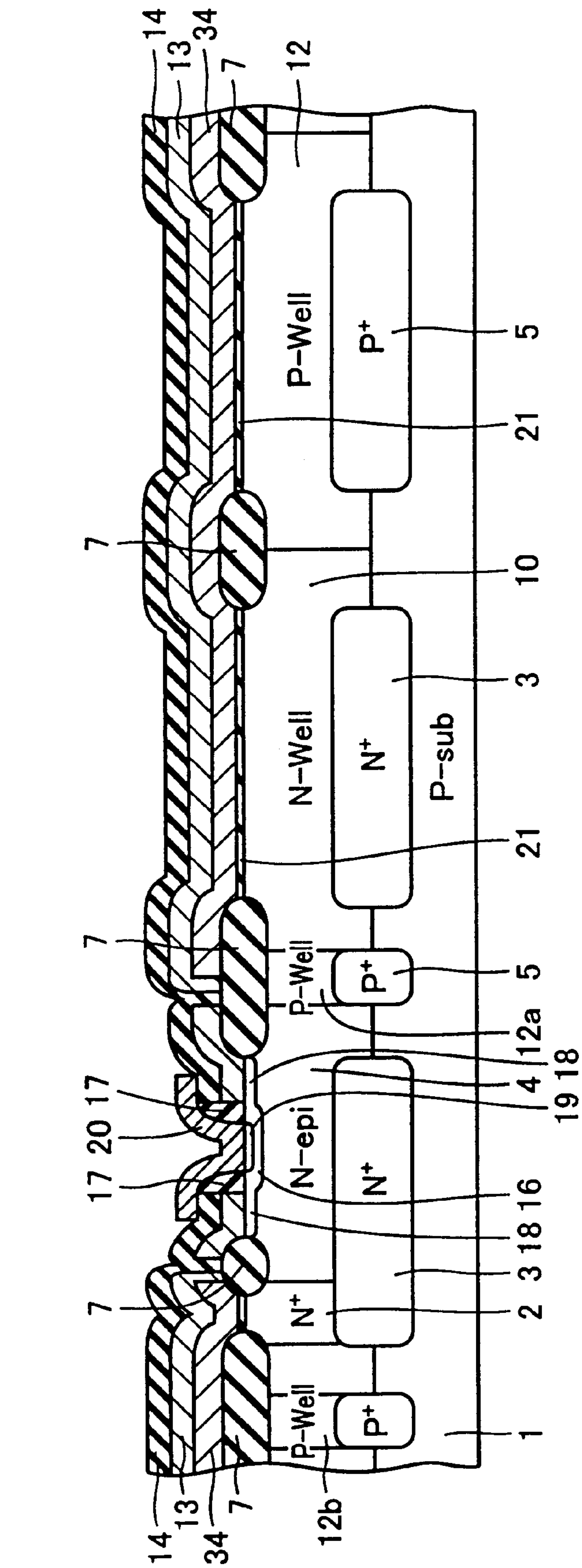

Referring to FIG. 13, an emitter electrode 20 is formed by a method similar to that in the first embodiment shown in FIGS. 3 to 6.

Figure 14:
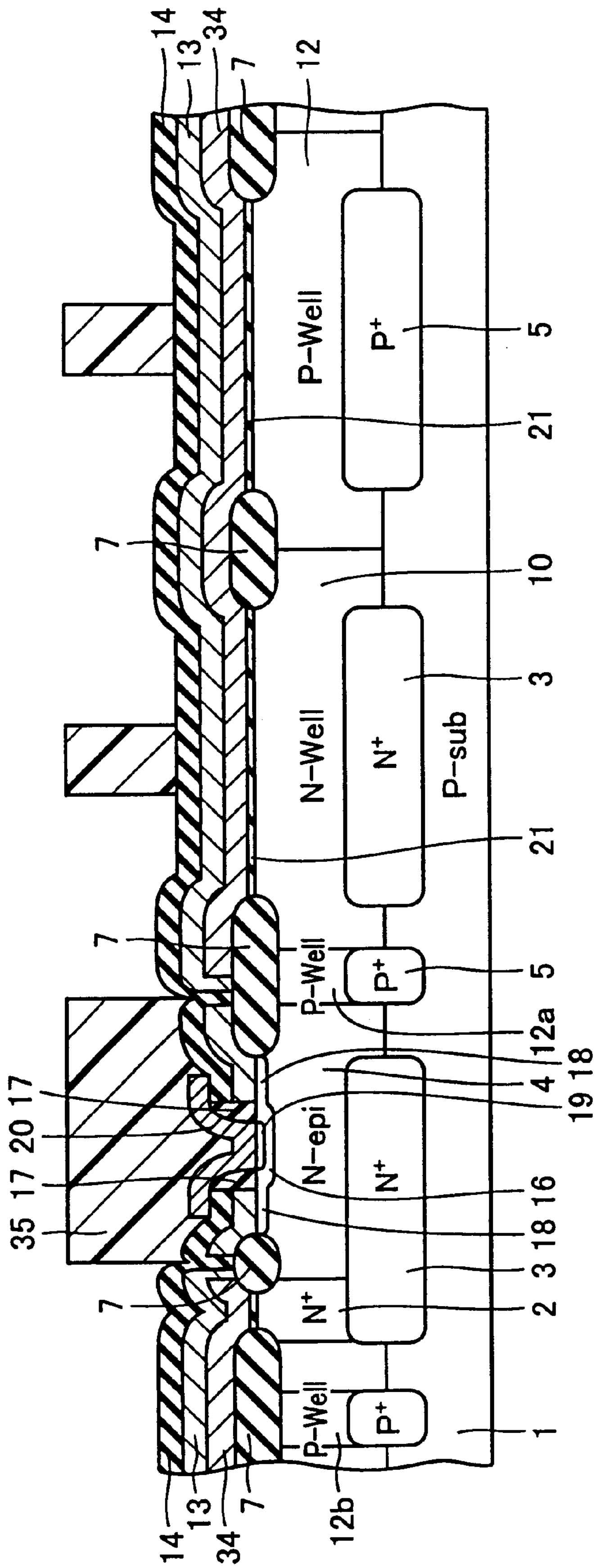
Figure 15:
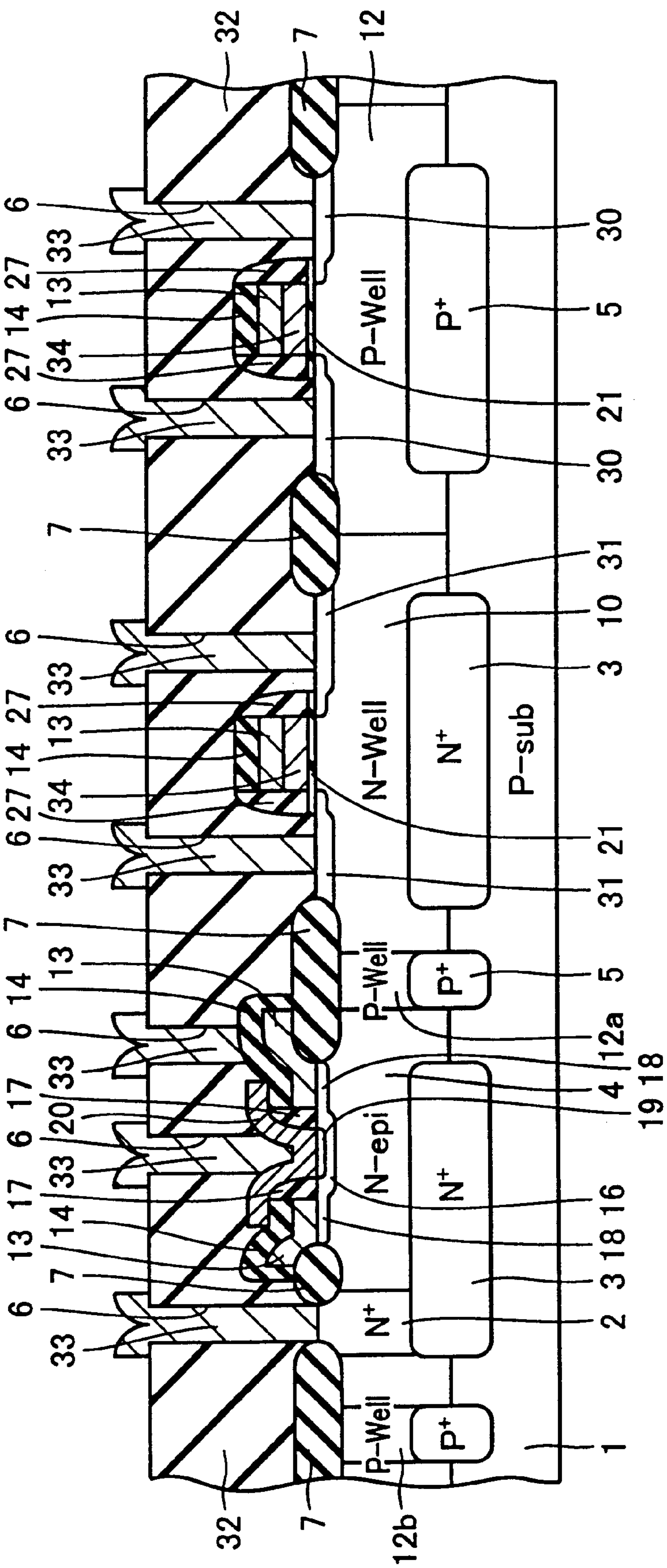

Referring to FIG. 14, gate electrodes ($N^+$-type polysilicon films 34 and polysilicon films 13) are formed by patterning through a resist mask 35. The external base electrode 13 is already patterned, and hence the resist pattern 35 is formed to cover the external base electrode 13.

Thereafter steps similar to those of the prior art shown in FIGS. 78 to 82 are carried out for completing the BiCMOS device according to the third embodiment.

In the method according to the first embodiment, phosphorus diffuses from the $N^+$-type polysilicon film 34 into the external base electrode 13 and boron diffuses from the external base electrode 13 to the $N^+$-type polysilicon film 34 due to heat treatment following the step shown in FIG. 6. Such mutual diffusion may increase or disperse the base resistance of the bipolar transistor and cause a defective base-to-collector withstand voltage while increasing the gate resistance and dispersing the threshold voltages Vth due to depletion of the gate electrodes in the CMOS transistors. In order to avoid influence by the mutual diffusion causing such problems, a sufficient distance must be provided between the bipolar transistor active region and the $N^+$-type polysilicon film 34.

According to the third embodiment, only the peripheral portion of the external base electrode 13 is removed by etching as shown in FIG. 12, whereby mutual diffusion of impurities can be completely prevented between the $N^+$-type polysilicon film 34 and the external base electrode 13.

According to the third embodiment, as hereinabove described, mutual diffusion of impurities between the $N^+$-type polysilicon film 34 and the external base electrode 13 can be effectively prevented so that stable bipolar and CMOS transistor characteristics can be attained with small dispersion in addition to an effect similar to that attained by the first embodiment.

Fourth Embodiment

FIGS. 16 to 19 are sectional views of a semiconductor device showing steps in a process of fabricating a BiCMOS device according to a fourth embodiment of the present invention.

First, steps similar to those shown in FIGS. 1 and 2 are carried out similarly to the first embodiment.

Figure 16:
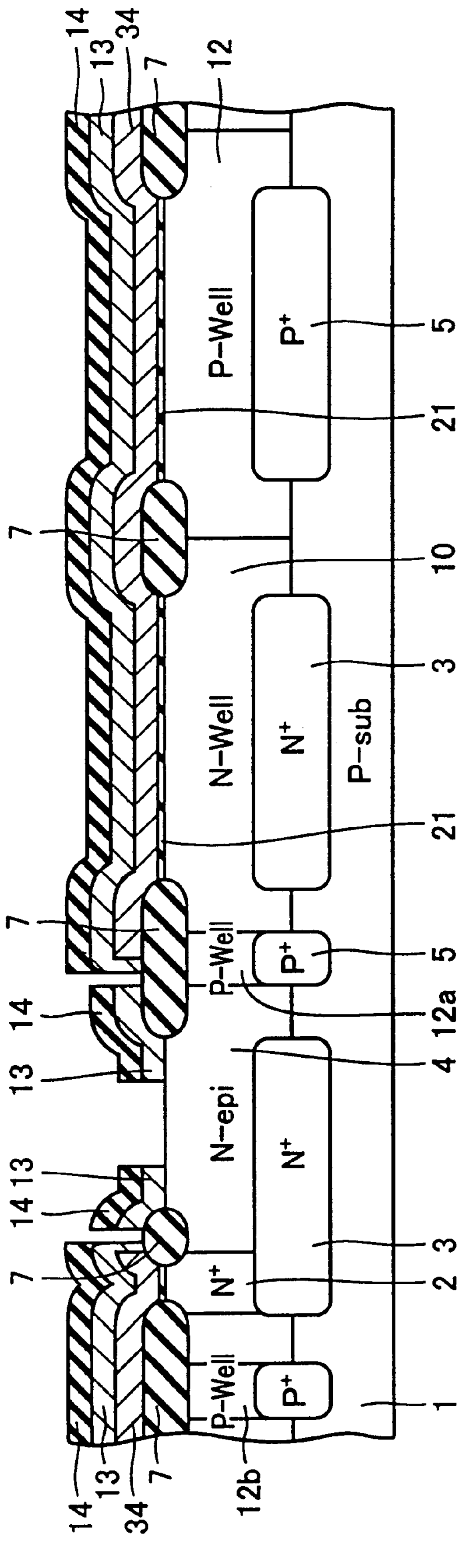
FIGS. 16 to 19 are sectional views of a semiconductor device successively showing first to fourth steps in a method of fabricating a BiCMOS device according to a fourth embodiment of the present invention.

Referring to FIG. 16, a CVD oxide film 14 is deposited, followed by formation of an emitter opening and an external base electrode 13. Around a bipolar transistor active region, only a peripheral portion of the external base electrode 13 is etched on a field oxide film 17.

Then, an emitter electrode 20 is formed by patterning through steps similar to those of the first embodiment shown in FIGS. 3 to 6.

Figure 18:
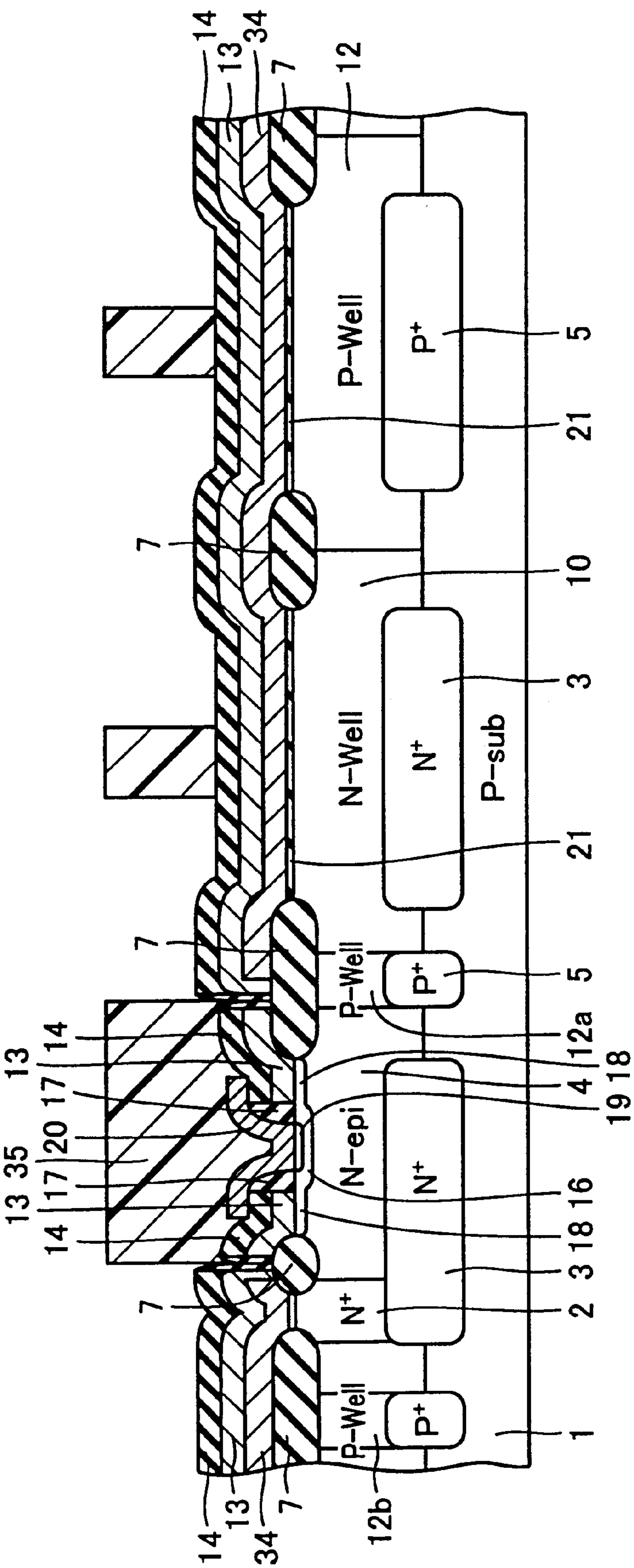

Referring to FIG. 18, a resist mask 35 is so formed as to form gate electrodes ($N^+$-type polysilicon films 34 and polysilicon films 13) by patterning. The external base electrode 13 is already patterned, and hence the resist pattern 35 is formed to cover the external base electrode 13.

Figure 19:
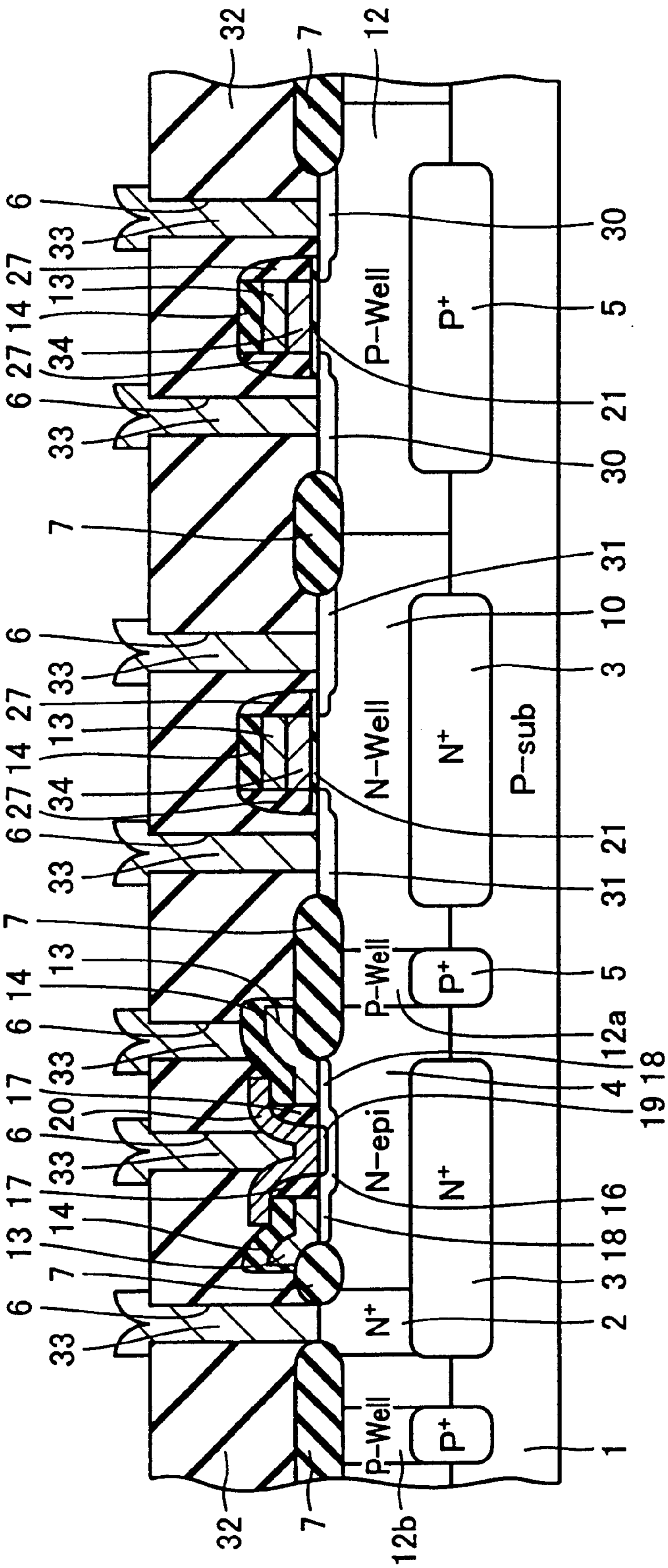

Thereafter steps similar to those of the prior art shown in FIGS. 78 to 82 are carried out, for completing the BiCMOS device according to the fourth embodiment as shown in FIG. 19.

According to the fourth embodiment, an effect similar to that of the second embodiment is attained without adding a mask similar to that employed in the step of the second embodiment shown in FIG. 12. According to this embodiment, etching is performed after depositing the polysilicon film 13 and forming the CVD oxide film 14 dissimilarly to the second embodiment, and hence the CVD oxide film 14 must be heat-treated. However, the CVD oxide film 14 is treatable at a low temperature (480° C., for example), and hence influence by diffusion is substantially ignorable. According to the fourth embodiment, as hereinabove described, an effect similar to that of the second embodiment can be attained without adding a mask.

Fifth Embodiment

FIGS. 20 to 23 are sectional views of a semiconductor device showing steps in a process of fabricating a BiCMOS device according to a fifth embodiment of the present invention.

First, gate oxide films 21 are formed and an $N^+$-type polysilicon film 34 is deposited on the overall surface by 150 nm, for example, through a step similar to that of the first embodiment shown in FIG. 1. At this time, parts of the $N^+$-type polysilicon film 34 located on a bipolar transistor active region and a region for forming a polysilicon resistor are removed by etching, as shown in FIG. 20.

Figure 20:
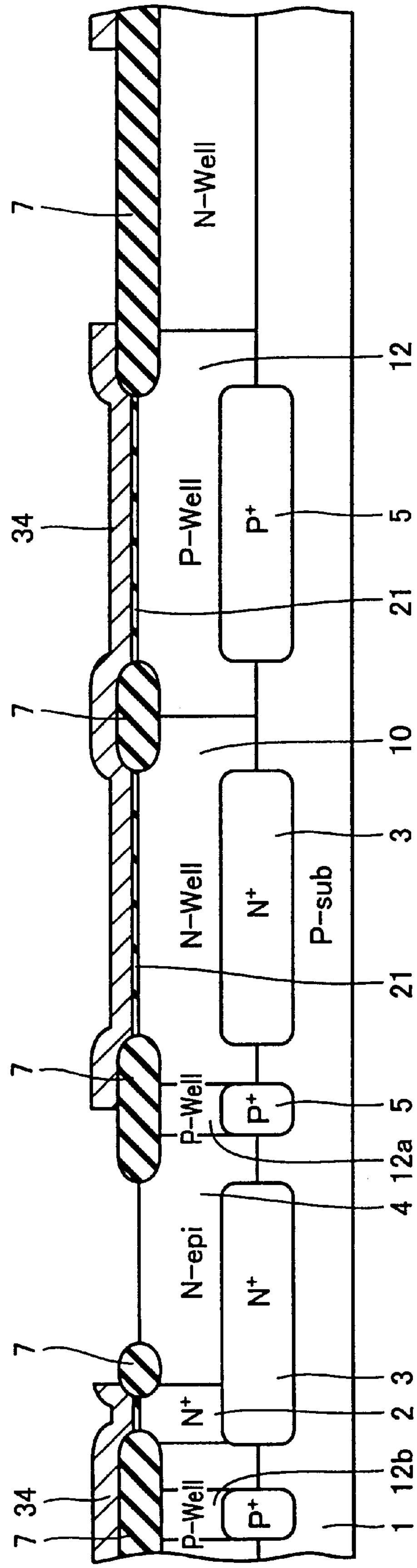
FIGS. 20 to 23 are sectional views of a semiconductor device successively showing first to fourth steps in a method of fabricating a BiCMOS device according to a fifth embodiment of the present invention.

While only the parts of the $N^+$-type polysilicon film 34 located on the bipolar transistor active region and the region for forming a polysilicon resistor are removed in FIG. 20, the present invention is not restricted but the $N^+$-type polysilicon film 34 may alternatively be removed to remain at least on an $N^+$-type collector region 2 of a bipolar transistor and active regions of CMOS transistors.

Figure 21:
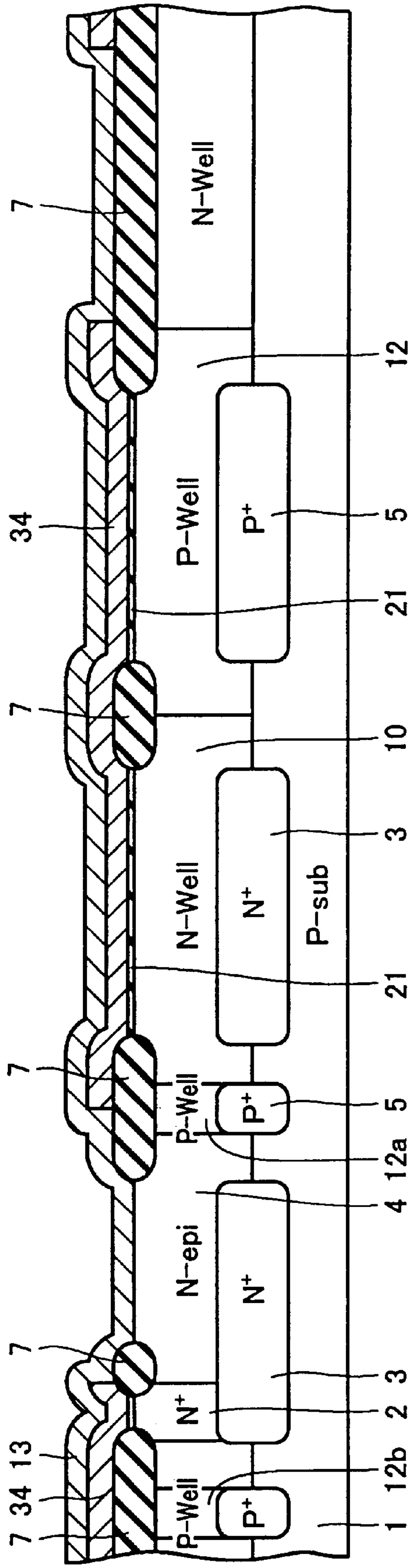

Referring to FIG. 21, a polysilicon film 13 is deposited on the overall upper surface of a silicon substrate 1 by 150 nm, for example.

Then, steps similar to those of the first embodiment shown in FIGS. 3 to 6 are carried out.

Figure 22:
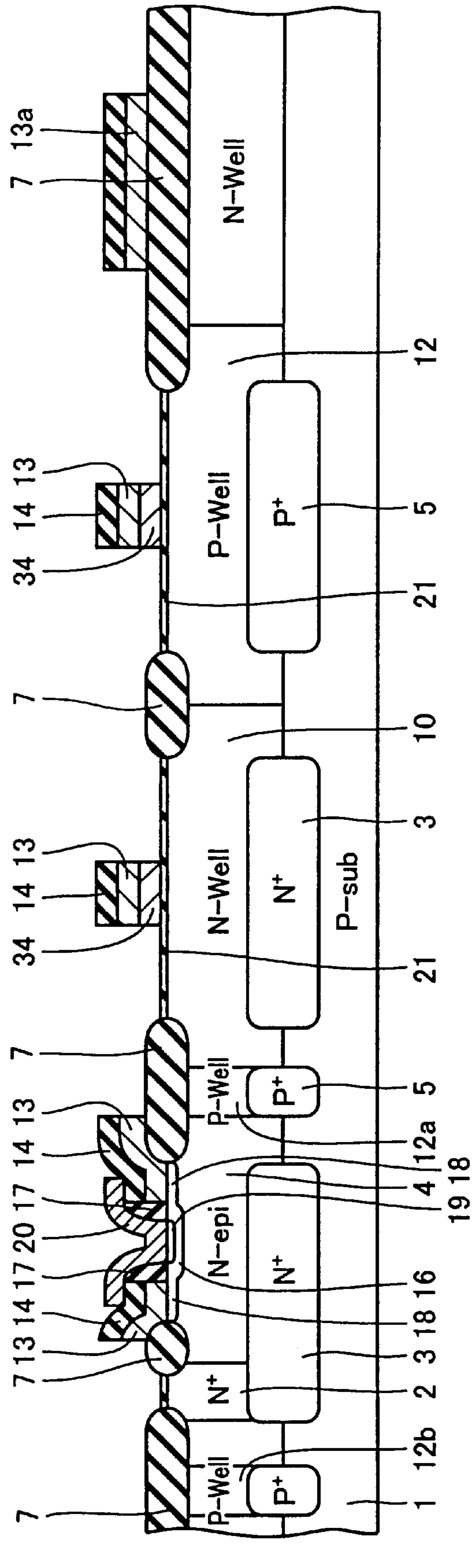

Referring to FIG. 22, gate electrodes ($N^+$-type polysilicon films 34 and polysilicon films 13), an external base electrode 13 and a polysilicon resistor 13*a* are simultaneously patterned.

Figure 23:
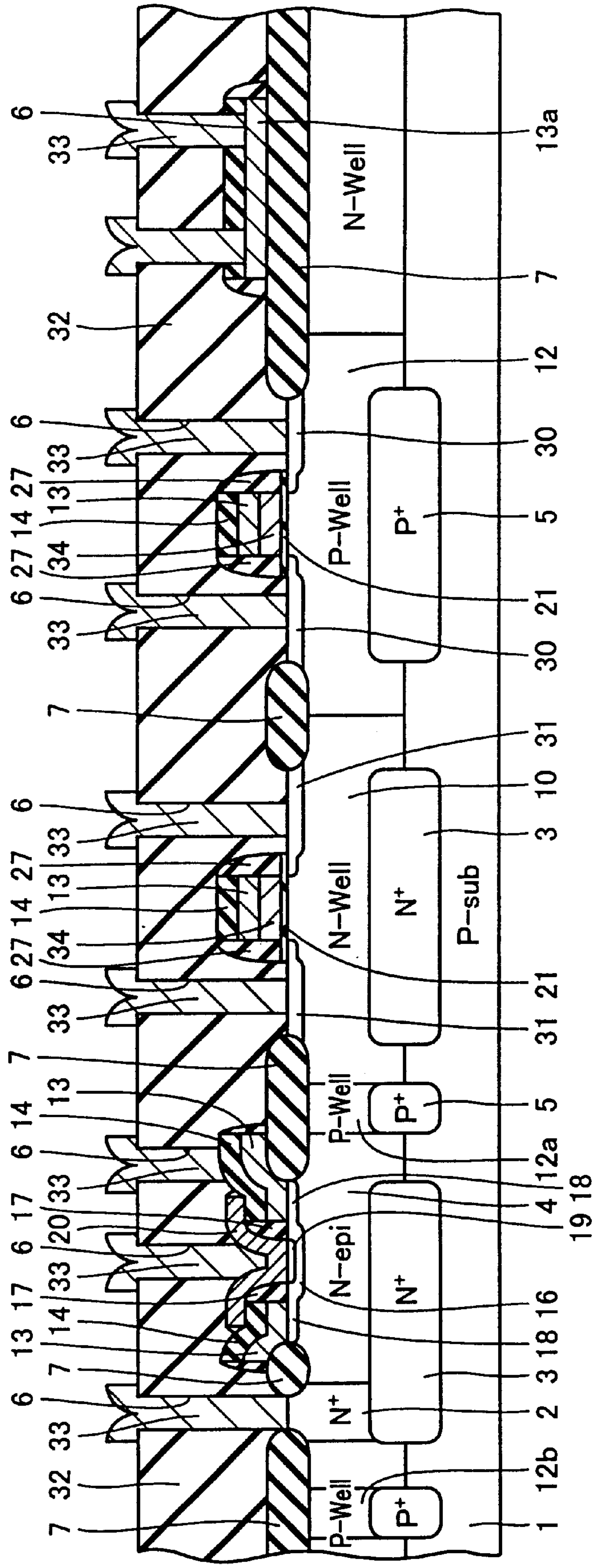

Referring to FIG. 23, the BiCMOS device according to the fifth embodiment is completed through steps similar to those of the prior art shown in FIGS. 78 to 82.

When ions 444, 555, 666 or 777 (not shown) for forming source/drain regions are implanted, the polysilicon resistor 13*a* is protected with a resist mask (not shown) so that no impurity is implanted into the polysilicon resistor 13*a*.

Thus, according to the fifth embodiment, the external base electrode 13 and the polysilicon resistor 13*a* are simultaneously formed in a method similar to that according to the first embodiment.

According to this embodiment, as hereinabove described, a resistive element can also be formed in the fabrication method in addition to an effect similar to that attained by the first embodiment, for obtaining a semiconductor device having improved functions.

Sixth Embodiment

FIGS. 24 to 28 are sectional views of a semiconductor device showing steps in a process of fabricating a BiCMOS device according to a sixth embodiment of the present invention.

Figure 24:
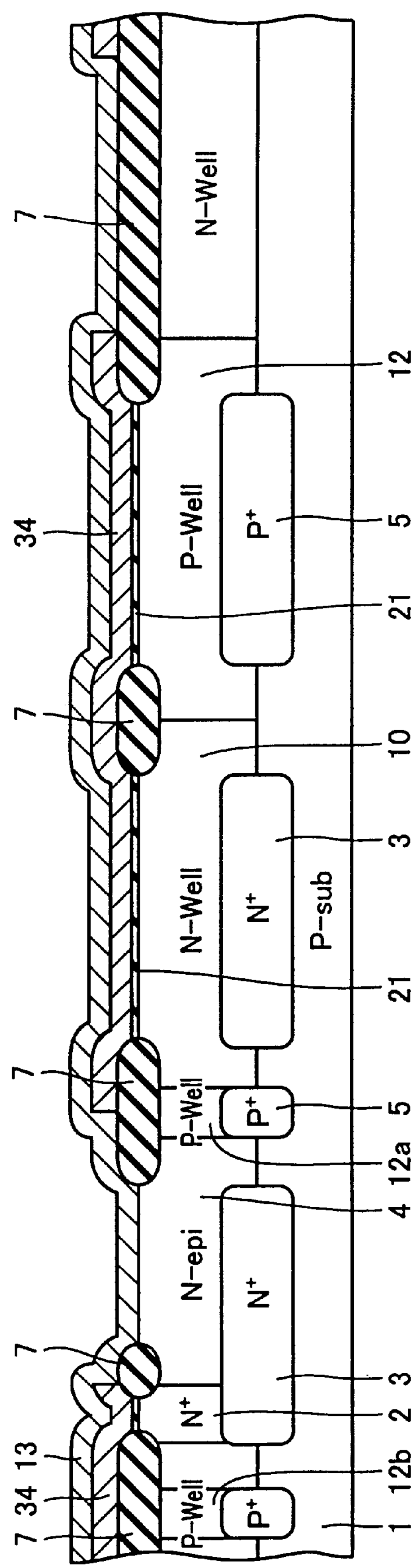
FIGS. 24 to 28 are sectional views of a semiconductor device successively showing first to fifth steps in a method of fabricating a BiCMOS device according to a sixth embodiment of the present invention.
Figure 25:
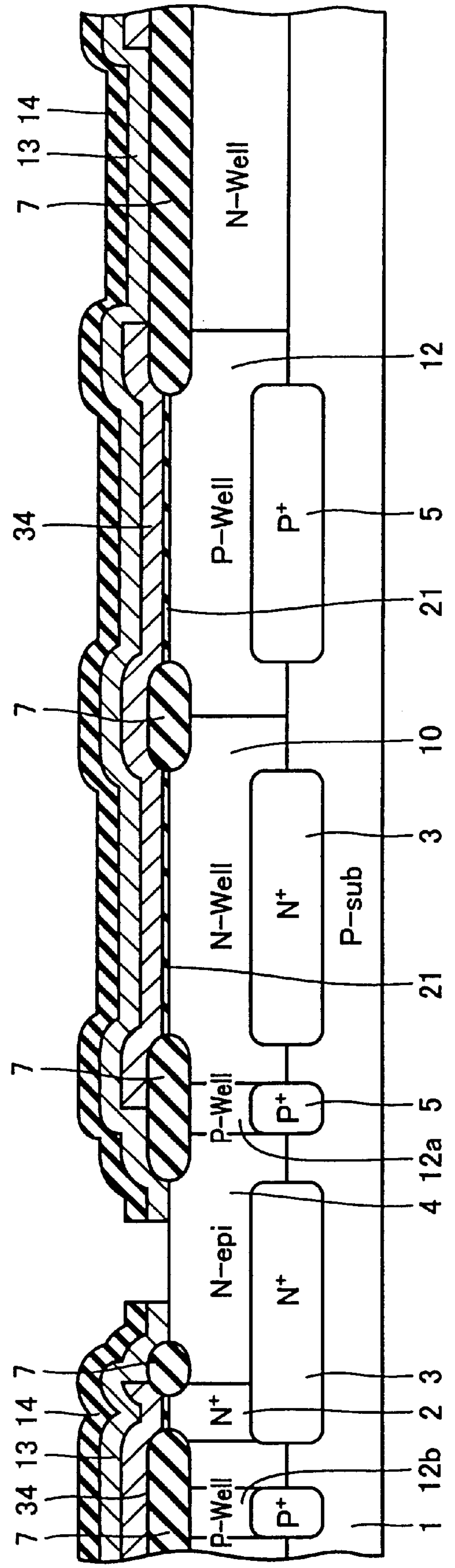

Referring to FIGS. 24 and 25, steps similar to those of the fifth embodiment shown in FIGS. 20 and 21 are carried out. A polysilicon film 13 is deposited by 150 nm, for example.

Referring to FIG. 25, a CVD oxide film 14 is deposited on the overall upper surface of a silicon substrate 1 by 300 nm, for example. The CVD oxide film 14 and the polysilicon film 13 are etched for forming an emitter opening.

Figure 26:
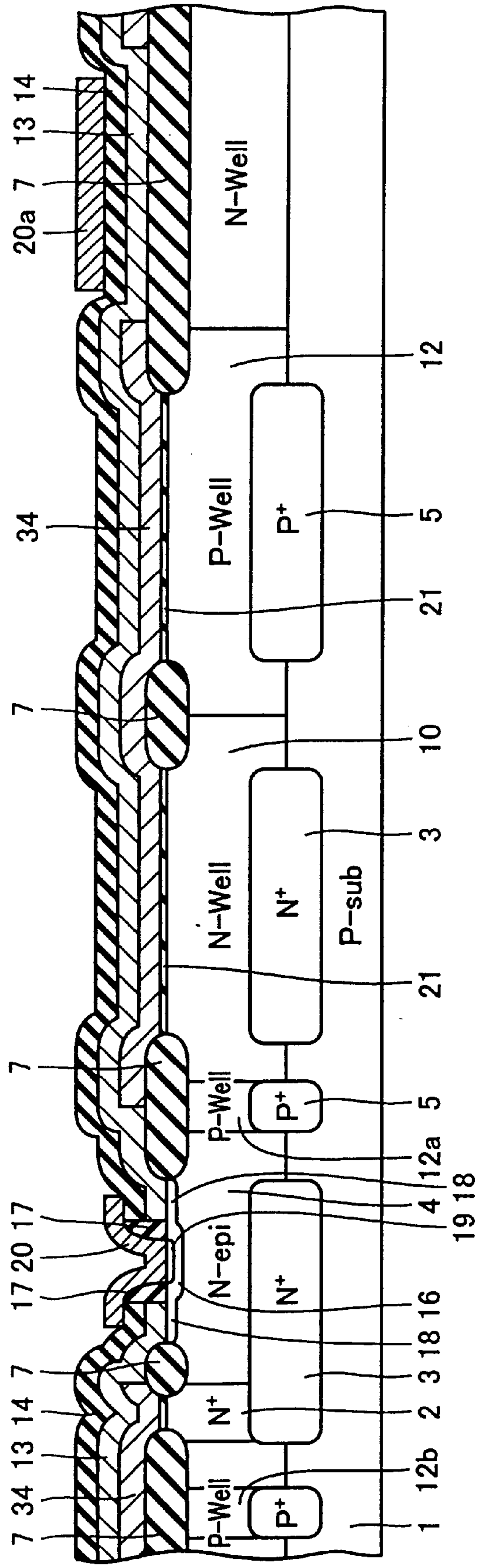

Referring to FIG. 26, steps similar to those of the first embodiment shown in FIGS. 4 and 5 are carried out and thereafter a polysilicon film 20 is patterned. At this time, the polysilicon film 20 is so etched that a polysilicon film 20*a* remains on a region for forming a polysilicon resistor.

Figure 27:
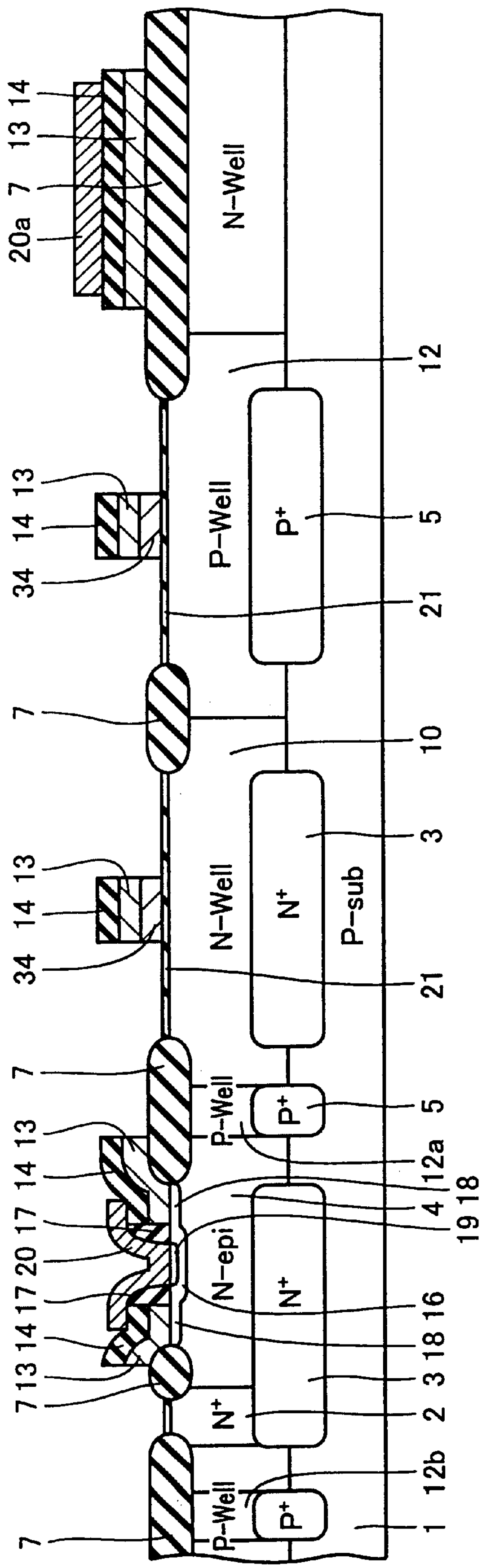

Referring to FIG. 27, gate electrodes $N^+$-type polysilicon films 34 and polysilicon films 13) and an external base electrode 13 are patterned. At this time, a polysilicon film 13 located under the polysilicon resistor 20*a* is also patterned.

Figure 28:
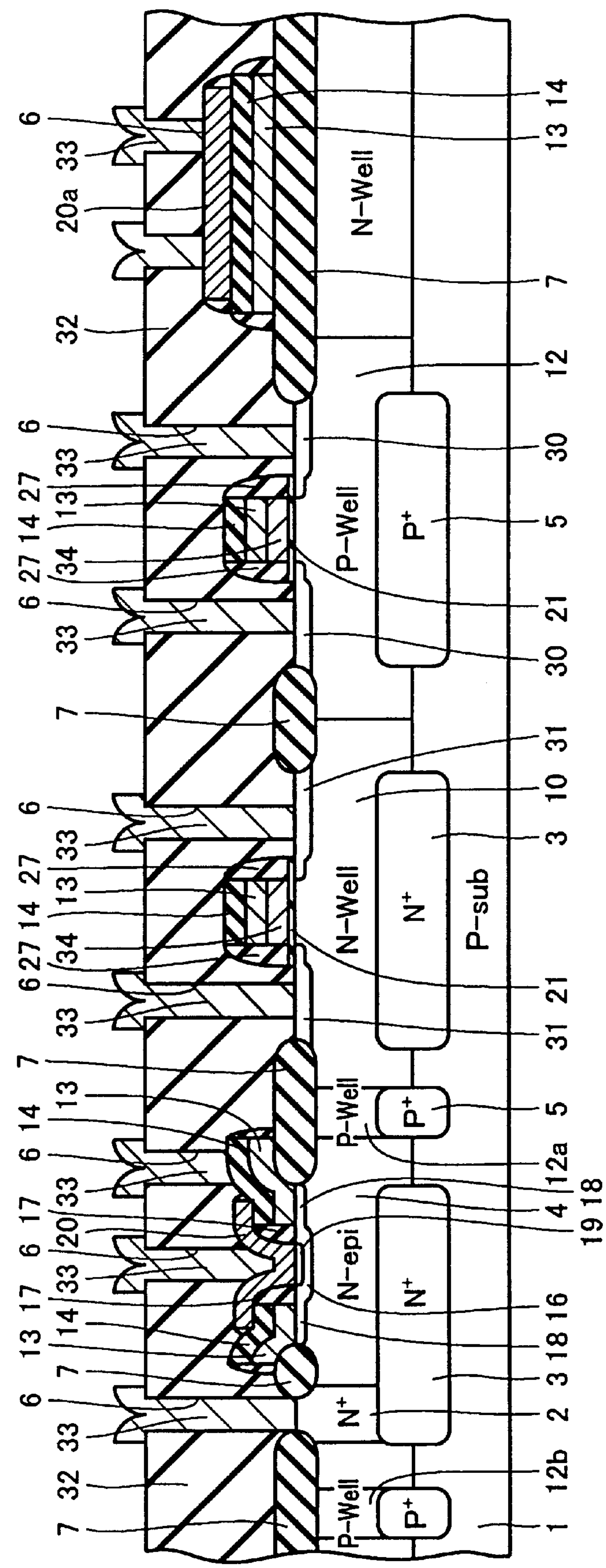

Referring to FIG. 28, steps similar to those of the prior art shown in FIGS. 78 to 82 are carried out for completing the BiCMOS device according to the sixth embodiment.

When ions 444, 555, 666 or 777 (not shown) for forming source/drain regions are implanted, the formed polysilicon resistor 20*a* is protected with a resist mask (not shown) so that no impurity is implanted into the polysilicon resistor 20*a*.

According to the sixth embodiment, as hereinabove described, the polysilicon resistor 20*a* is simultaneously formed along with an emitter electrode 20 in a method similar to that according to the first embodiment.

Thus, a resistive element can also be formed in the fabrication method in addition to an effect similar to that attained by the first embodiment, for obtaining a semiconductor device having improved functions.

Seventh Embodiment

FIGS. 29 to 32 are sectional views of a semiconductor device showing steps in a process of fabricating a BiCMOS device according to a seventh embodiment of the present invention.

Figure 29:
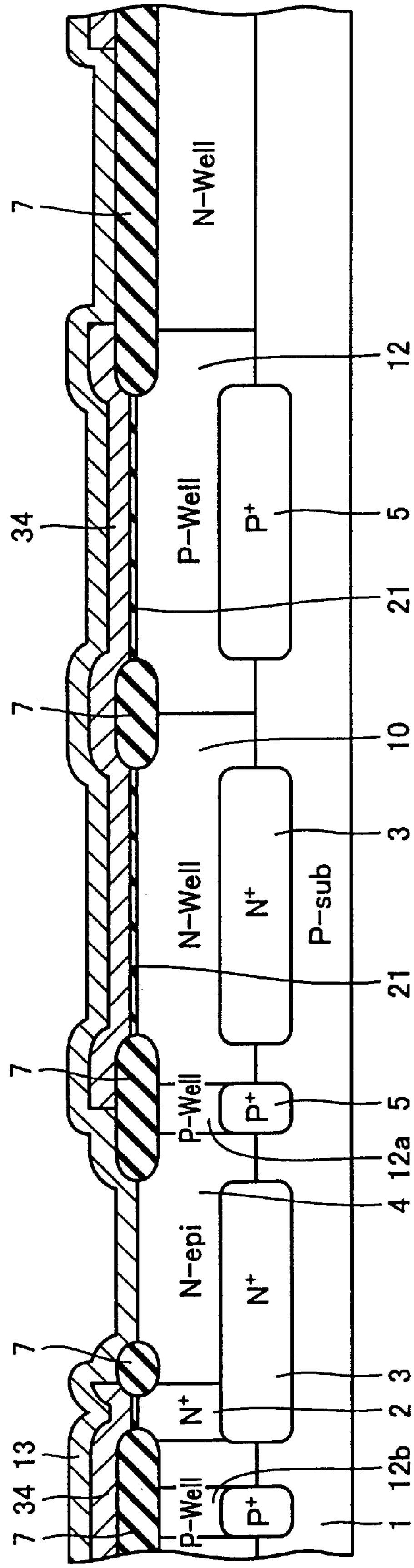
FIGS. 29 to 32 are sectional views of a semiconductor device successively showing first to fourth steps in a method of fabricating a BiCMOS device according to a seventh embodiment of the present invention.

Referring to FIG. 29, steps similar to those of the fifth embodiment shown in FIGS. 20 and 21 are carried out. A polysilicon film 13 is deposited by 150 nm, for example.

Figure 30:
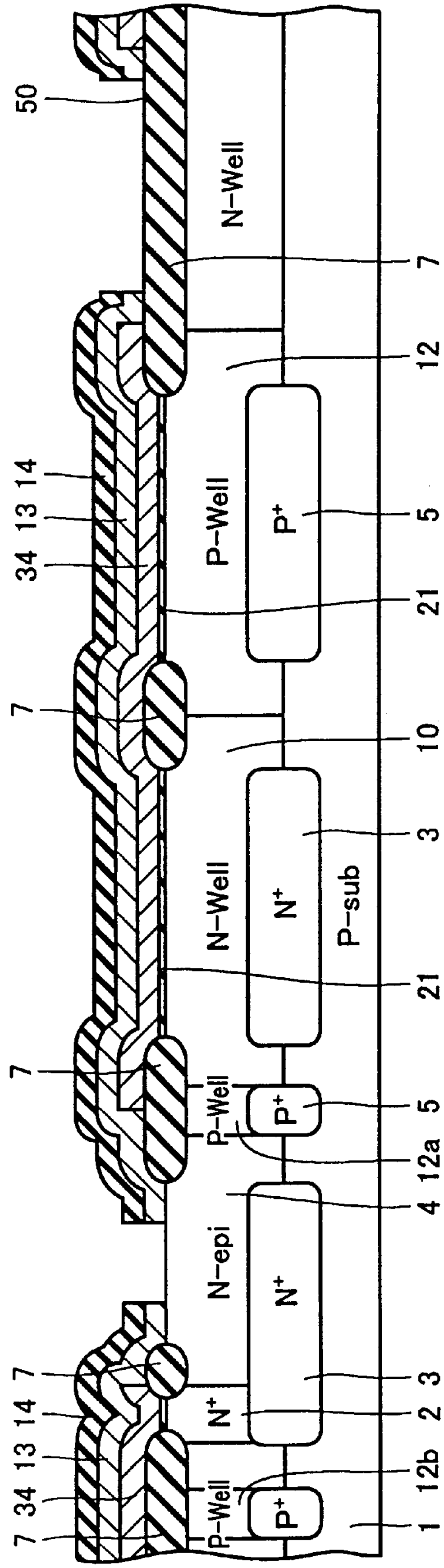
Figure 31:
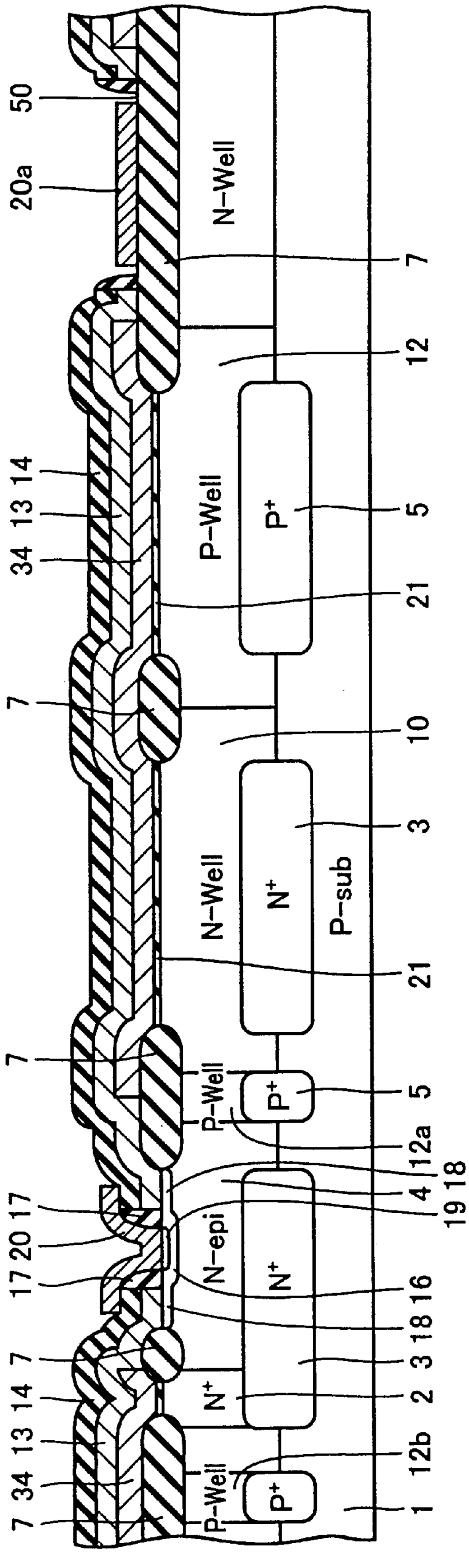

Referring to FIG. 30, a CVD oxide film 14 is deposited on the overall upper surface of a silicon substrate 1 by 300 nm, for example. The CVD oxide film 14 and the polysilicon film 13 are etched for forming an emitter opening. At this time, a region 50 for forming a polysilicon resistor is also patterned.

Then, steps similar to those of the first embodiment shown in FIGS. 4 and 5 are carried out and thereafter a polysilicon film 20 is patterned. At this time, the polysilicon film 20 is so etched that a polysilicon film 20*a* remains in an opening of the region 50 for forming a polysilicon resistor.

Figure 8:
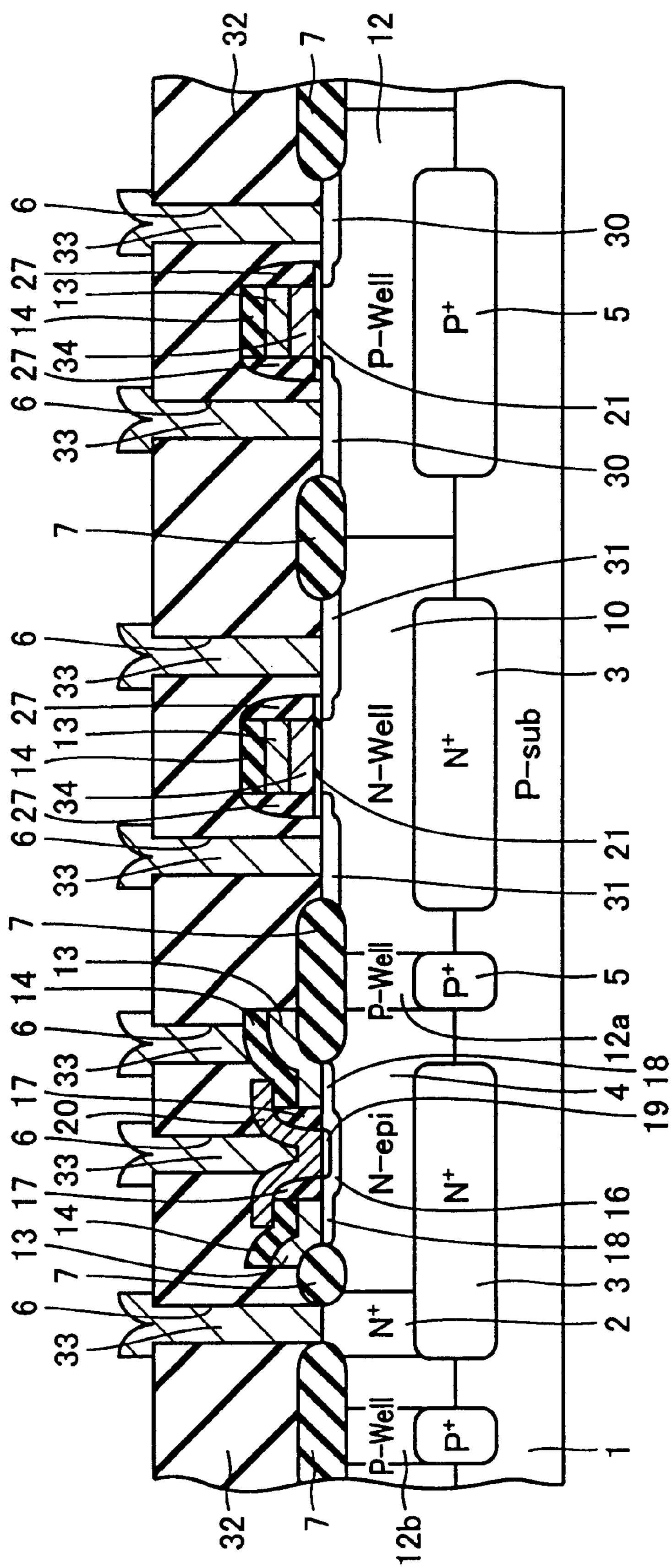
Figure 32:
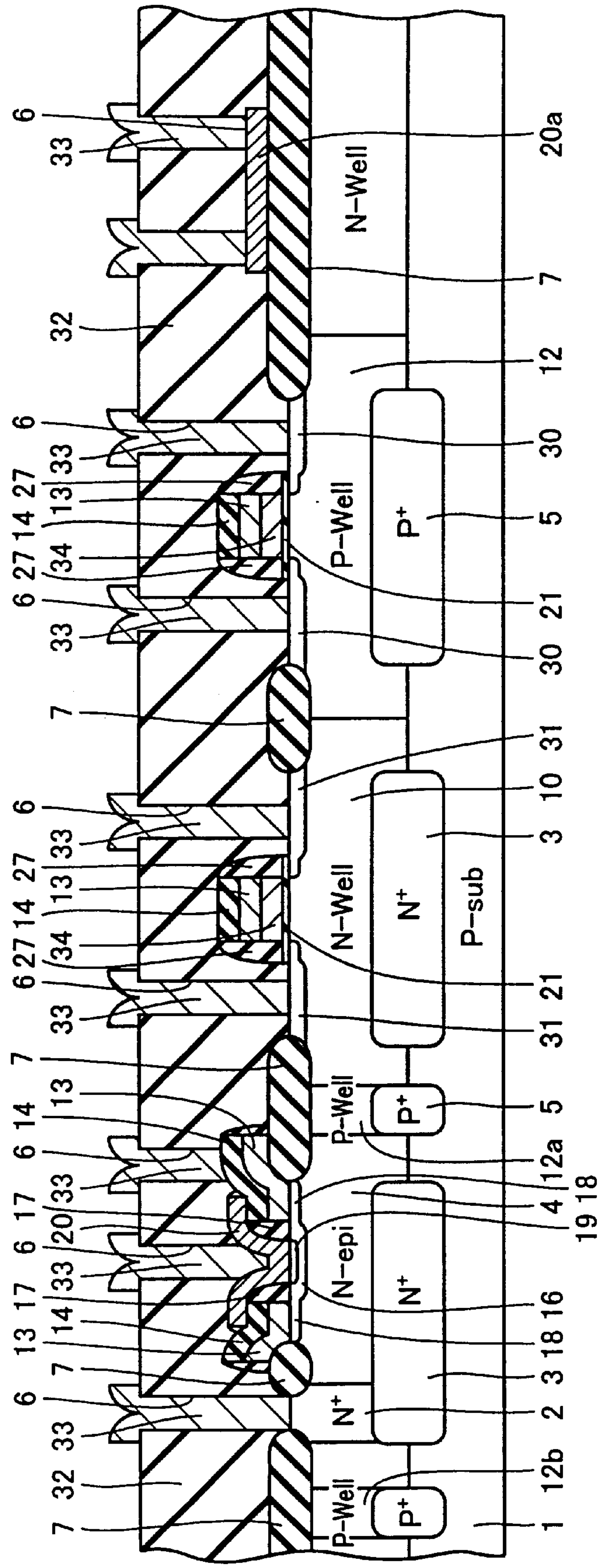

Referring to FIG. 32, steps similar to those of the first embodiment shown in FIGS. 7 and 8 are carried out for completing the BiCMOS device according to the seventh embodiment.

When ions 444, 555, 666 or 777 (not shown) for forming source/drain regions are implanted, the formed polysilicon resistor 20*a* is protected with a resist mask (not shown) so that no impurity is implanted into the polysilicon resistor 20*a*.

According to the seventh embodiment, as hereinabove described, an emitter electrode 20 is simultaneously formed along with the polysilicon resistor 20*a* in a method similar to that according to the first embodiment. Further, neither the CVD oxide film 14 nor the polysilicon film 13 located under the polysilicon resistor 20*a* of the sixth embodiment is present in this embodiment, whereby the polysilicon resistor 20*a* can be formed on a field oxide film 7 so that the depth of a contact hole is not extremely shallowed.

In the method according to the sixth embodiment, a contact hole 6 located on the polysilicon resistor 20*a* has a small depth. When contact etching is performed, therefore, the polysilicon resistor 20*a* is etched for a long time before completion of contact etching on source/drain regions 30 and 31 of CMOS parts having deep contact holes 7. Consequently, the thickness of the polysilicon resistor 20*a* located under the contact hole 6 is so reduced that the contact hole 6 may punch through the polysilicon resistor 20*a* at the worst.

In the method according to the seventh embodiment, the contact hole 6 can be formed deeper than that in the sixth embodiment, whereby no punch-through is caused in etching but a margin for setting etching conditions is improved.

Thus, the method according to the seventh embodiment attains an effect of improving a set margin for contact etching conditions in addition to an effect similar to that attained by the sixth embodiment.

Eighth Embodiment

FIGS. 33 to 36 are sectional views of a semiconductor device showing steps in a process of fabricating a BiCMOS device according to an eighth embodiment of the present invention.

Figure 33:
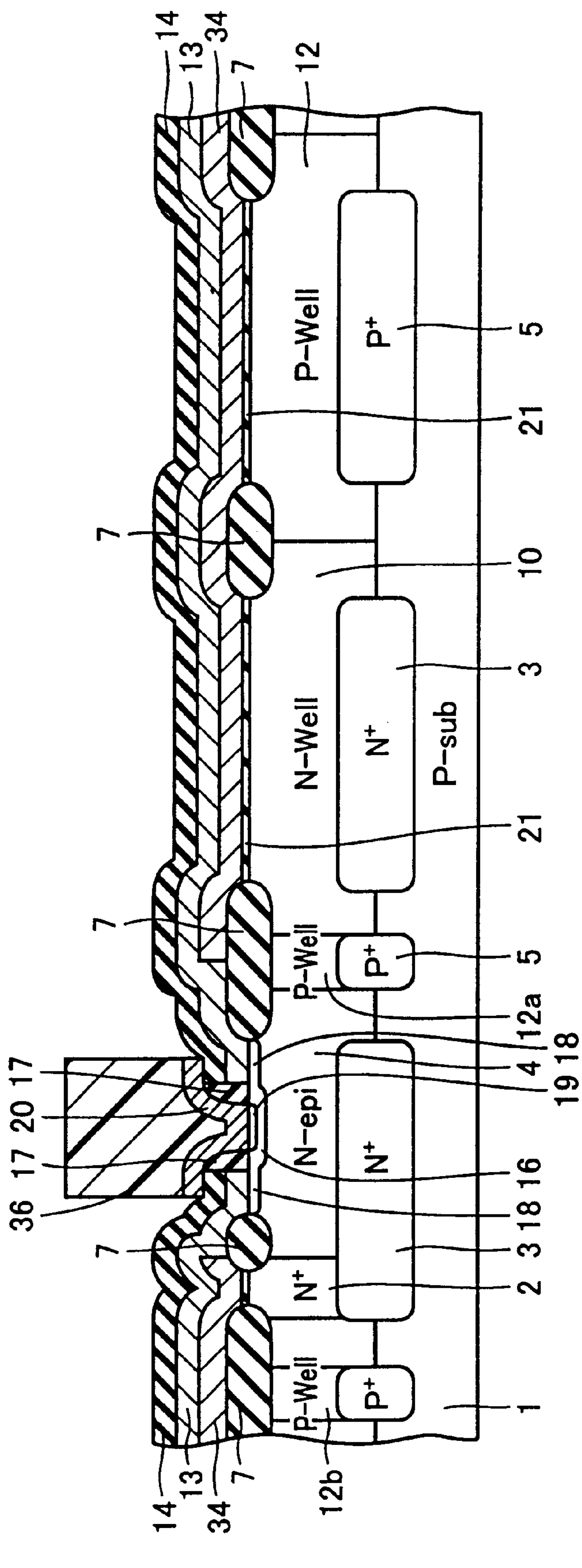
FIGS. 33 to 36 are sectional views of a semiconductor device successively showing first to fourth steps in a method of fabricating a BiCMOS device according to an eighth embodiment of the present invention.

Referring to FIG. 33, steps similar to those shown in FIGS. 1 to 6 are carried out similarly to the first embodiment. Referring to FIG. 33, a resist mask 36 employed for forming an emitter electrode 20 is left as such.

Figure 34:
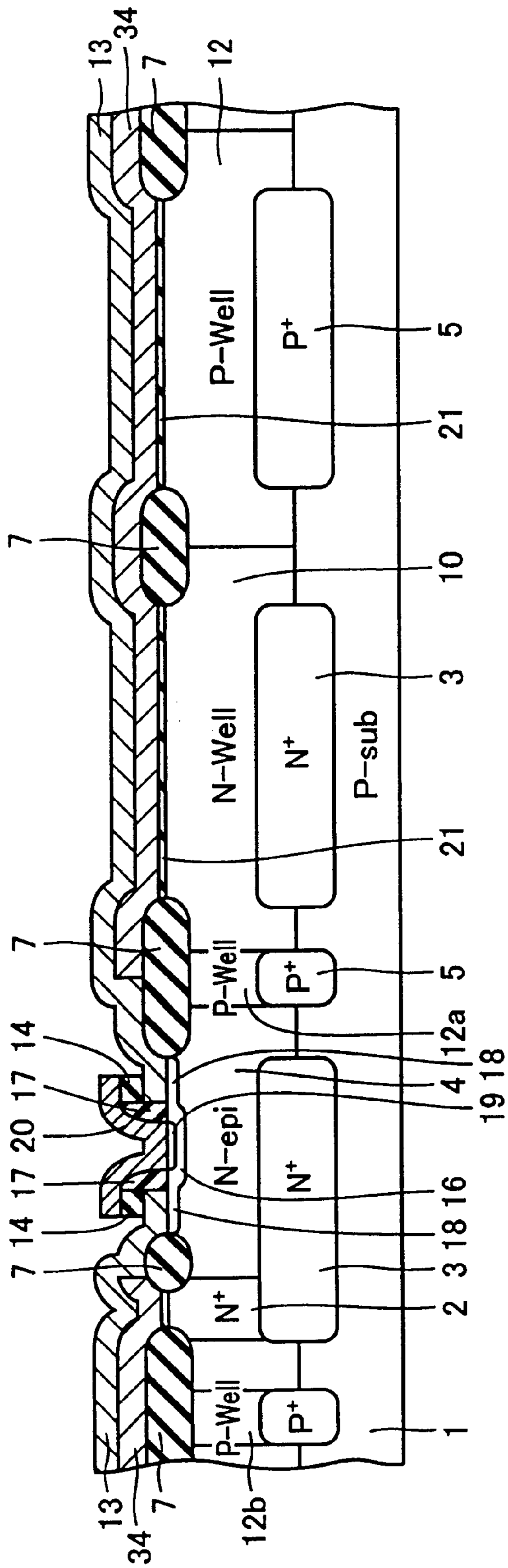

Referring to FIGS. 33 and 34, a CVD oxide film 14 is partially removed by etching through the unremoved resist mask 36. Thereafter the resist mask 36 is removed.

Figure 35:
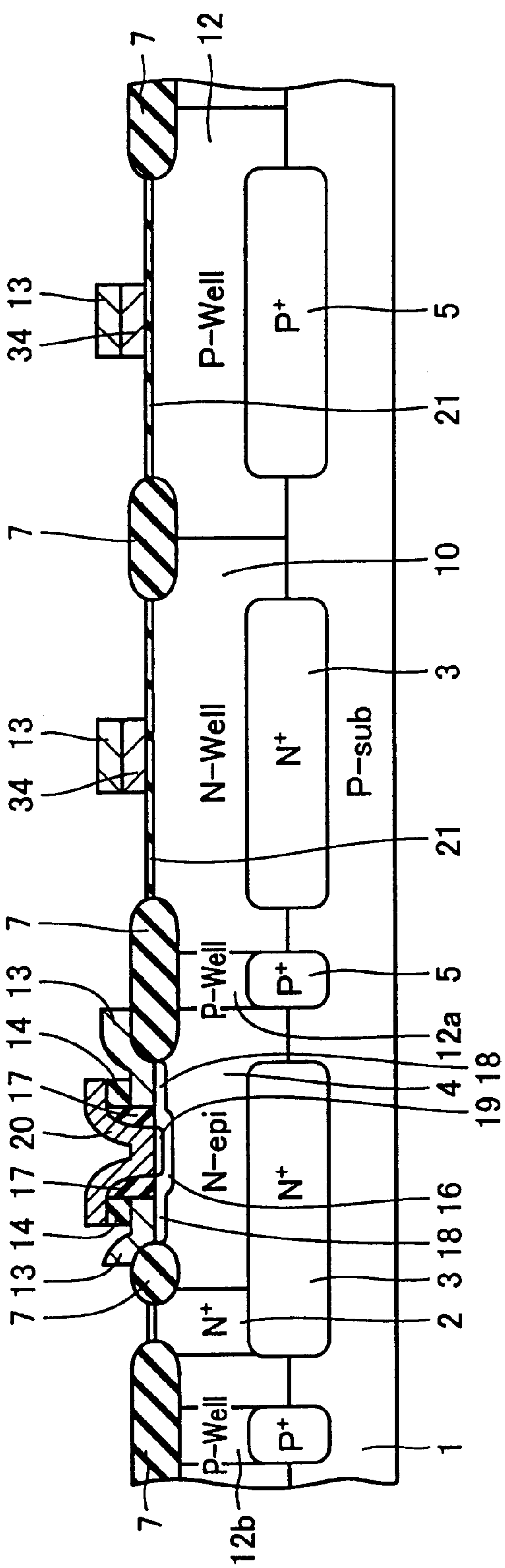

Referring to FIG. 35, gate electrodes ($N^+$-type polysilicon films 34 and polysilicon films 13) and an external base electrode 13 are simultaneously patterned. At this time, gate oxide films 21 are formed on the surfaces of an N-type well region 10, a P-type well region 12 and a collector electrode 2, so that these regions are not etched due to the difference between the etching rates for silicon and an oxide film (the etching rate for an oxide film is smaller than that for silicon).

Figure 36:
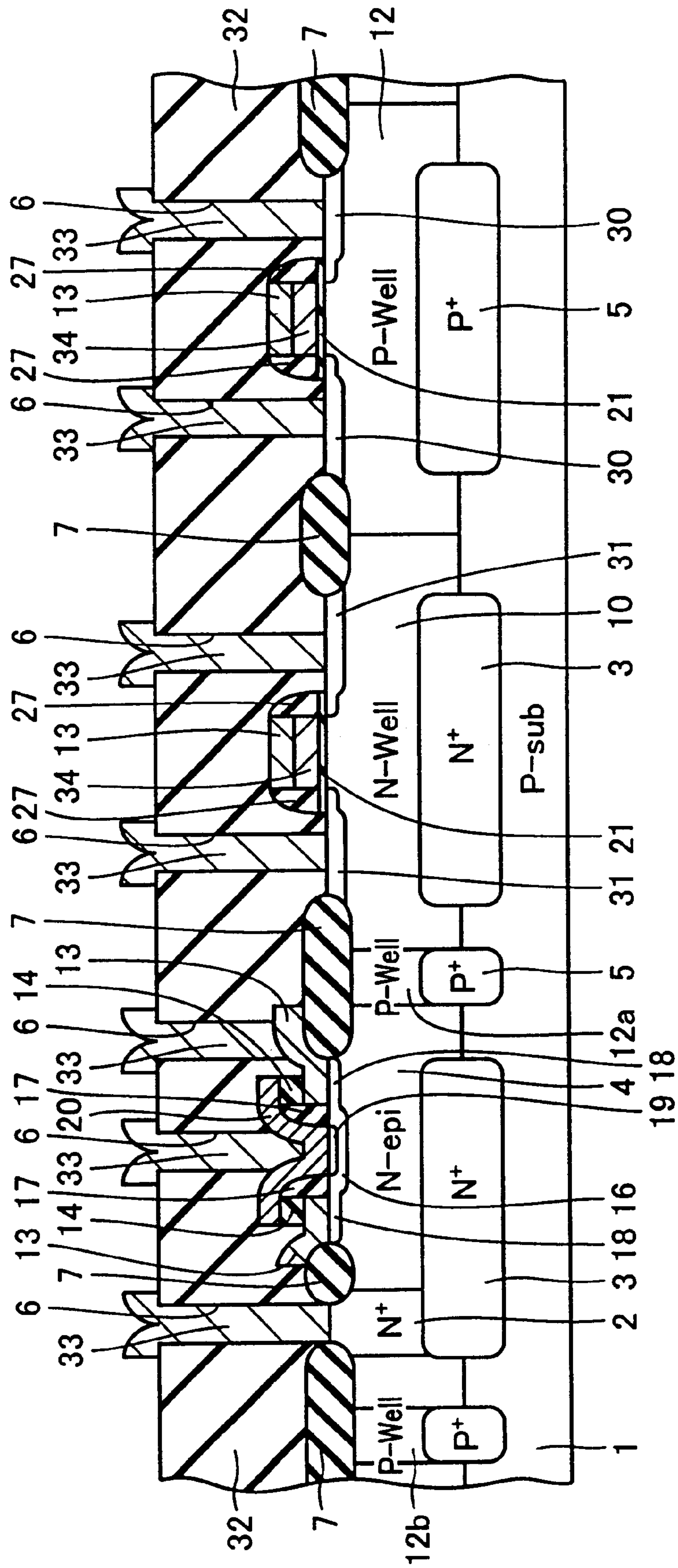

Referring to FIG. 36, steps similar to those of the prior art shown in FIGS. 78 to 82 are thereafter carried out for completing the BiCMOS device according to the eighth embodiment.

The gate electrodes (the $N^+$-type polysilicon films 34 and the polysilicon films 13) and the external base electrode 13 are patterned by etching both of the CVD oxide film 14 and the polysilicon films (the $N^+$-type polysilicon films 34 and the polysilicon films 13) in each of the first to seventh embodiments. According to the eighth embodiment, only the polysilicon films (the $N^+$-type polysilicon films 34 and the polysilicon films 13) are etched. In each of the first to seventh embodiments, the polysilicon films (the $N^+$-type polysilicon films 34 and the polysilicon films 13) are etched through the CVD oxide film 14 serving as a mask, and hence the CVD oxide film 14 is dimensionally dispersed in addition to dimensional dispersion of the gate electrodes and the external gate electrode 13. According to the eighth embodiment, no oxide film dimensionally is dispersed and hence precision against dimensional dispersion is effectively improved.

Ninth Embodiment

Figure 37:
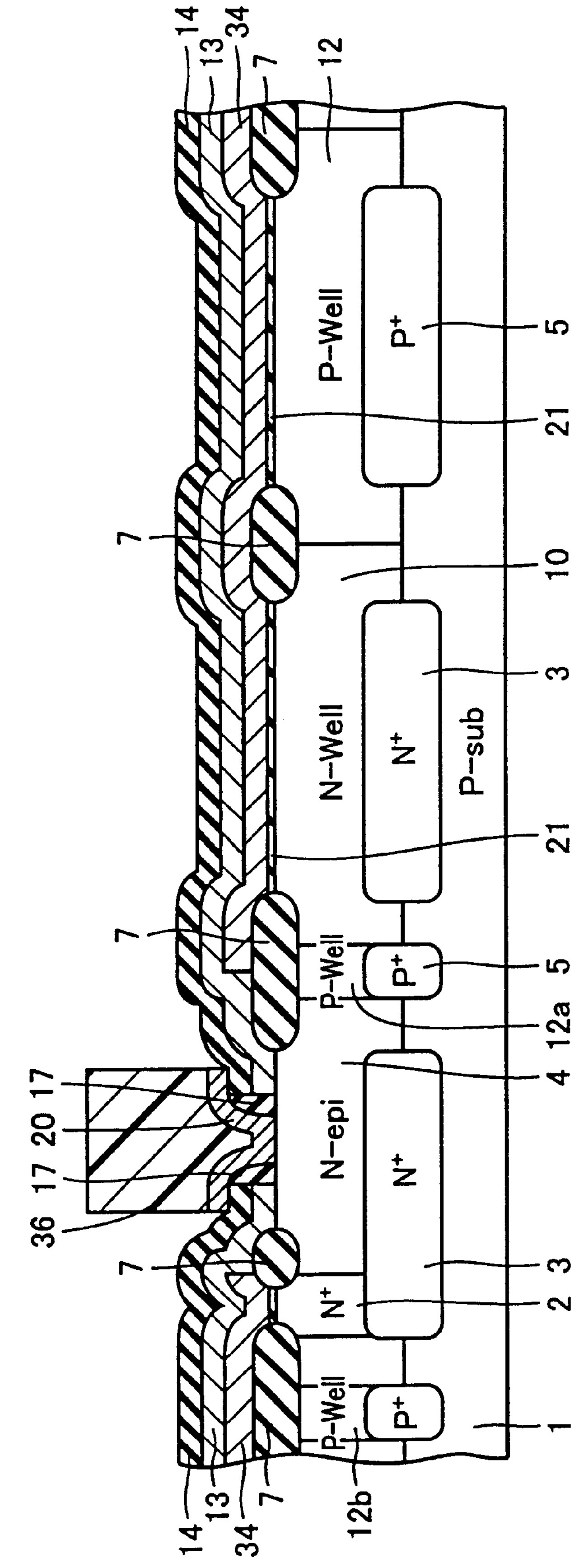
FIGS. 37 to 39 are sectional views of a semiconductor device successively showing first to third steps in a method of fabricating a BiCMOS device according to a ninth embodiment of the present invention.
Figure 38:
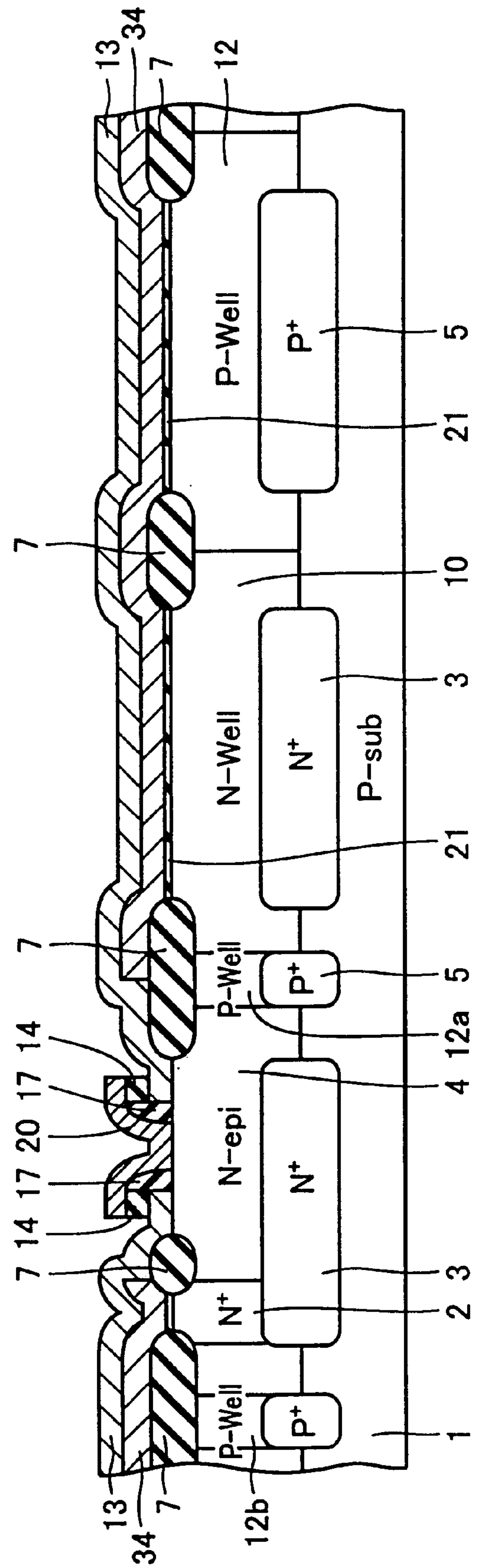
Figure 39:
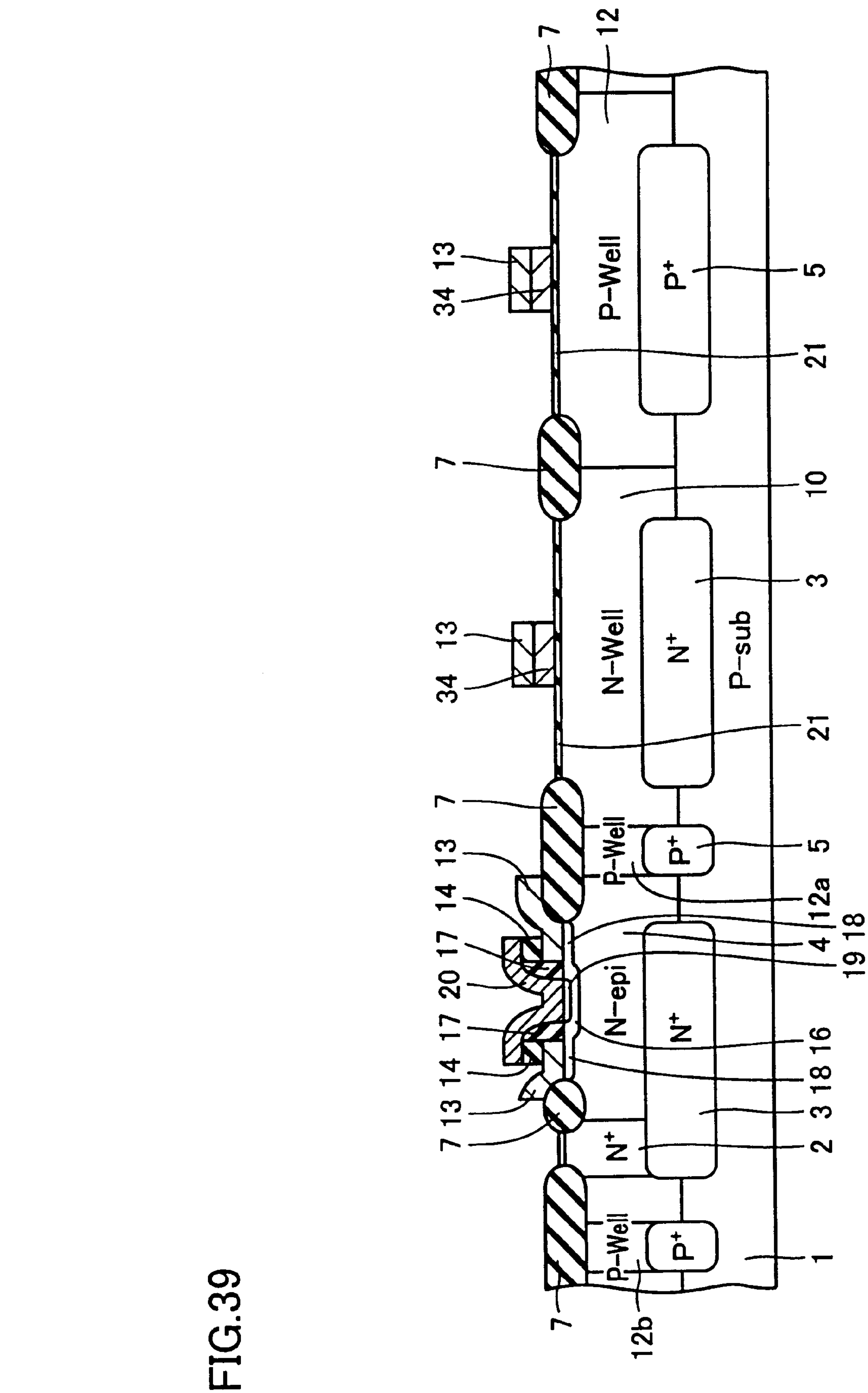

FIGS. 37 to 39 are sectional views of a semiconductor device showing steps in a process of fabricating a BiCMOS device according to a ninth embodiment of the present invention.

This embodiment relates to positional substitution in annealing.

Referring to FIG. 37, steps similar to those shown in FIGS. 1 to 6 are carried out similarly to the first embodiment. While a polysilicon film 20 is deposited on the overall surface by 150 nm, for example, and an $N^+$-type impurity is implanted into this polysilicon film 20 (arsenic is implanted at 50 KeV by $1\times10^{16}$ $cm^{-2}$, for example), no subsequent annealing is performed. Then, the polysilicon film 20 is etched for forming an emitter electrode 20.

Referring to FIGS. 37 and 38, a CVD oxide film 14 is partially removed by etching without removing a resist mask 36.

Referring to FIG. 39, gate electrodes ($N^+$-type polysilicon films 34 and polysilicon films 13 or the like) and an external base electrode 13 are simultaneously patterned. At this time, gate oxide films 21 are formed on the surfaces of an N-type well region 10, a P-type well region 12 and a collector region 2, so that these regions are not etched due to the difference between the etching rates for silicon and an oxide film (the etching rate for an oxide film is smaller than that for silicon).

Then, annealing is performed for diffusing arsenic from the emitter electrode 20 into an intrinsic base region 16, thereby forming an emitter region 19. At this time, boron diffuses from the external base electrode 13, to form an external base region 18. While diffusion of boron takes place also in heat treatment preceding this annealing step, this diffusion is not illustrated.

Thereafter steps similar to those of the prior art shown in FIGS. 78 to 82 are carried out for completing the BiCMOS device according to the ninth embodiment.

According to the ninth embodiment, the position of annealing performed in the eighth embodiment is substituted in order to prevent mutual diffusion of impurities between the $N^+$-type polysilicon film 34 and the external base electrode 13. This is an idea similar to that of the second embodiment.

According to the ninth embodiment, as hereinabove described, mutual diffusion of impurities between the $N^+$-type polysilicon film 34 and the external base electrode 13 can be prevented in addition to an effect similar to that attained by the eighth embodiment, for obtaining stable bipolar and CMOS transistor characteristics with small dispersion.

Tenth Embodiment

FIGS. 40 to 43 are sectional views of a semiconductor device showing steps in a process of fabricating a BiCMOS device according to a tenth embodiment of the present invention.

Figure 40:
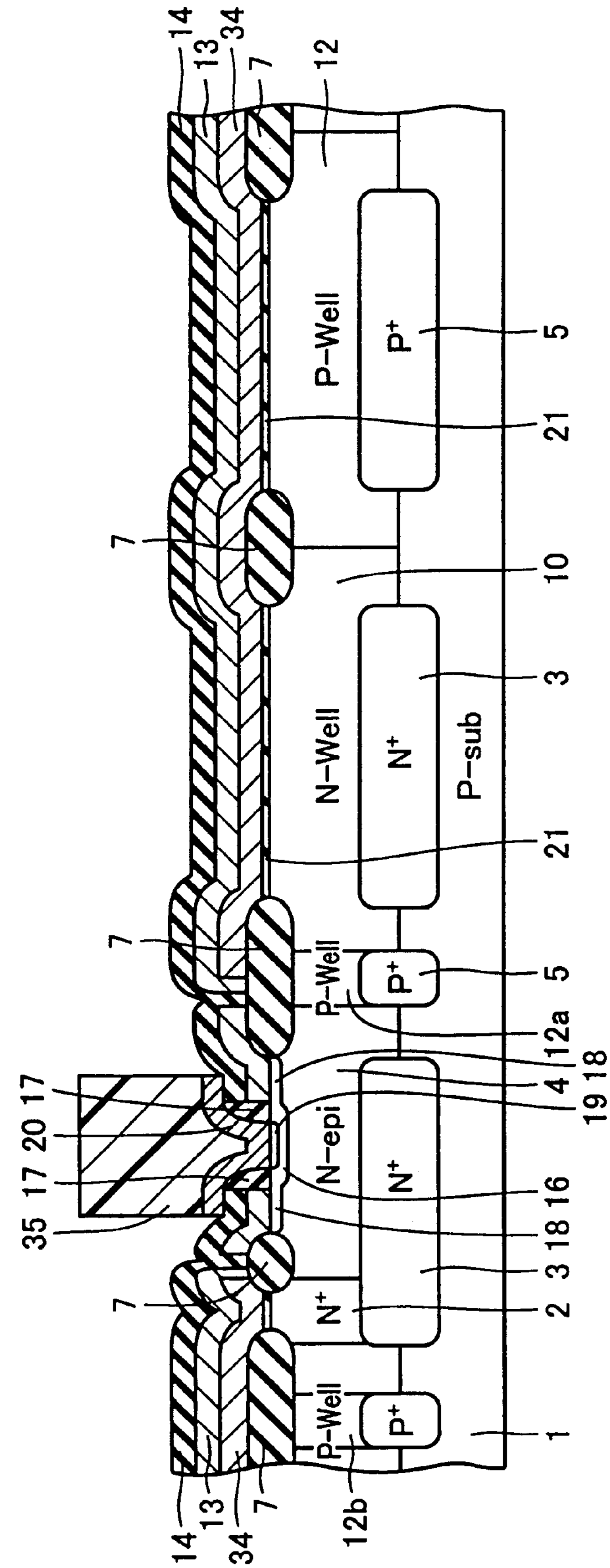
FIGS. 40 to 43 are sectional views of a semiconductor device successively showing first to fourth steps in a method of fabricating a BiCMOS device according to a tenth embodiment of the present invention.

Referring to FIG. 40, steps similar to those shown in FIGS. 11 to 13 are carried out similarly to the third embodiment.

Figure 41:
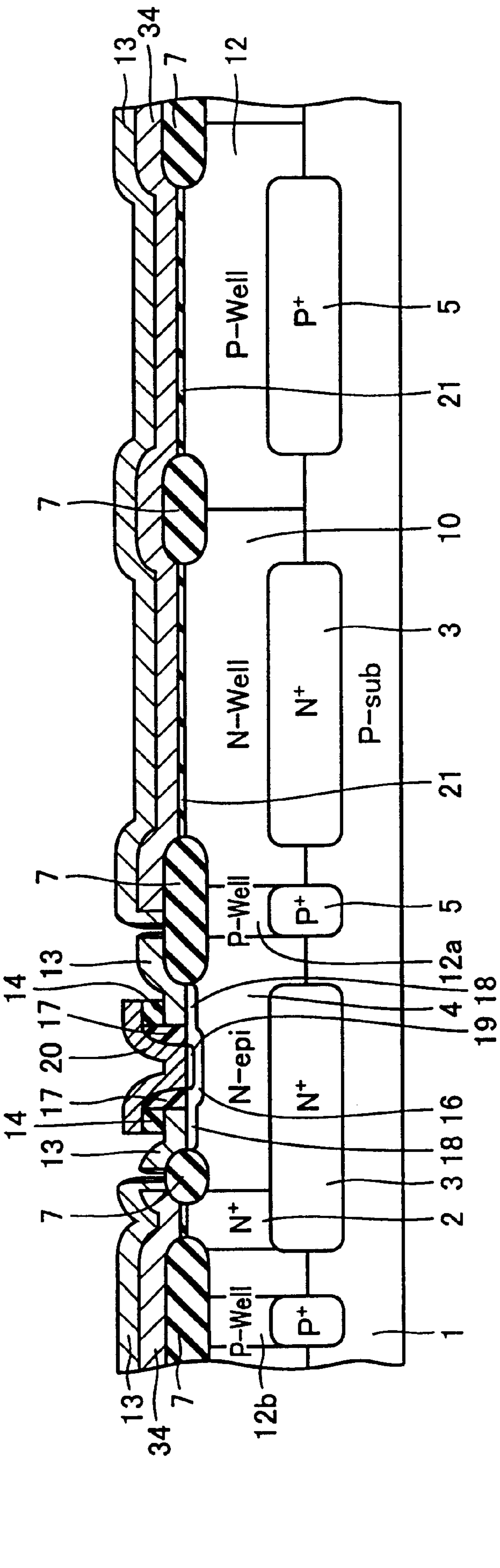

Referring to FIGS. 40 and 41, a CVD oxide film 14 is partially removed by etching through an unremoved resist mask 36. Thereafter the resist mask 36 is removed.

Figure 42:
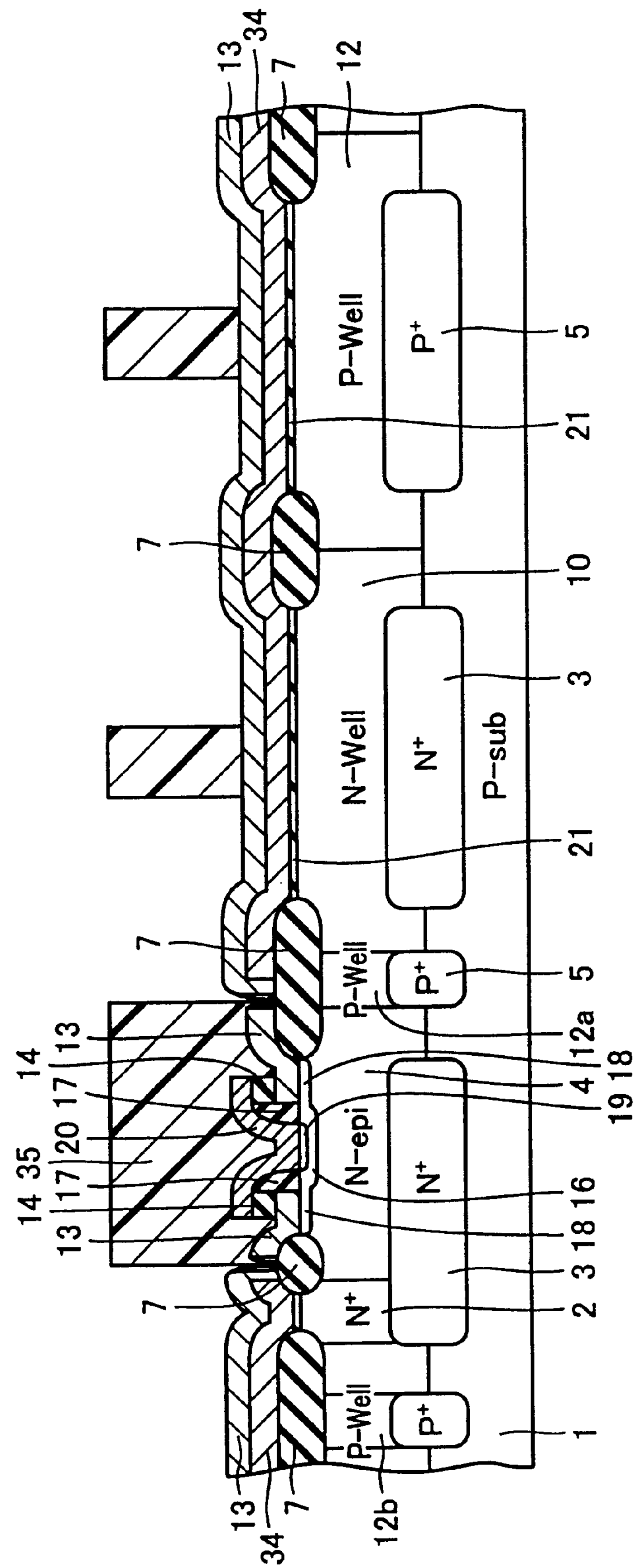

Referring to FIGS. 41 and 42, gate electrodes ($N^+$-type polysilicon films 34 and polysilicon films 13) are patterned through a resist pattern 35. An external base electrode 13 is already patterned, and hence the resist pattern 35 is formed to cover this external base electrode 13.

Figure 43:
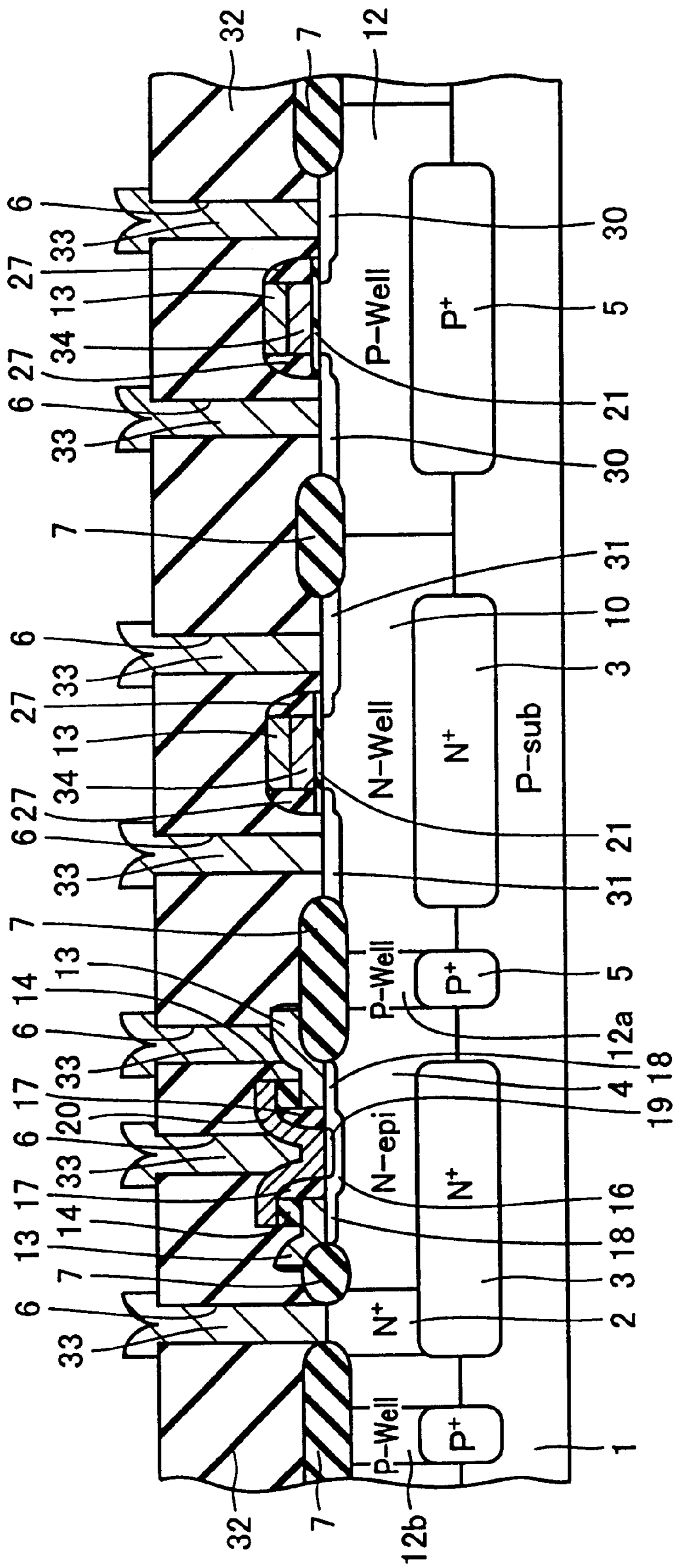

Referring to FIG. 43, steps similar to those of the prior art shown in FIGS. 78 to 82 are thereafter carried out for completing the BiCMOS device according to the tenth embodiment.

In the tenth embodiment, the third embodiment is applied to the eighth embodiment. Mutual diffusion of impurities between the $N^+$-type polysilicon film 34 and the external base electrode 13 can be completely prevented by etching.

According to this embodiment, as hereinabove described, mutual diffusion of impurities between the $N^+$-type polysilicon film 34 and the external base electrode 13 can be prevented in addition to an effect similar to that attained by the eighth embodiment, for obtaining stable bipolar and CMOS transistor characteristics with small dispersion.

Eleventh Embodiment

FIGS. 44 to 47 are sectional views of a semiconductor device showing steps in a process of fabricating a BiCMOS device according to an eleventh embodiment of the present invention.

Figure 17:
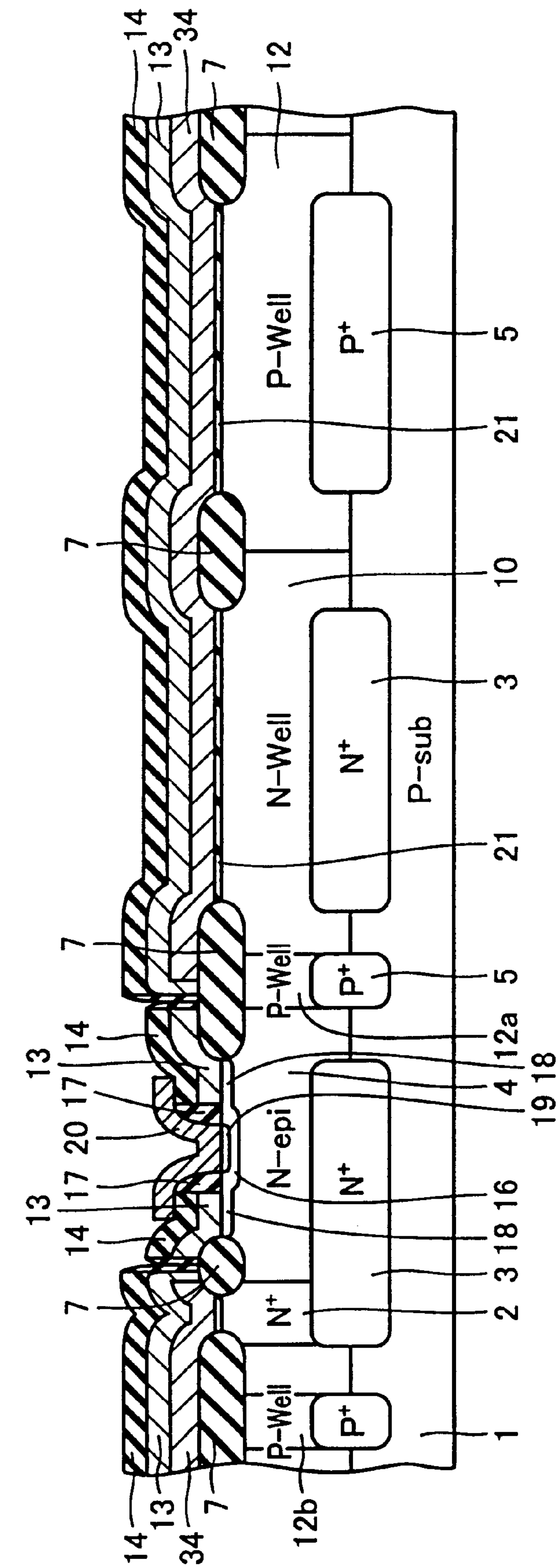
Figure 44:
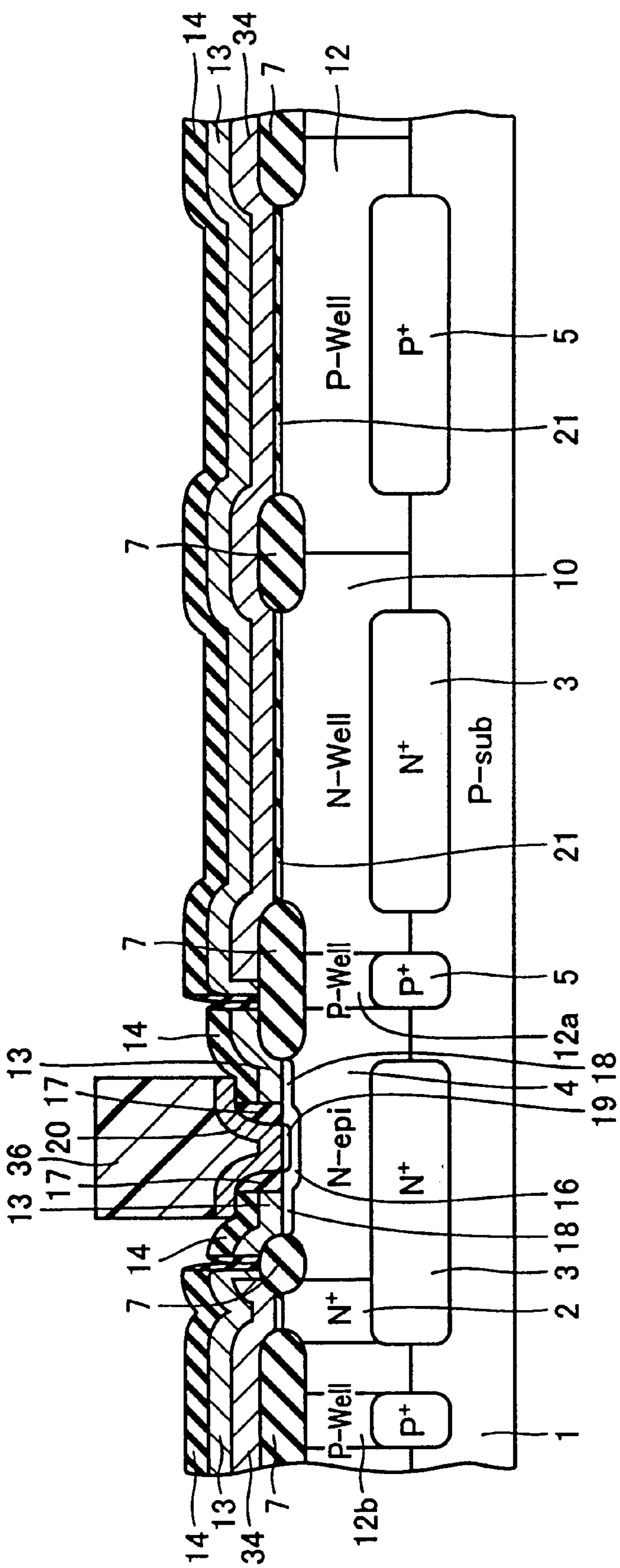
FIGS. 44 to 47 are sectional views of a semiconductor device successively showing first to fourth steps in a method of fabricating a BiCMOS device according to an eleventh embodiment of the present invention.

Referring to FIG. 44, steps similar to those shown in FIGS. 16 and 17 are carried out similarly to the fourth embodiment.

Figure 45:
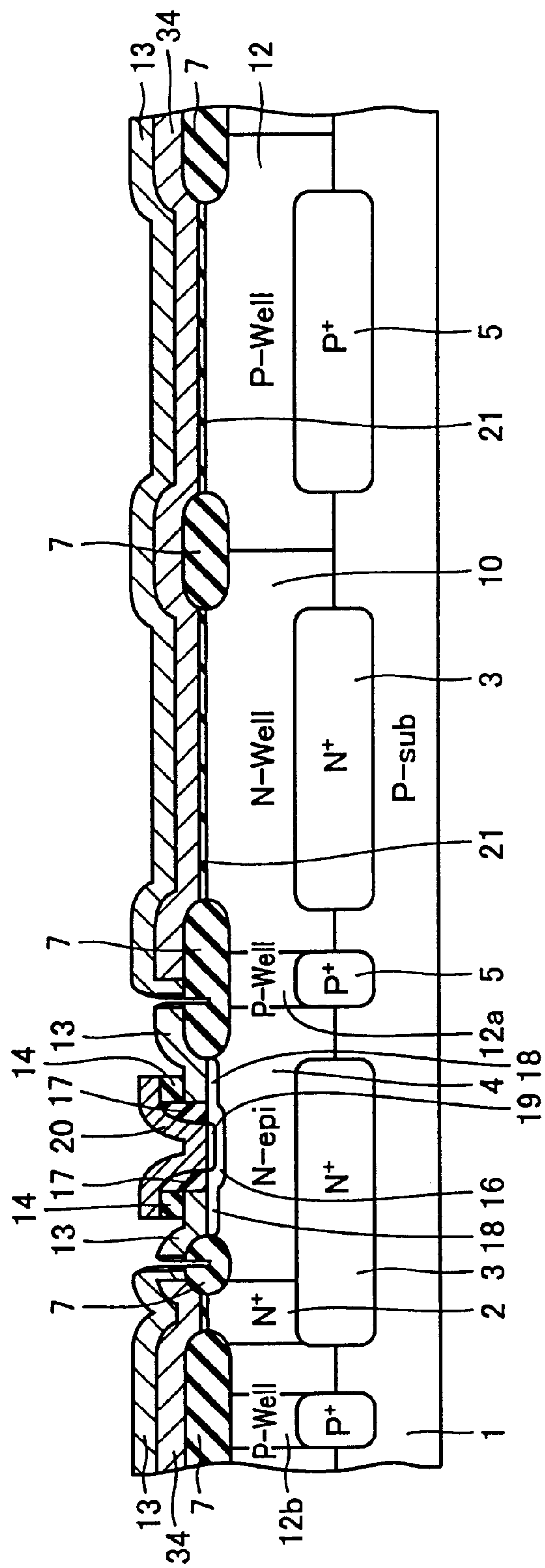

Referring to FIGS. 44 and 45, a CVD oxide film 14 is partially removed by etching without etching a resist pattern 36. Thereafter the resist pattern 36 is removed.

Figure 46:
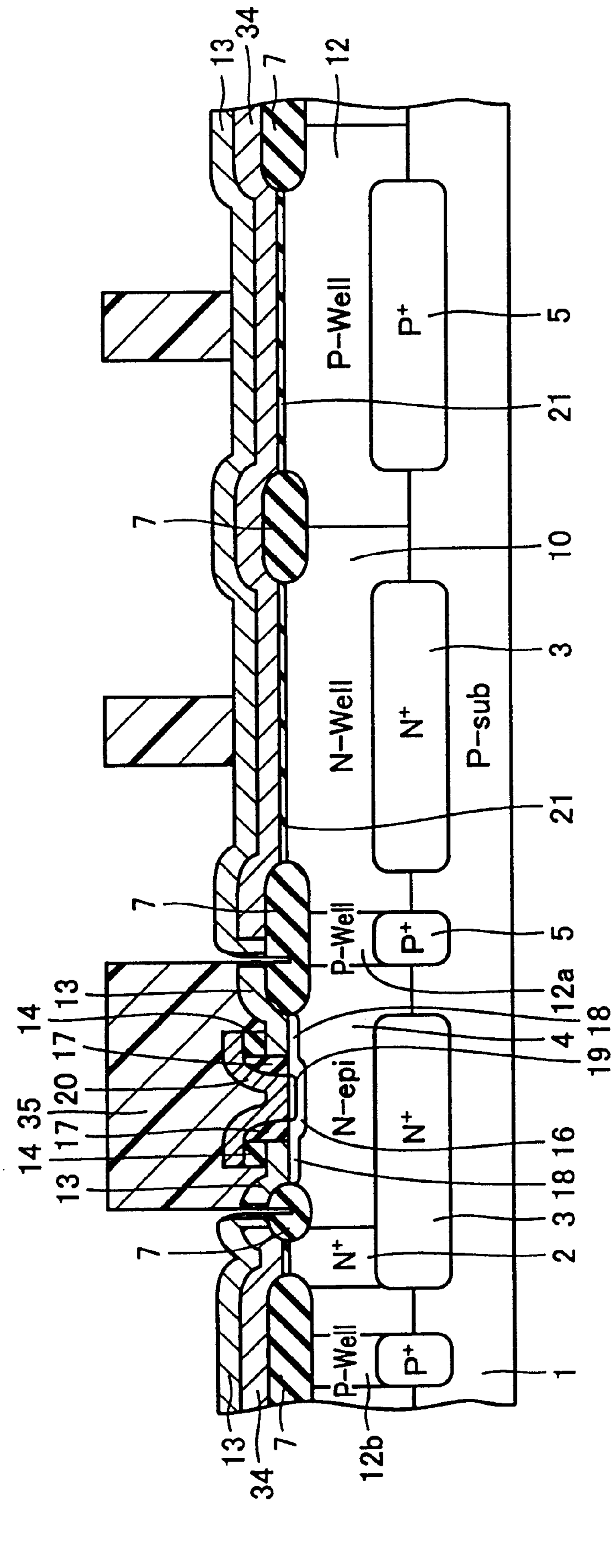

Referring to FIG. 46, gate electrodes ($N^+$-type polysilicon films 34 and polysilicon films 13) are patterned through a resist pattern 35, similarly to the fourth embodiment. An external base electrode 13 is already patterned, and hence the resist pattern 35 is formed to cover this external base electrode 13.

Figure 47:
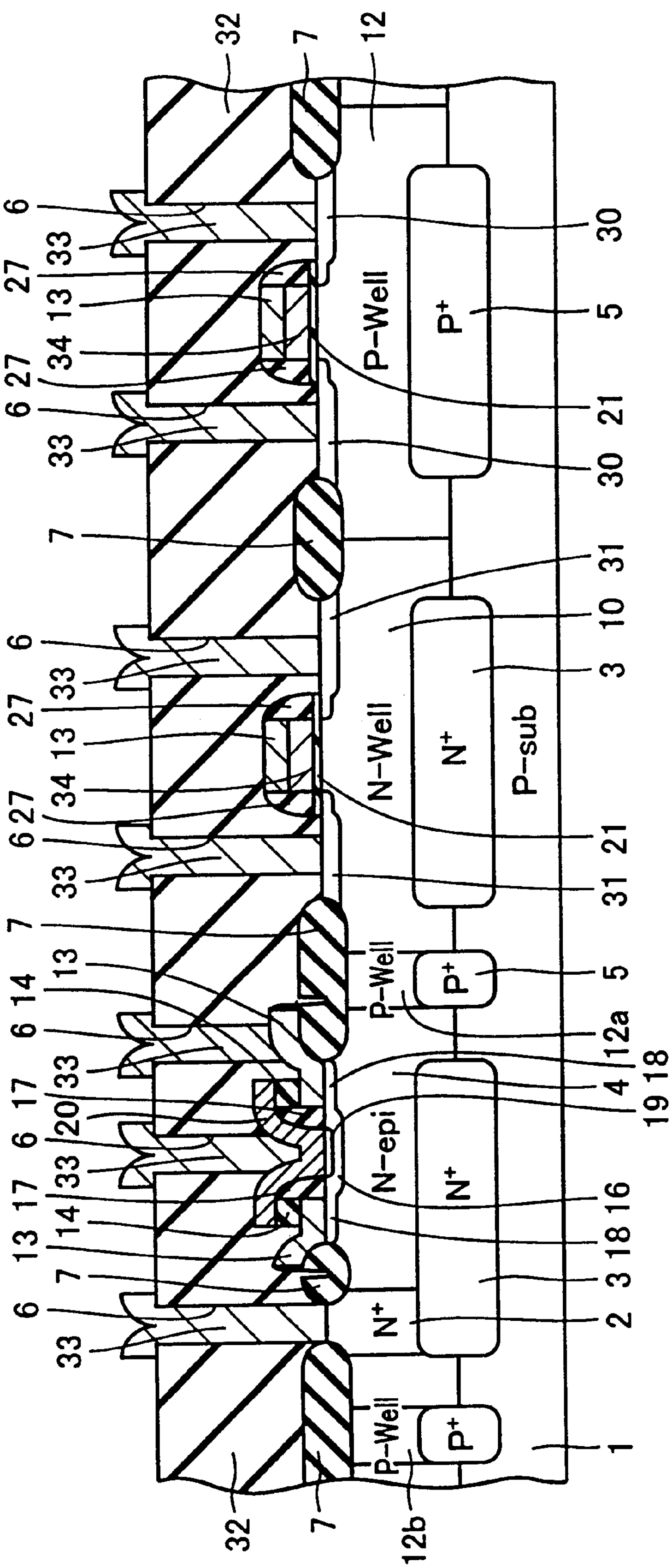

Referring to FIG. 47, steps similar to those of the prior art shown in FIGS. 78 to 82 are thereafter carried out for completing the BiCMOS device according to the eleventh embodiment.

In the eleventh embodiment, the fourth embodiment is applied to the eighth embodiment.

While the fourth embodiment includes the step employing a mask shown in FIG. 16, the eleventh embodiment can attain an effect similar to that of the fourth embodiment through no step corresponding to that shown in FIG. 16.

According to the eleventh embodiment, as hereinabove described, an effect similar to that of the tenth embodiment can be attained without adding a mask.

Twelfth Embodiment

FIGS. 48 to 51 are sectional views of a semiconductor device showing steps in a process of fabricating a BiCMOS device according to a twelfth embodiment of the present invention.

Figure 48:
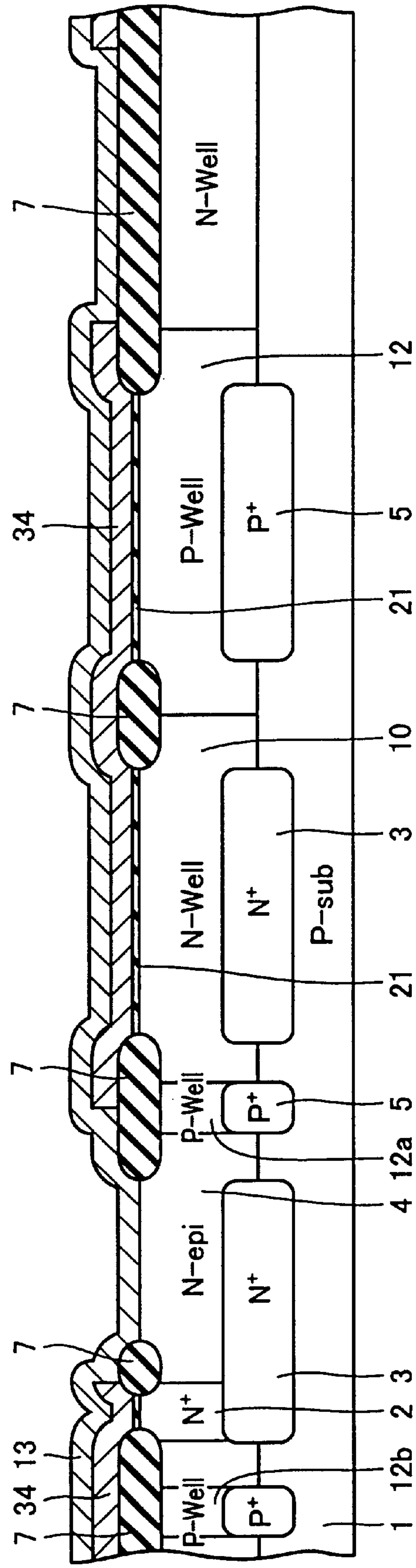
FIGS. 48 to 51 are sectional views of a semiconductor device successively showing first to fourth steps in a method of fabricating a BiCMOS device according to a twelfth embodiment of the present invention.

Referring to FIG. 48, steps similar to those shown in FIGS. 20 and 21 are carried out similarly to the fifth embodiment.

Figure 49:
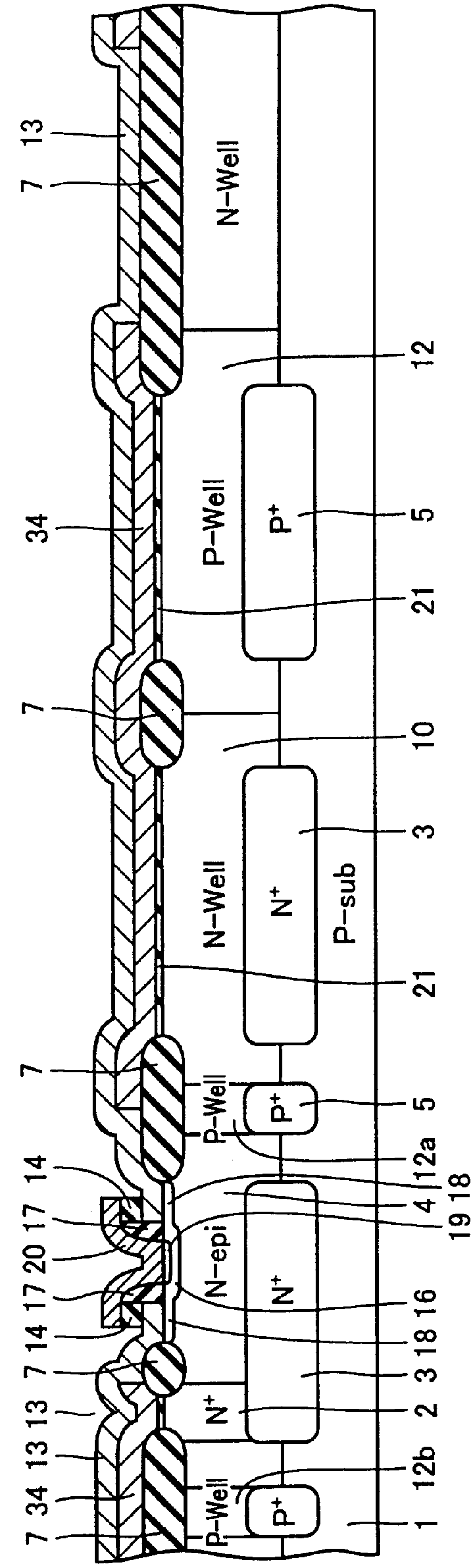

Referring to FIG. 49, steps similar to those shown in FIGS. 33 and 34 are carried out similarly to the eighth embodiment.

Figure 50:
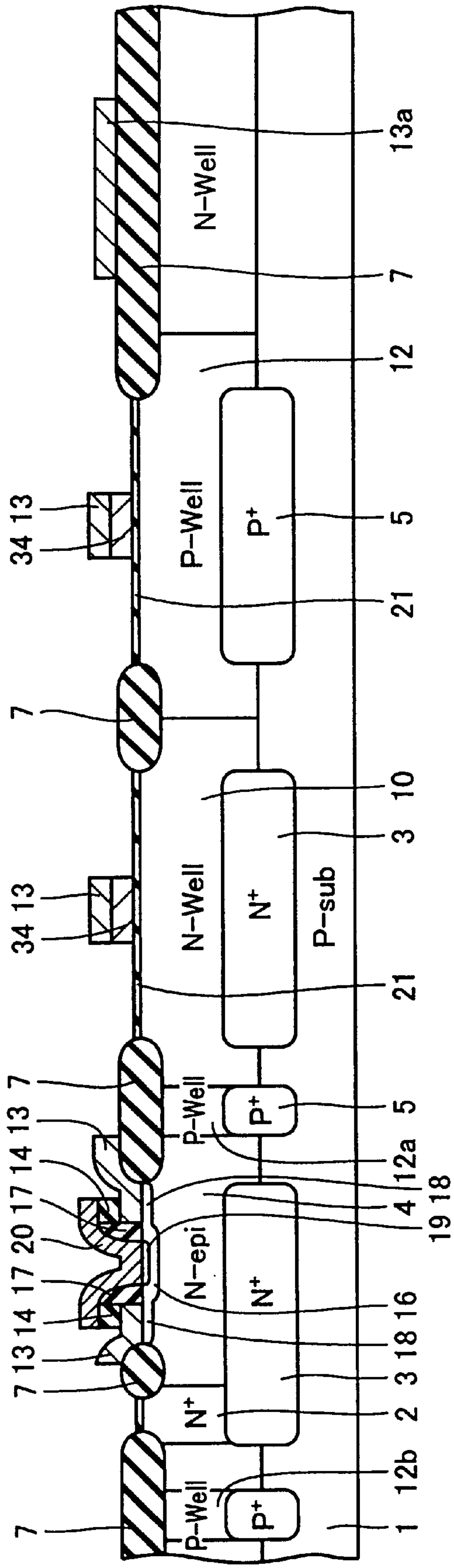

Referring to FIG. 50, gate electrodes ($N^+$-type polysilicon films 34 and polysilicon films 13) and an external base electrode 13 are simultaneously patterned. Further, a polysilicon resistor 13*a* is also simultaneously patterned.

Figure 51:
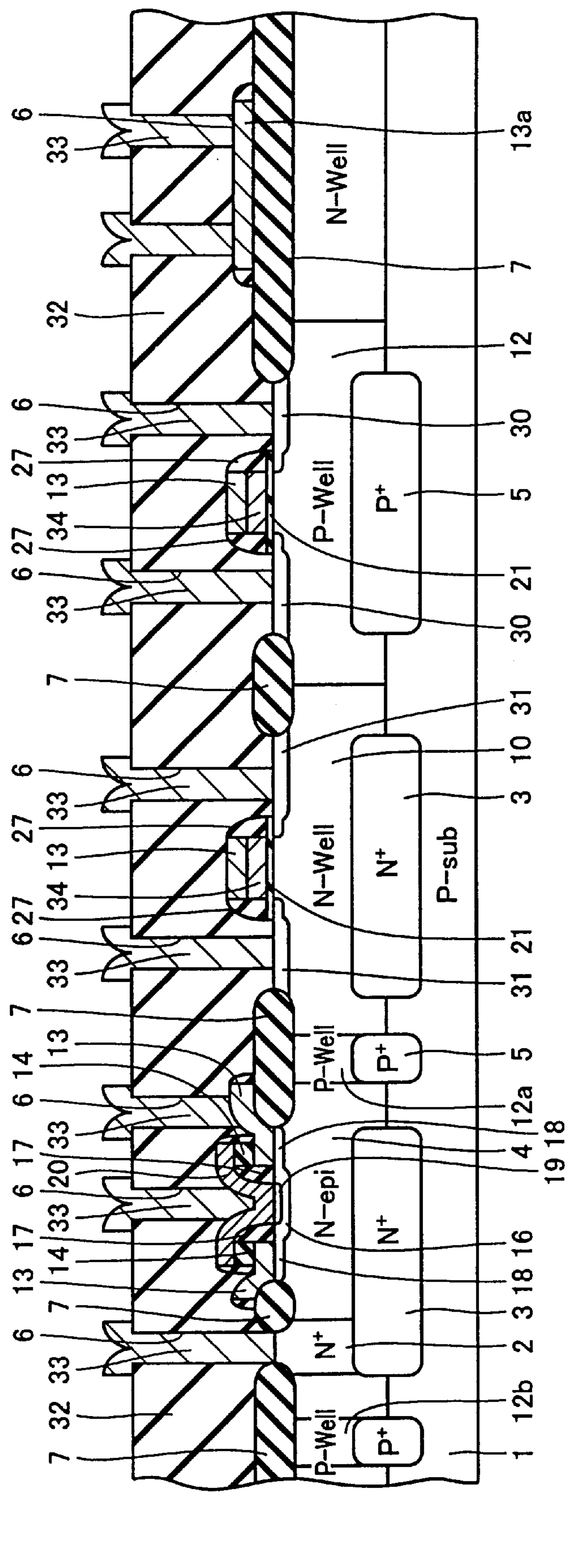

Referring to FIG. 51, steps similar to those of the prior art shown in FIGS. 78 to 82 are thereafter carried out for completing the BiCMOS device according to the twelfth embodiment.

When ions 444, 555, 666 or 777 (not shown) for forming source/drain regions are implanted, the polysilicon resistor 13*a* must be protected with a resist mask (not shown) so that no impurity is implanted into the polysilicon resistor 13*a*.

Thus, according to the twelfth embodiment, the external base electrode 13 and the polysilicon resistor 13*a* are simultaneously formed in a process similar to that according to the eighth embodiment.

According to this embodiment, as hereinabove described, a resistive element can also be formed in the fabrication method in addition to an effect similar to that attained by the eighth embodiment, for obtaining a semiconductor device having improved functions.

Thirteenth Embodiment

FIGS. 52 to 56 are sectional views of a semiconductor device showing steps in a process of fabricating a BiCMOS device according to a thirteenth embodiment of the present invention.

Figure 52:
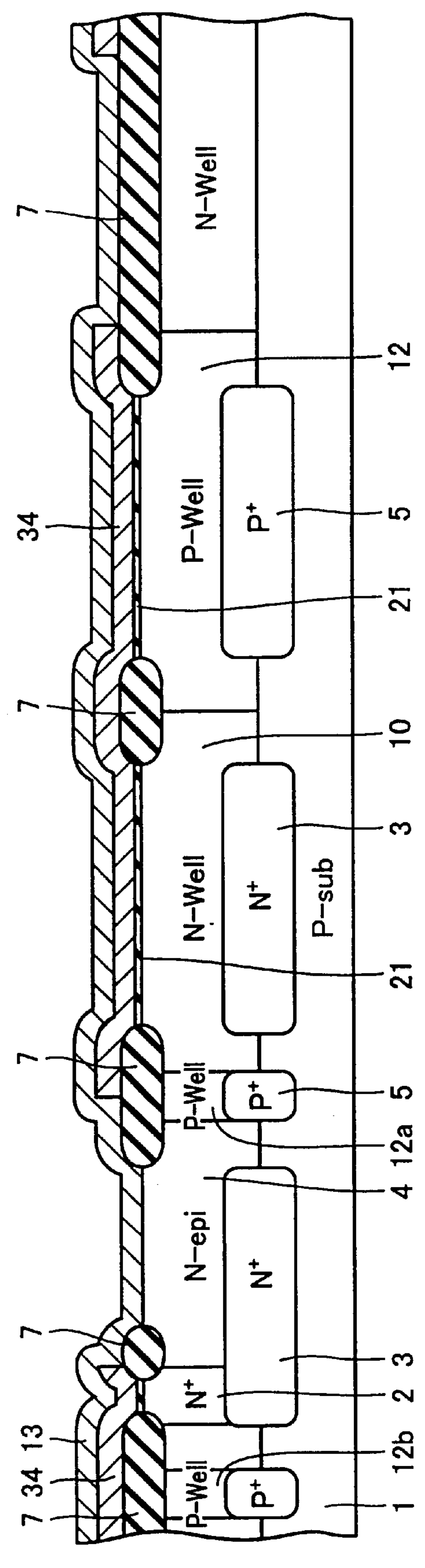
FIGS. 52 to 56 are sectional views of a semiconductor device successively showing first to fifth steps in a method of fabricating a BiCMOS device according to a thirteenth embodiment of the present invention.

Referring to FIG. 52, steps similar to those up to the step of the twelfth embodiment shown in FIG. 48 are carried out for depositing a polysilicon film 13 on the overall surface of a silicon substrate 1 by 150 nm, for example.

Figure 53:
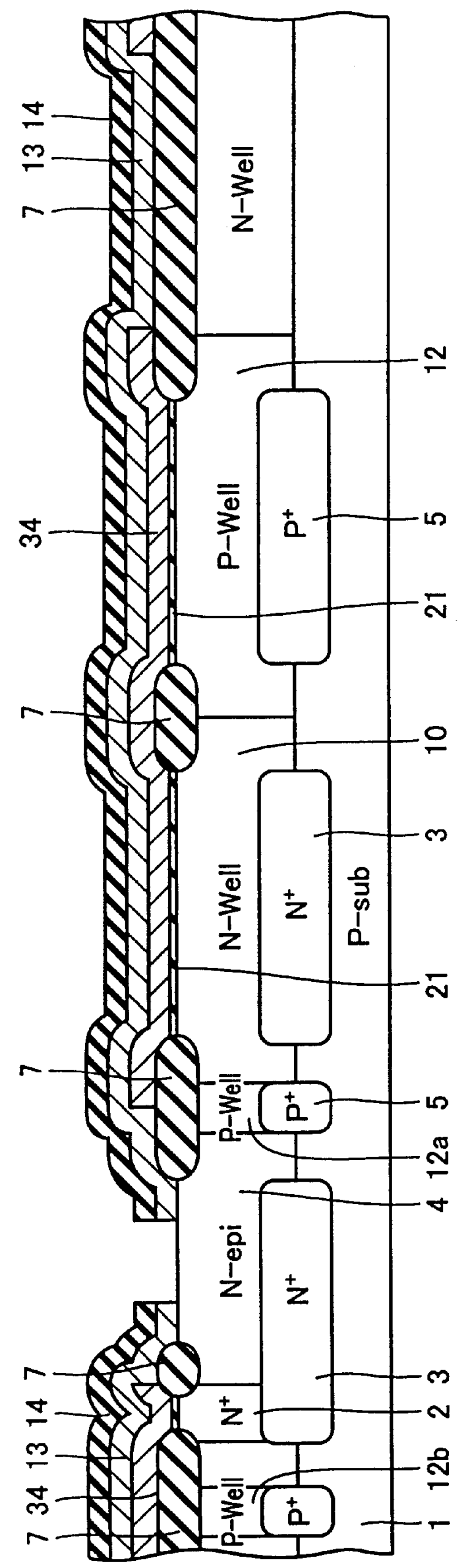

Referring to FIG. 53, a CVD oxide film 14 is deposited on the overall upper surface of the silicon substrate 1 by 300 nm, for example. The CVD oxide film 14 and the polysilicon film 13 are etched for forming an emitter opening.

Figure 54:
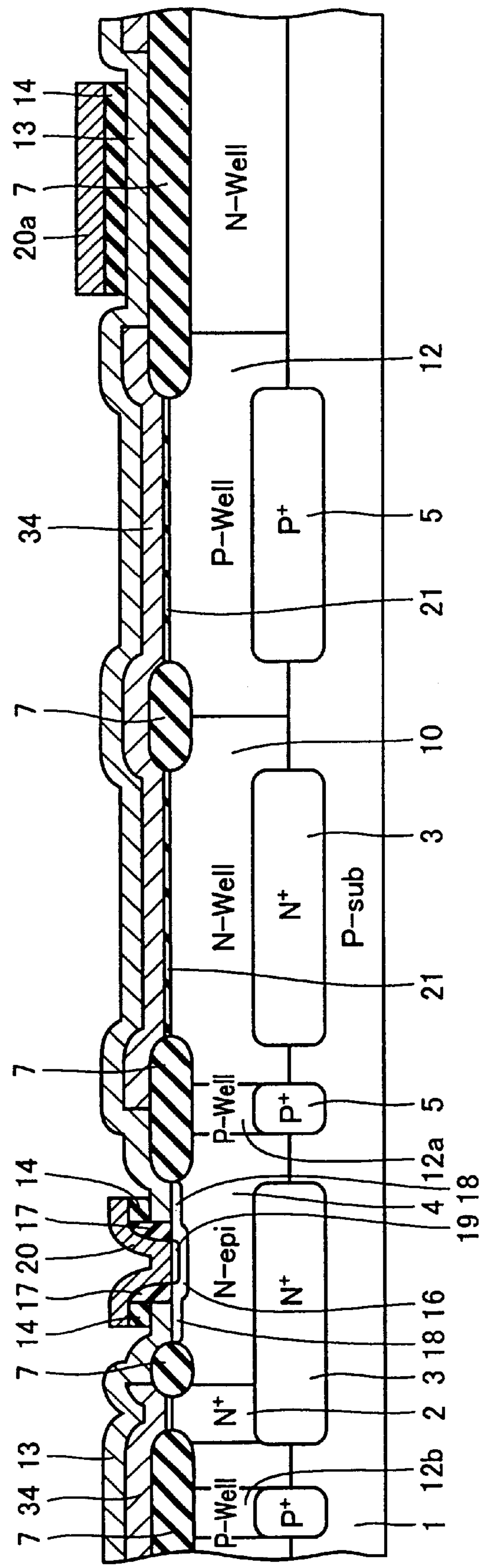

Referring to FIG. 54, a polysilicon film 20 is patterned and the CVID oxide film 14 is etched by a method similar to that in the eighth embodiment. At this time, the polysilicon film 20 is etched to remain on a region for forming a polysilicon resistor 20*a*.

Figure 55:
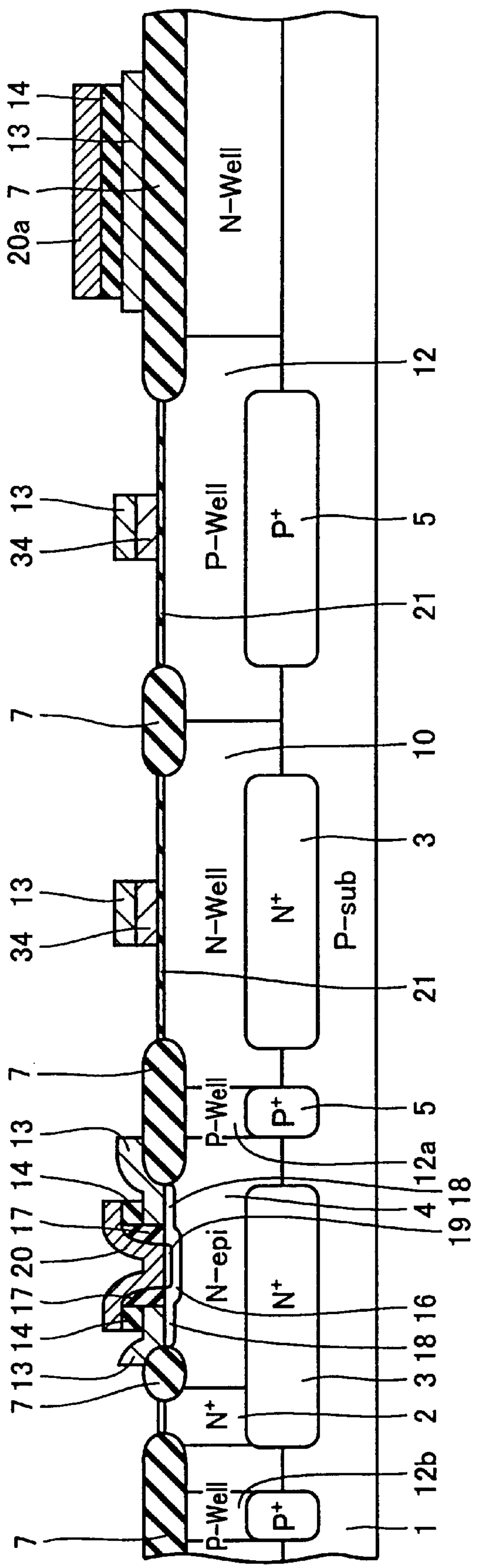

Referring to FIG. 55, gate electrodes ($N^+$-type polysilicon films 34 and polysilicon films 13) and an external base electrode 13 are patterned. At this time, the polysilicon film 13 located under the polysilicon resistor 20*a* is also simultaneously patterned.

Figure 56:
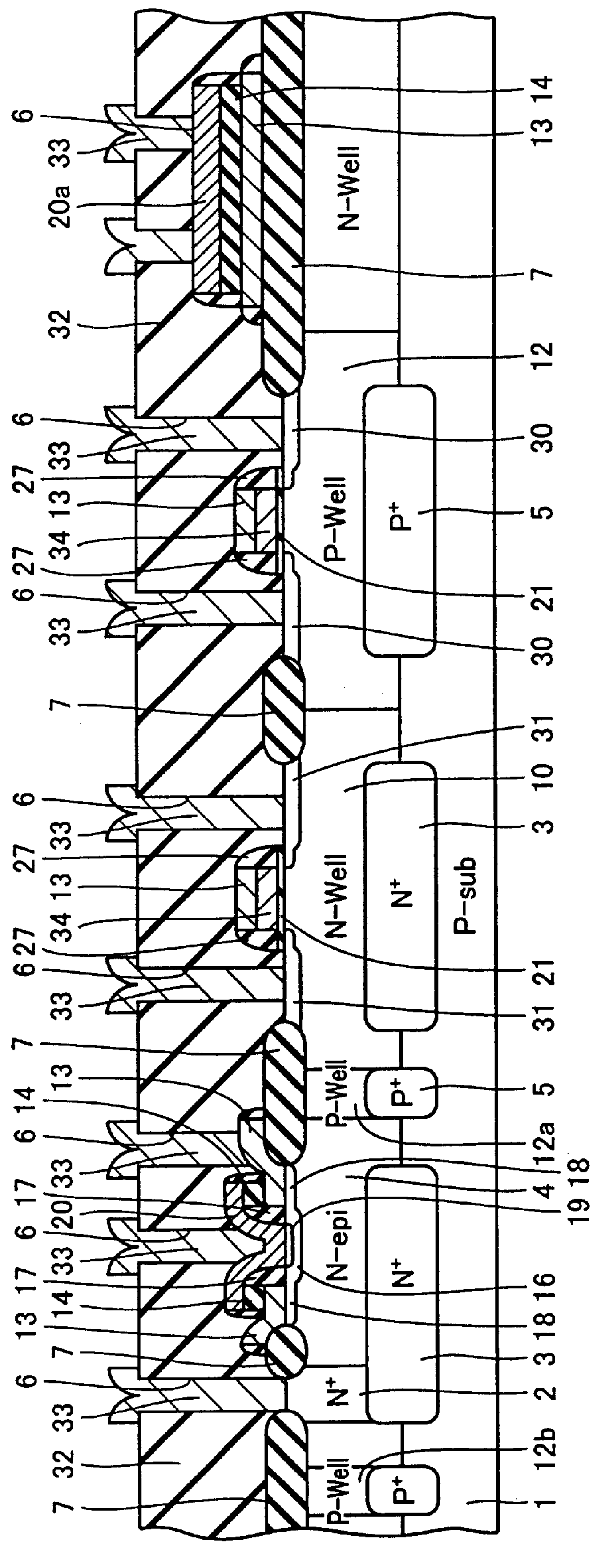

Referring to FIG. 56, the BiCMOS device according to the thirteenth embodiment is completed through steps similar to those of the prior art shown in FIGS. 78 to 82.

When ions 444, 555, 666 or 777 (not shown) for forming source/drain regions are implanted, the polysilicon resistor 20*a* must be protected with a resist mask (not shown) so that no impurity is implanted into the polysilicon resistor 20*a*.

Thus, according to the thirteenth embodiment, an emitter electrode 20 and the polysilicon resistor 20*a* are simultaneously formed in a method similar to that according to the eighth embodiment.

According to this embodiment, as hereinabove described, a resistive element can also be formed in the fabrication method in addition to an effect similar to that attained by the eighth embodiment, for obtaining a semiconductor device having improved functions.

Fourteenth Embodiment

FIGS. 57 to 60 are sectional views of a semiconductor device showing steps in a process of fabricating a BiCMOS device according to a fourteenth embodiment of the present invention.

Figure 57:
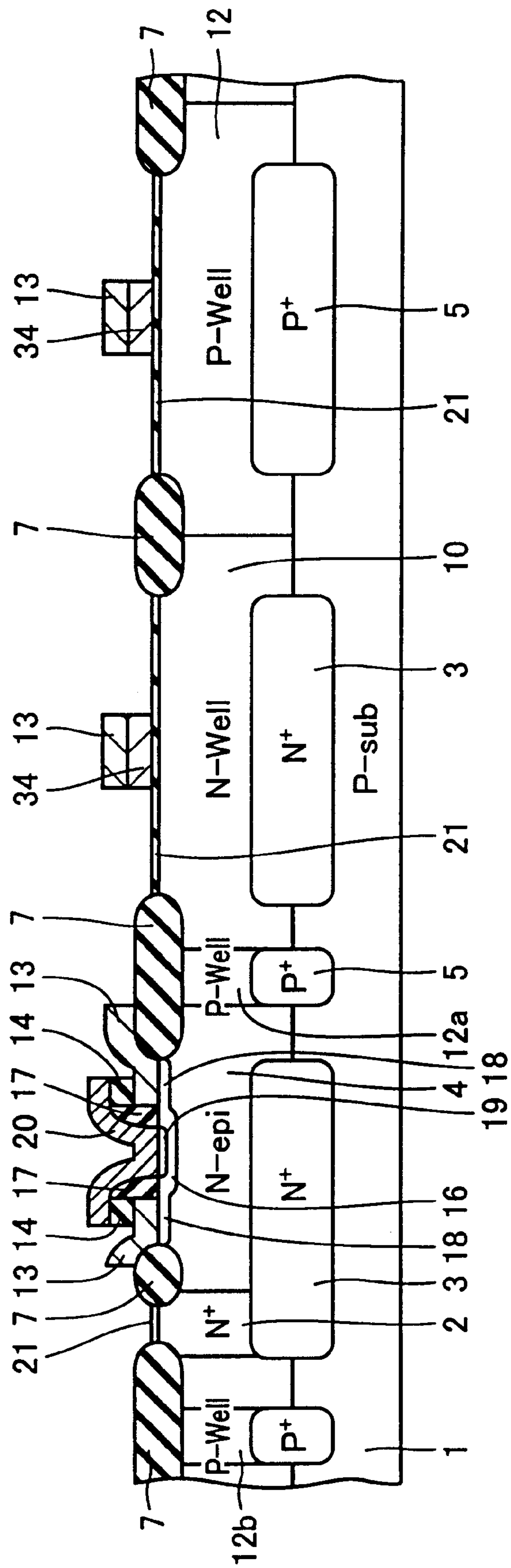
FIGS. 57 to 60 are sectional views of a semiconductor device successively showing first to fourth steps in a method of fabricating a BiCMOS device according to a fourteenth embodiment of the present invention.

Referring to FIG. 57, steps similar to those shown in FIGS. 33 to 35 are carried out similarly to the eighth embodiment.

Figure 58:
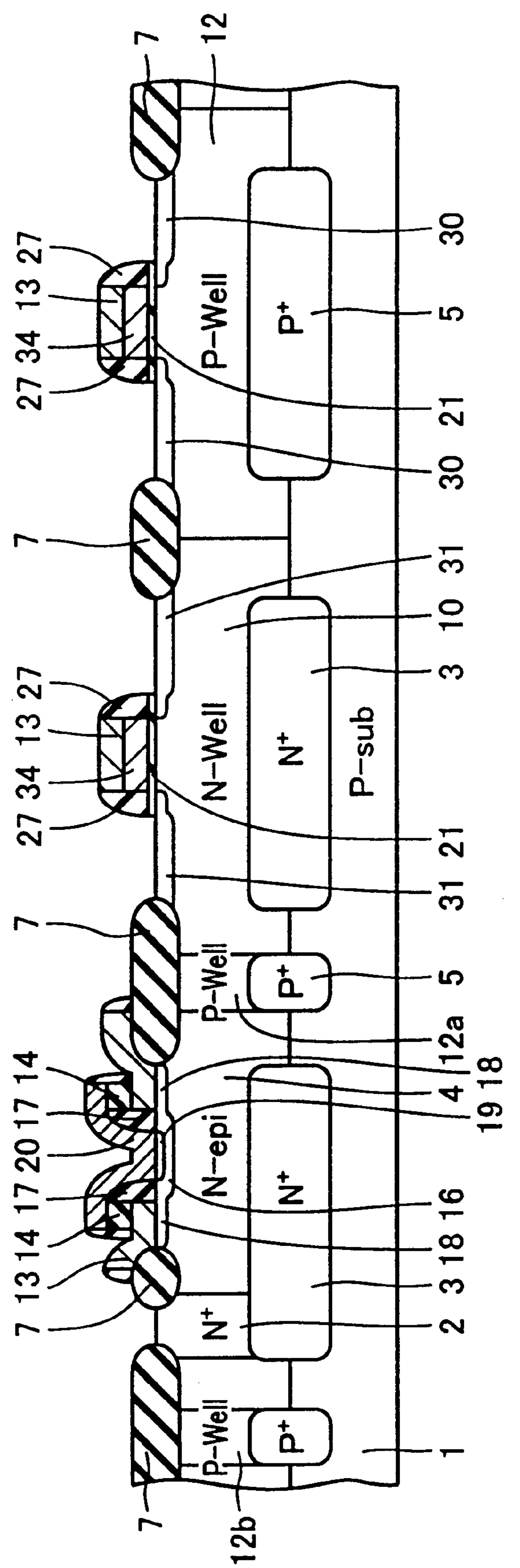

Referring to FIG. 58, steps similar to those of the prior art shown in FIGS. 78 to 81 are carried out.

Figure 59:
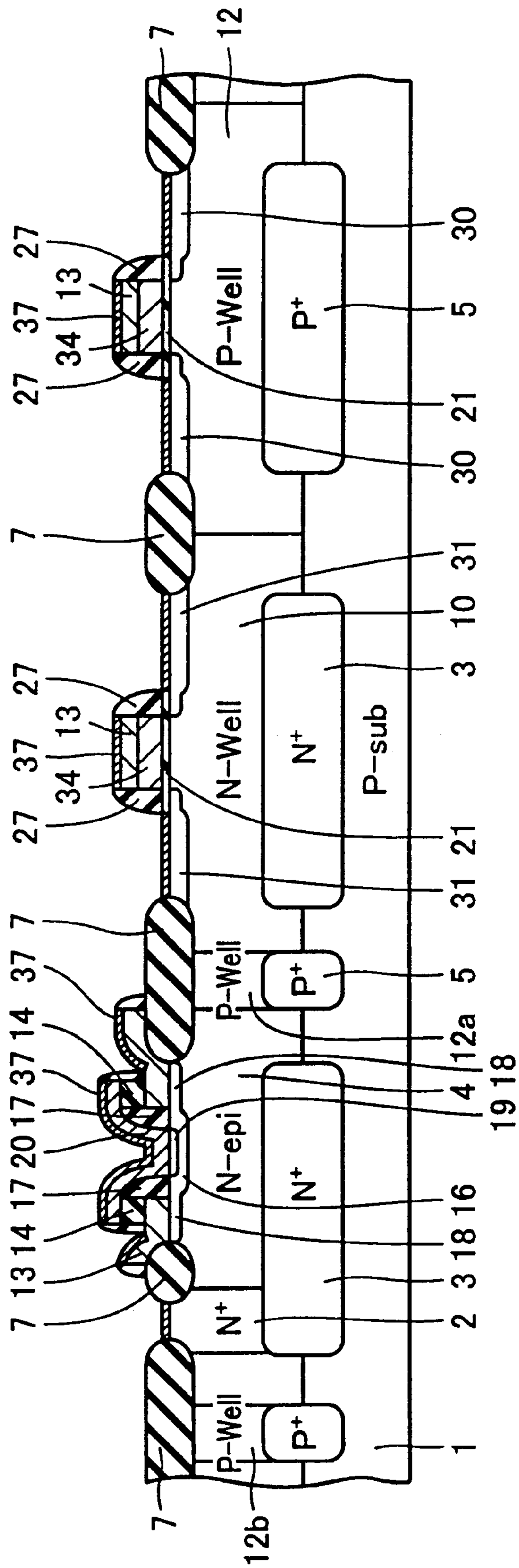

Referring to FIG. 59, a metal film of Co, Ti or Ni, for example, is deposited by about 10 nm by sputtering, and parts of this metal film located on silicon parts are silicified by lamp annealing. Then, only the remaining parts, not silicified, of the metal film located on oxide films are removed by wet etching. Then, lamp annealing is performed again for forming metal suicide films 37 of low resistance.

Figure 60:
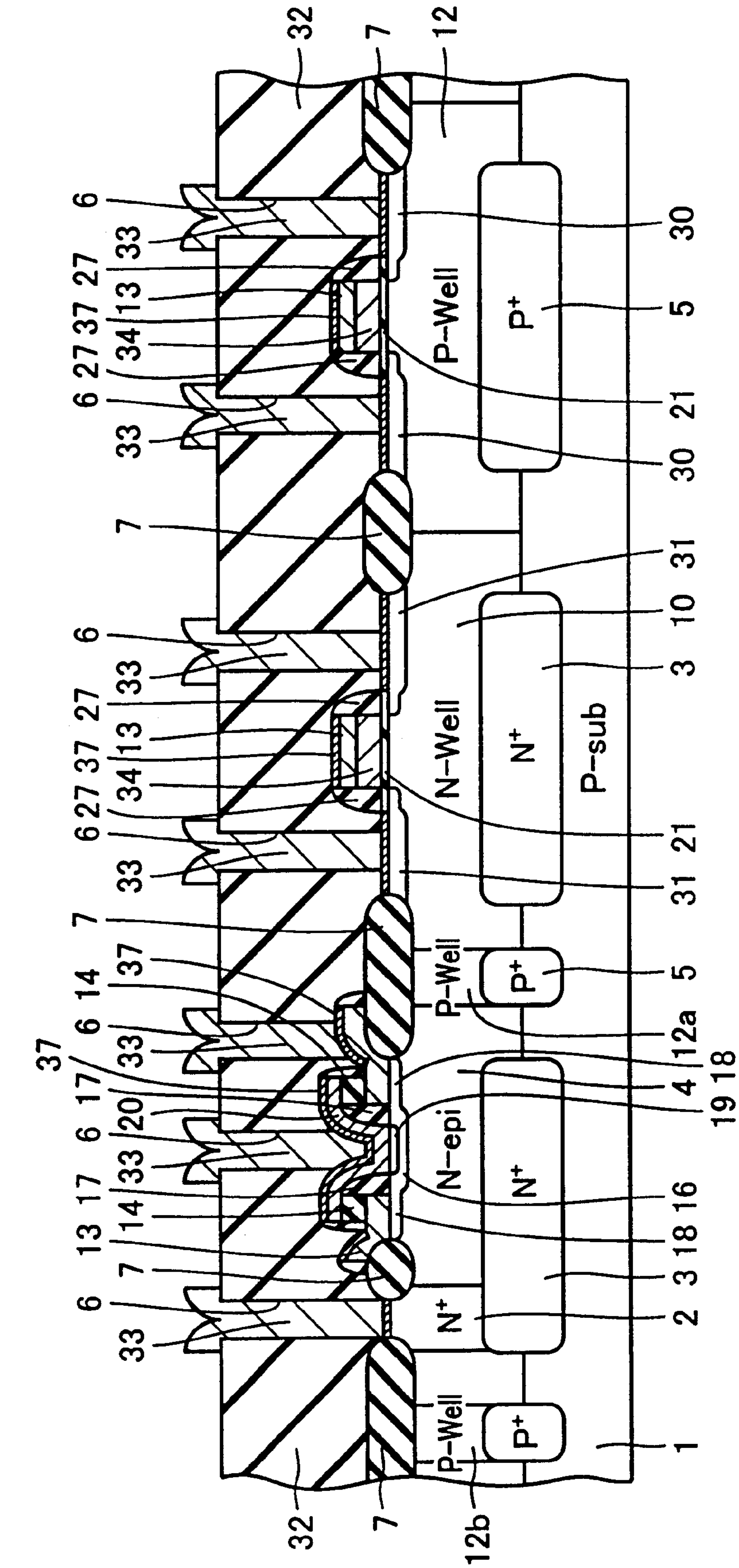

Referring to FIG. 60, steps similar to those of the prior art shown in FIGS. 78 to 82 are thereafter carried out for completing the BiCMOS device according to the fourteenth embodiment.

Thus, according to this embodiment, the silicide films 37 are formed on an $N^+$-type collector region 2, an external base electrode 13, an emitter electrode 20, gate electrodes ($N^+$-type polysilicon films 34 and polysilicon films 13) and source/drain regions 30 and 31, whereby a bipolar transistor and CMOS transistors are reduced in parasitic resistance and the respective elements are improved in high-speed performance.

According to the fourteenth embodiment, as hereinabove described, the bipolar transistor and the CMOS transistors are effectively improved in high-speed performance in addition to an effect similar to that attained by the eighth embodiment.

Fifteenth Embodiment

FIGS. 61 to 64 are sectional views of a semiconductor device showing steps in a process of fabricating a BiCMOS device according to a fifteenth embodiment of the present invention.

Figure 61:
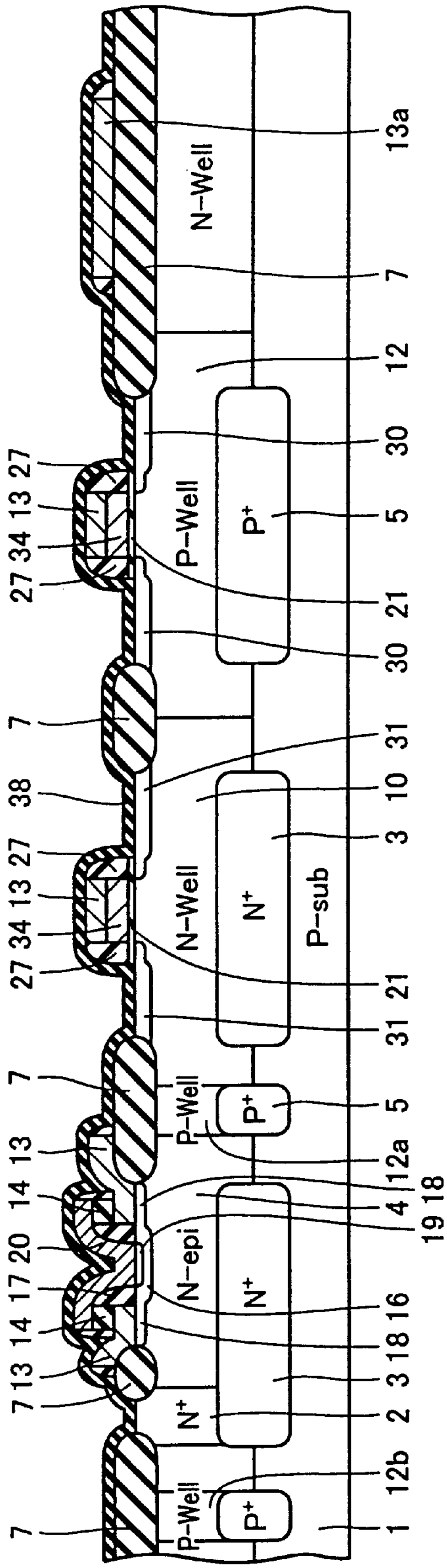
FIGS. 61 to 64 are sectional views of a semiconductor device successively showing first to fourth steps in a method of fabricating a BiCMOS device according to a fifteenth embodiment of the present invention.

Referring to FIG. 61, steps similar to those shown in FIGS. 48 to 50 are carried out similarly to the twelfth embodiment, and thereafter steps similar to those of the prior art shown in FIGS. 78 to 81 are carried out. When ions 444, 555, 666 or 777 (not shown) for forming source/drain regions are implanted, a polysilicon resistor 13*a* must be protected with a resist mask (not shown) so that no impurity is implanted into the polysilicon resistor 13*a*. Then, a CVD oxide film 38 is deposited on the overall upper surface of a silicon substrate 1.

Figure 62:
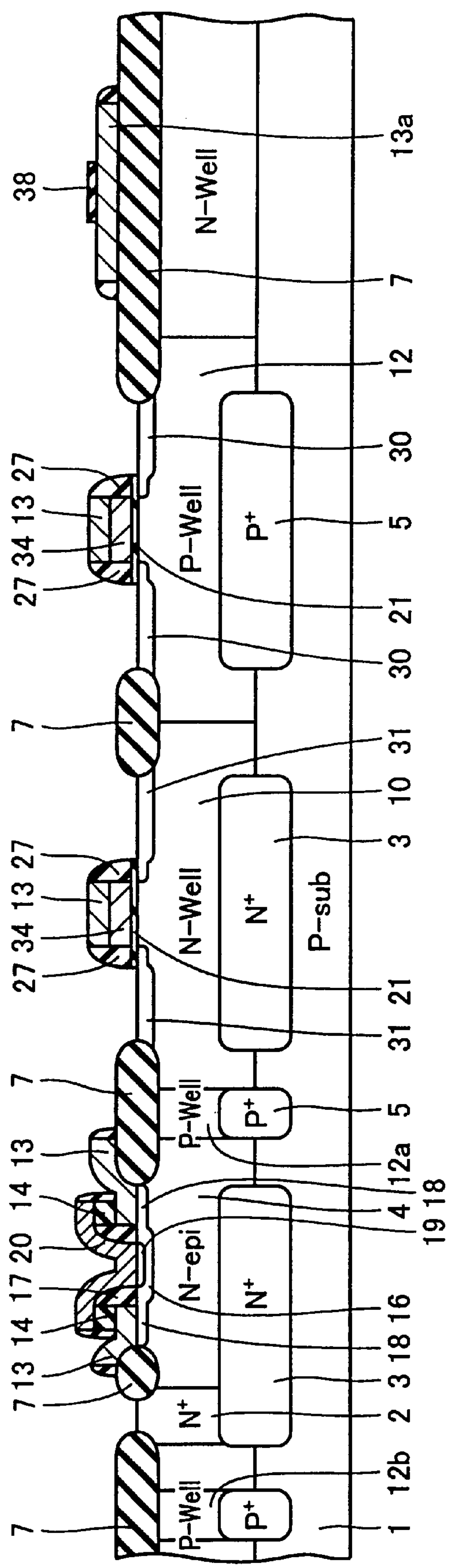

Referring to FIG. 62, the CVD oxide film 38 is partially removed from regions other than a portion for forming a polysilicon resistor 13*a* and remaining contact regions, to cover the portion for forming the polysilicon resistor 13*a*.

Figure 63:
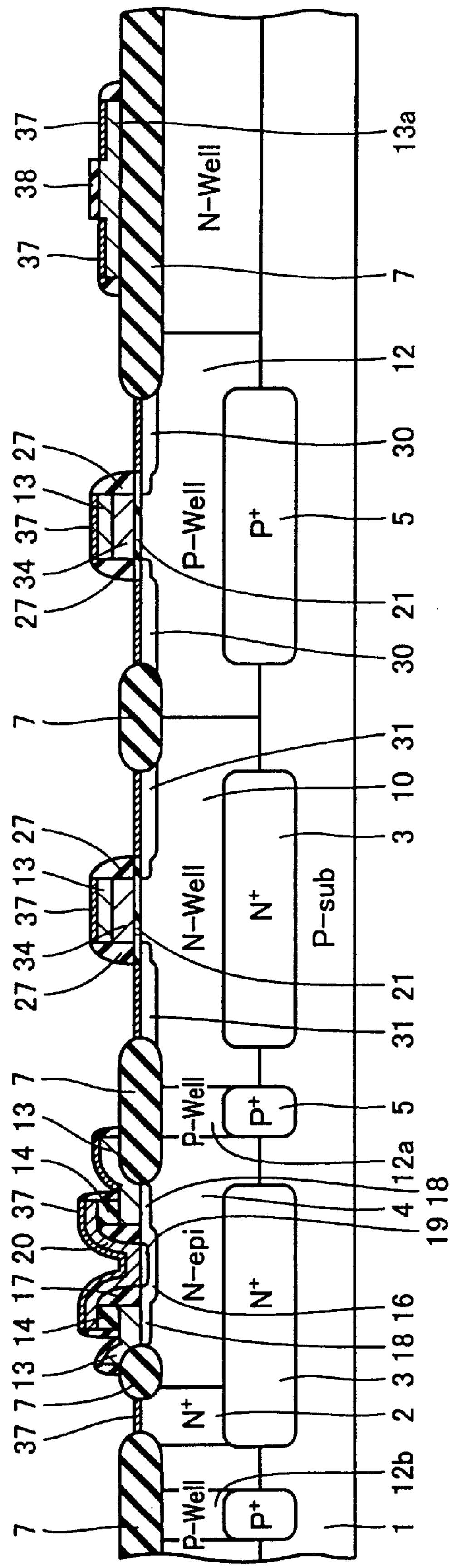

Referring to FIG. 63, metal silicide films 37 are formed through a step similar to that of the fourteenth embodiment shown in FIG. 59. At this time, no metal silicide film 37 is formed on the portion for forming the polysilicon resistor 13*a* covered with the CVD oxide film 38.

Figure 64:
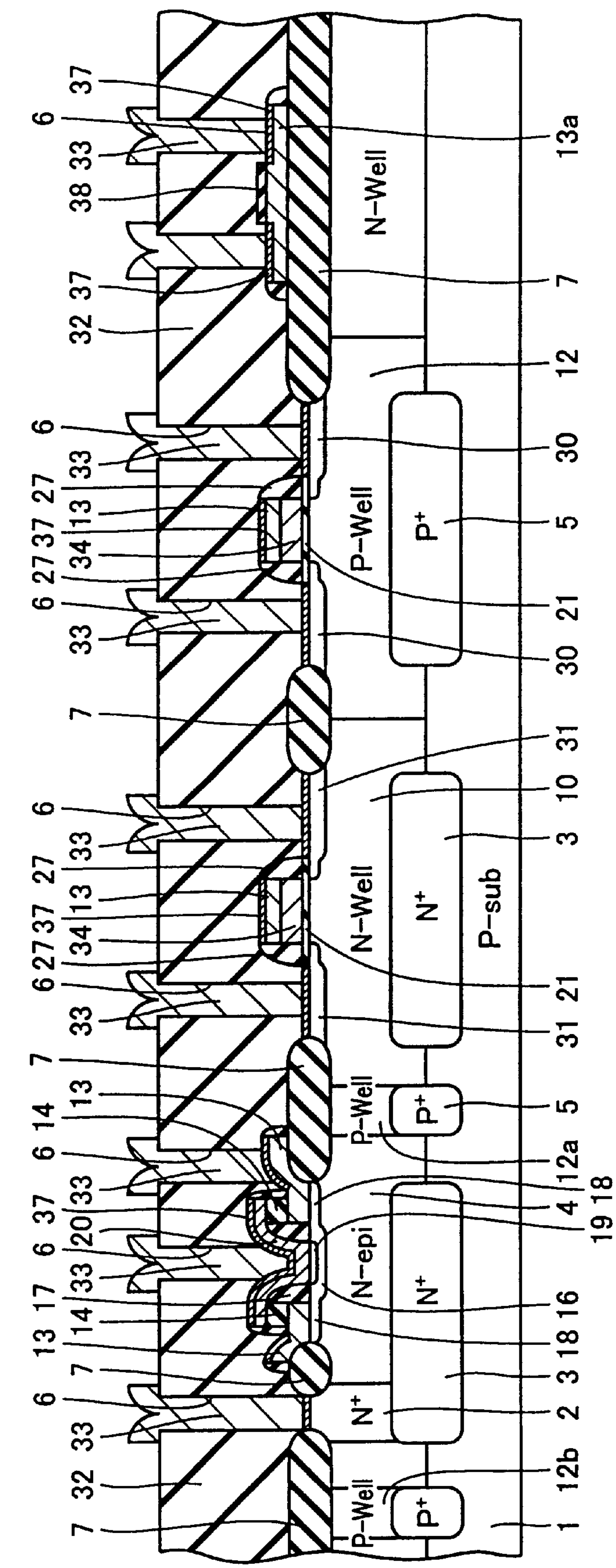

Referring to FIG. 64, a step similar to that of the fourteenth embodiment shown in FIG. 60 is thereafter carried out for completing the BiCMOS device according to the fifteenth embodiment.

Thus, according to this embodiment, an external base electrode 13 and the polysilicon resistor 13*a* are simultaneously formed in a fabrication method similar to that according to the fourteenth embodiment.

According to the fifteenth embodiment, as hereinabove described, a resistive element can be formed in the fabrication method in addition to an effect similar to that attained by the fourteenth embodiment, for obtaining a semiconductor device having improved functions.

Sixteenth Embodiment

FIGS. 65 to 68 are sectional views of a semiconductor device showing steps in a process of fabricating a BiCMOS device according to a sixteenth embodiment of the present invention.

Figure 65:
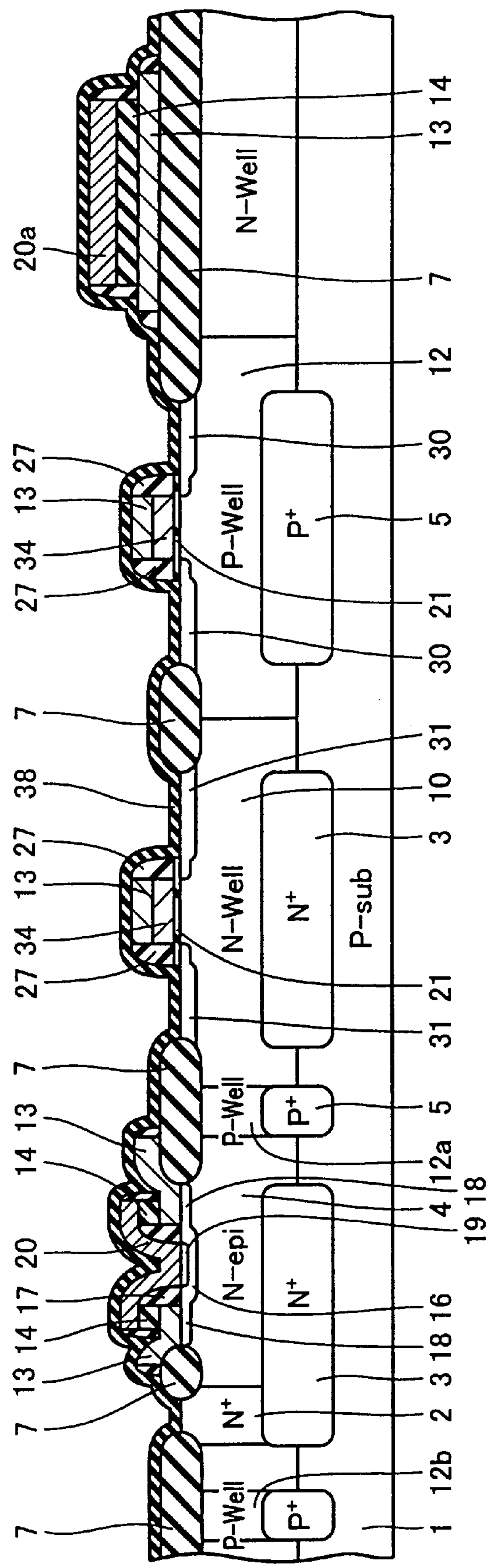
FIGS. 65 to 68 are sectional views of a semiconductor device successively showing first to fourth steps in a method of fabricating a BiCMOS device according to a sixteenth embodiment of the present invention.

Referring to FIG. 65, steps similar to those shown in FIGS. 52 to 54 are carried out similarly to the thirteenth embodiment, and thereafter steps similar to those of the prior art shown in FIGS. 78 to 81 are carried out.

When ions 444, 555, 666 or 777 (not shown) for forming source/drain regions are implanted, a polysilicon resistor 20*a* must be protected with a resist mask (not shown) so that no impurity is implanted into the polysilicon resistor 20*a*. Then, a CVD oxide film 38 is deposited on the overall surface.

Figure 66:
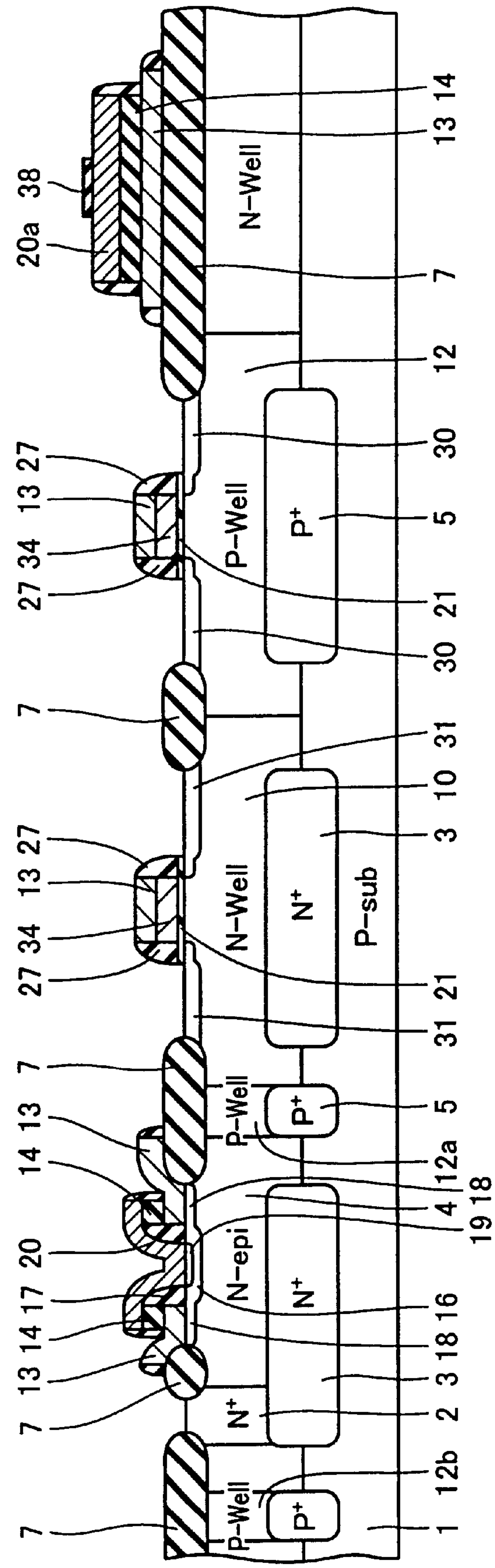

Referring to FIG. 66, the CVD oxide film 38 is partially removed from regions other than a portion for forming the polysilicon resistor 20*a* and remaining contact regions, to cover the portion for forming the polysilicon resistor 20*a*.

Figure 67:
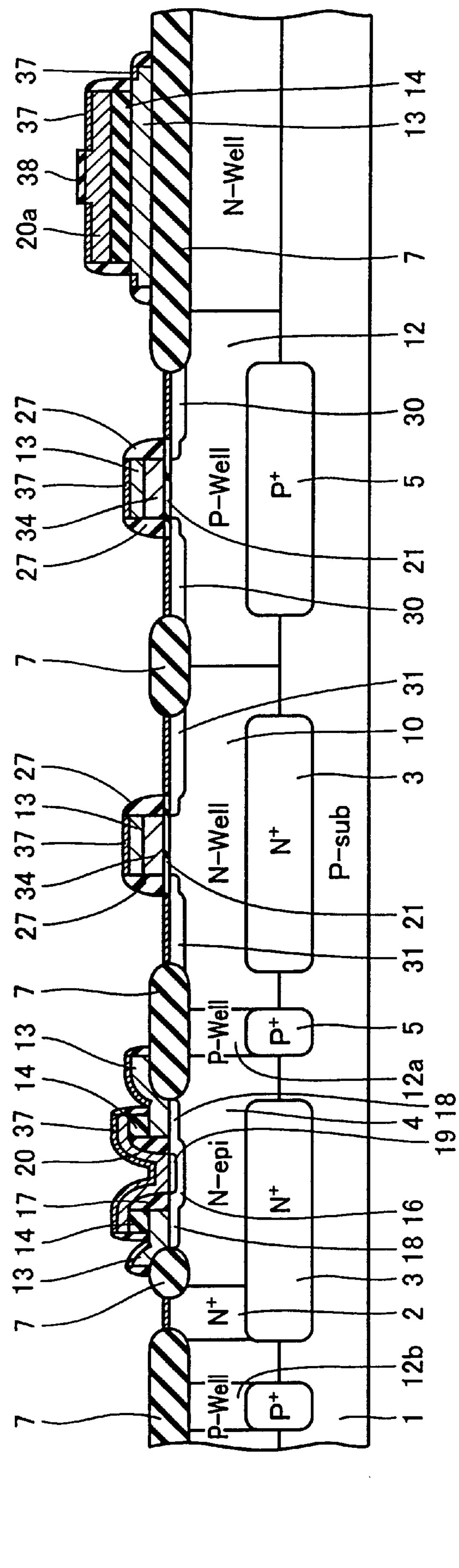

Referring to FIG. 67, metal silicide films 37 are formed through a step similar to that of the fourteenth embodiment shown in FIG. 59. At this time, no metal silicide film 37 is formed on the portion for forming the polysilicon resistor 20*a* covered with the CVD oxide film 38.

Figure 68:
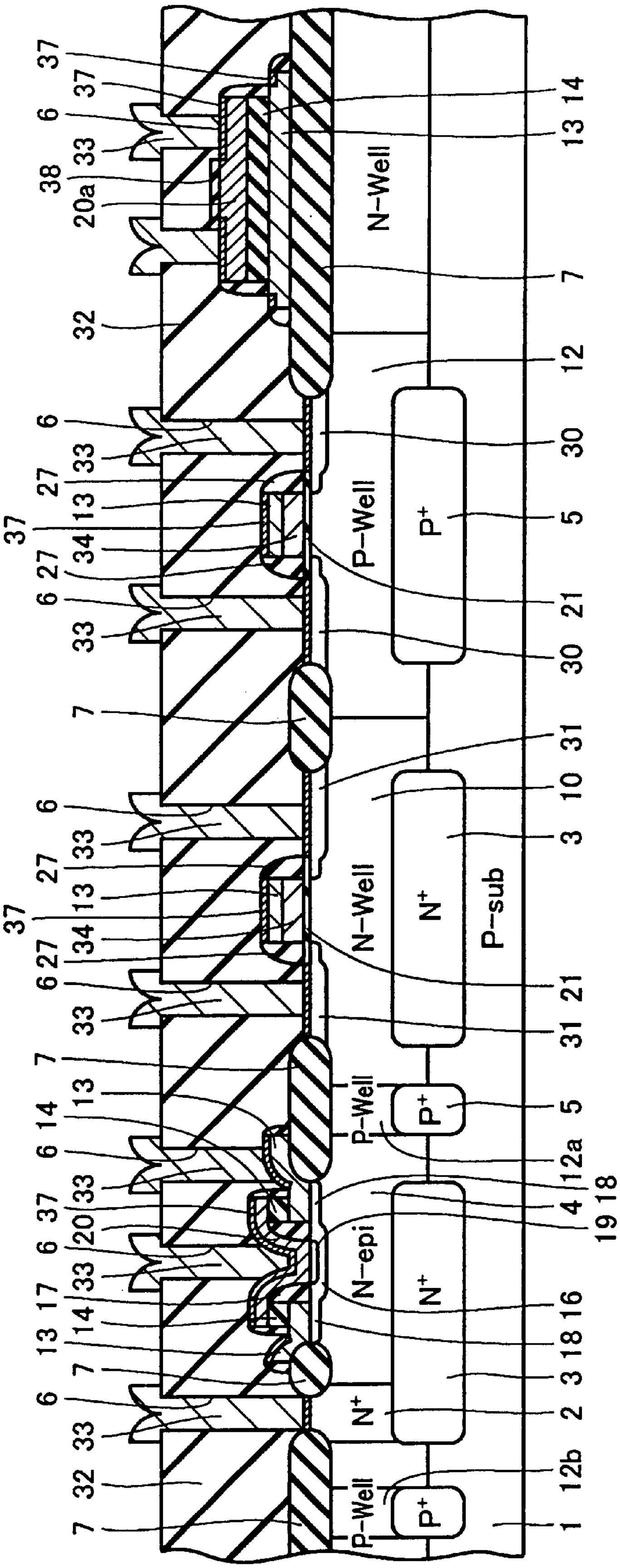

Referring to FIG. 68, a step similar to that of the fourteenth embodiment shown in FIG. 60 is thereafter carried out for completing the BiCMOS device according to the sixteenth embodiment.

Thus, according to this embodiment, an emitter electrode 20 and the polysilicon resistor 20*a* are simultaneously formed in a fabrication method similar to that according to the fourteenth embodiment. According to the sixteenth embodiment, as hereinabove described, a resistive element can be formed in the fabrication method in addition to an effect similar to that attained by the fourteenth embodiment, for attaining an effect improving functions.

Seventeenth Embodiment

Figure 69:
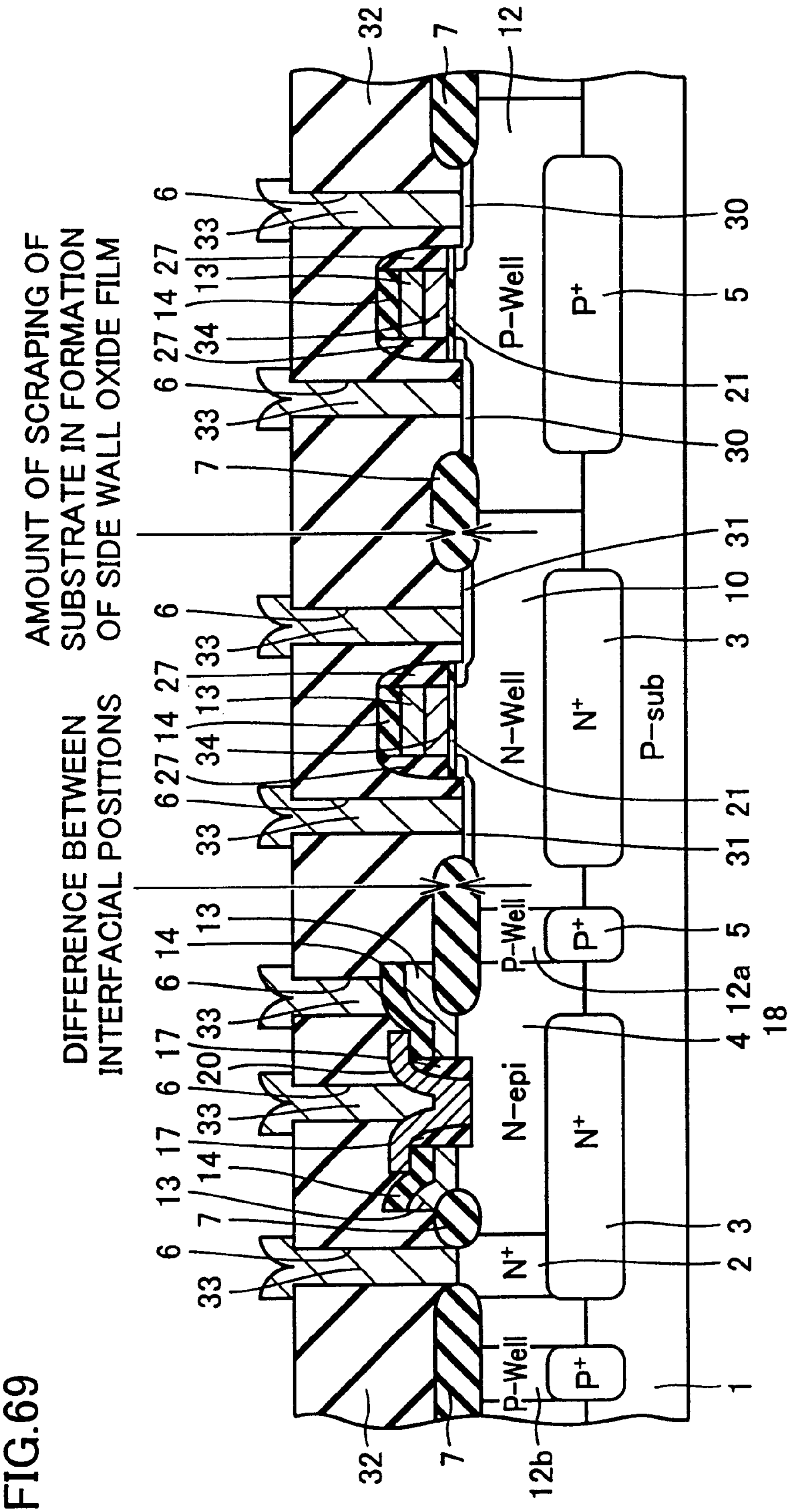
FIG. 69 is a sectional view of a BiCMOS device obtained by the method according to any of the first to sixteenth embodiments of the present invention.
Figure 70:
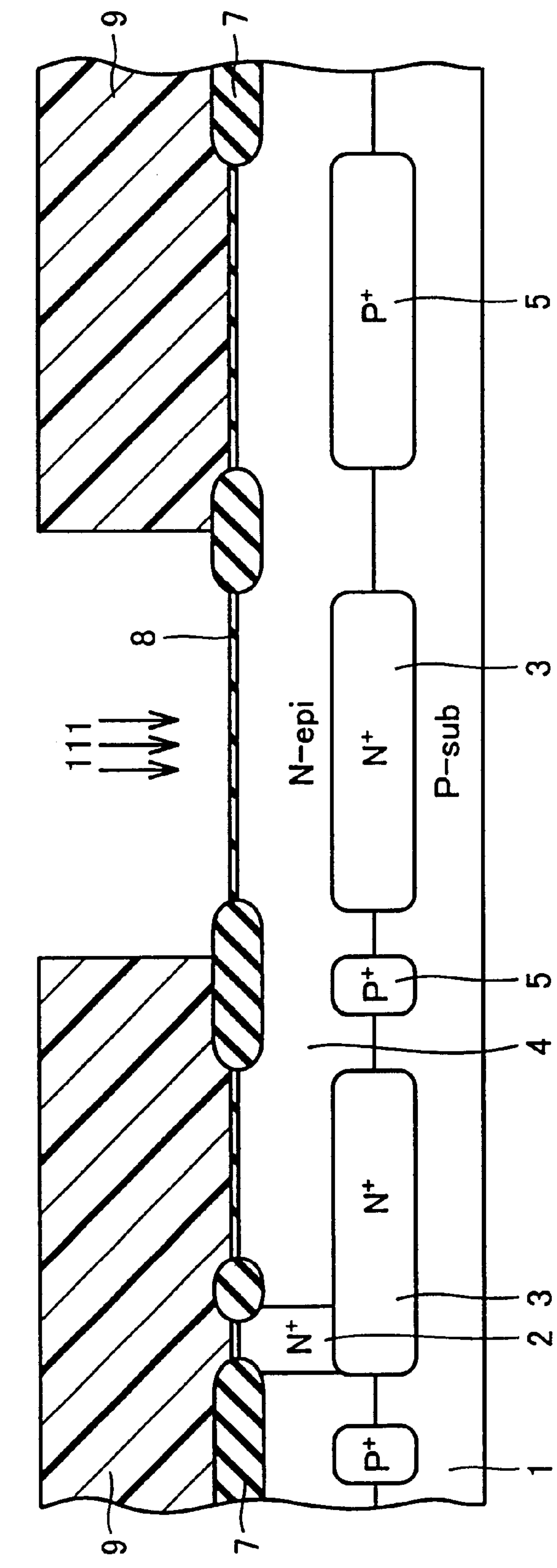
FIGS. 70 to 82 are sectional views of a semiconductor device successively showing first to thirteenth steps in a conventional method of fabricating a BiCMOS device.
Figure 71:
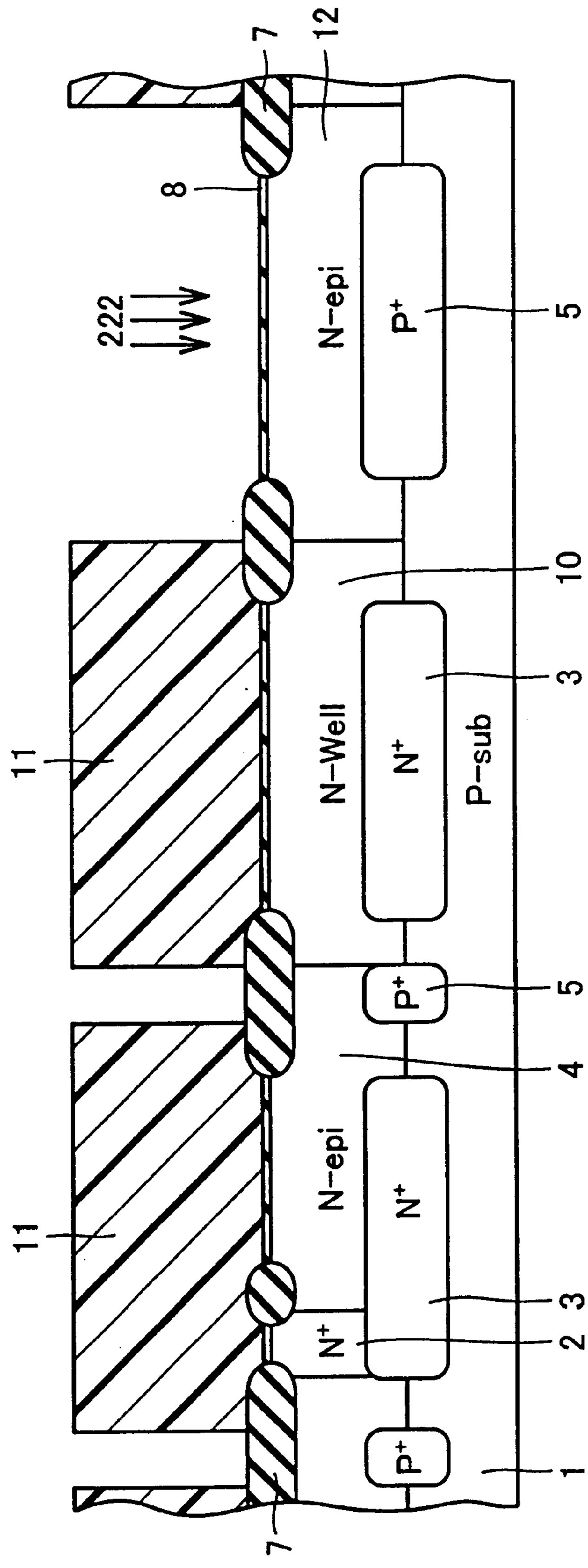
Figure 72:
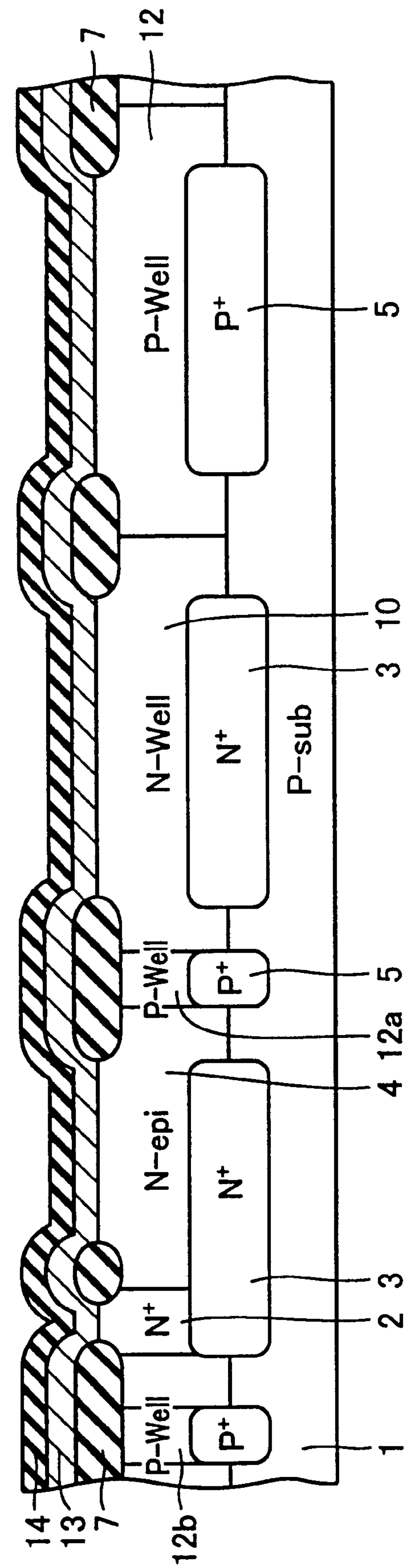
Figure 73:
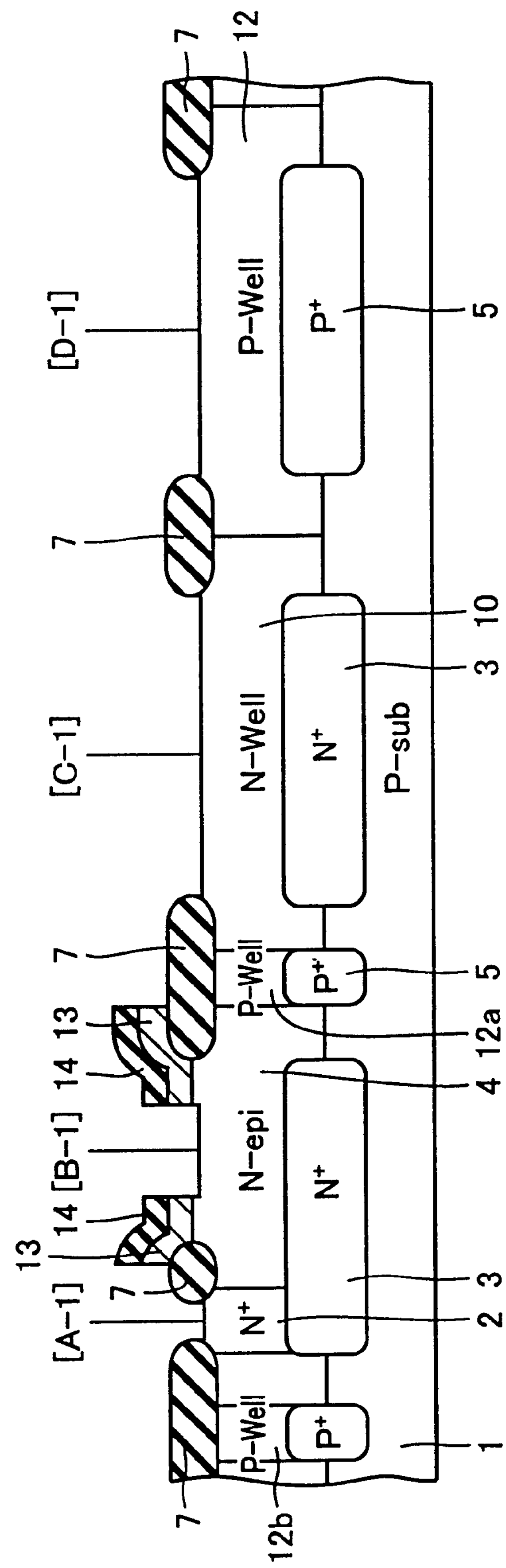
Figure 74:
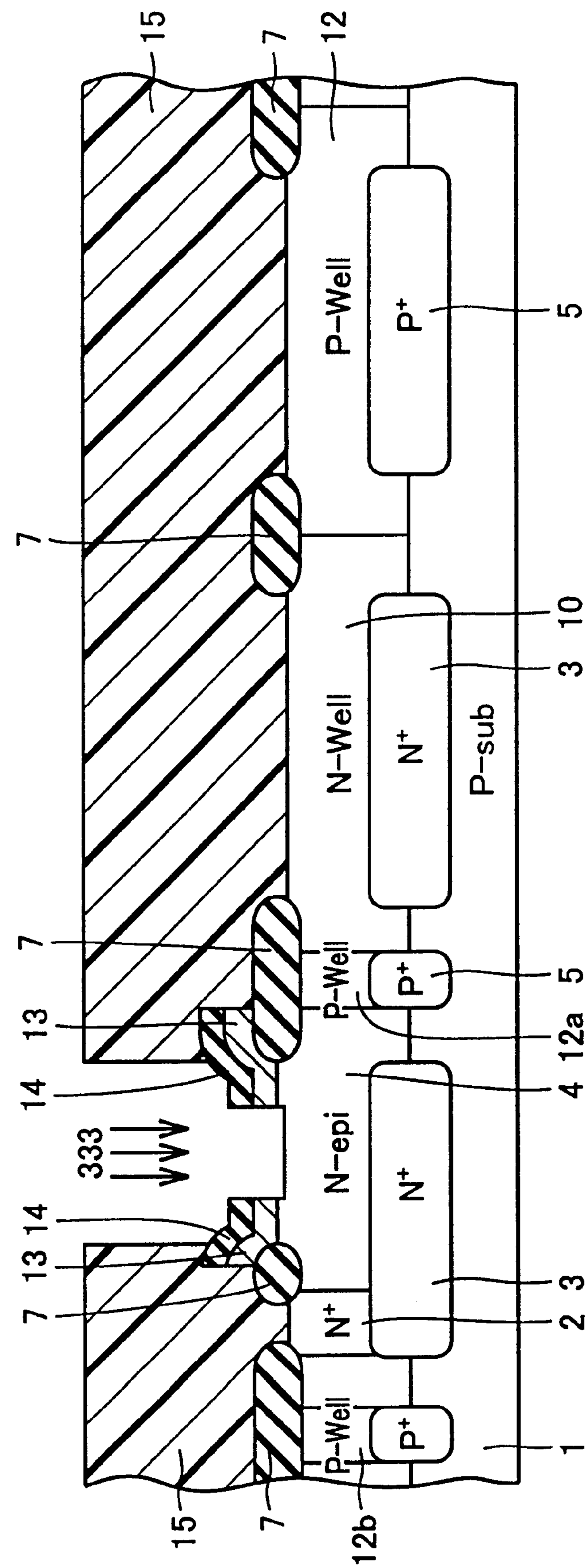
Figure 75:
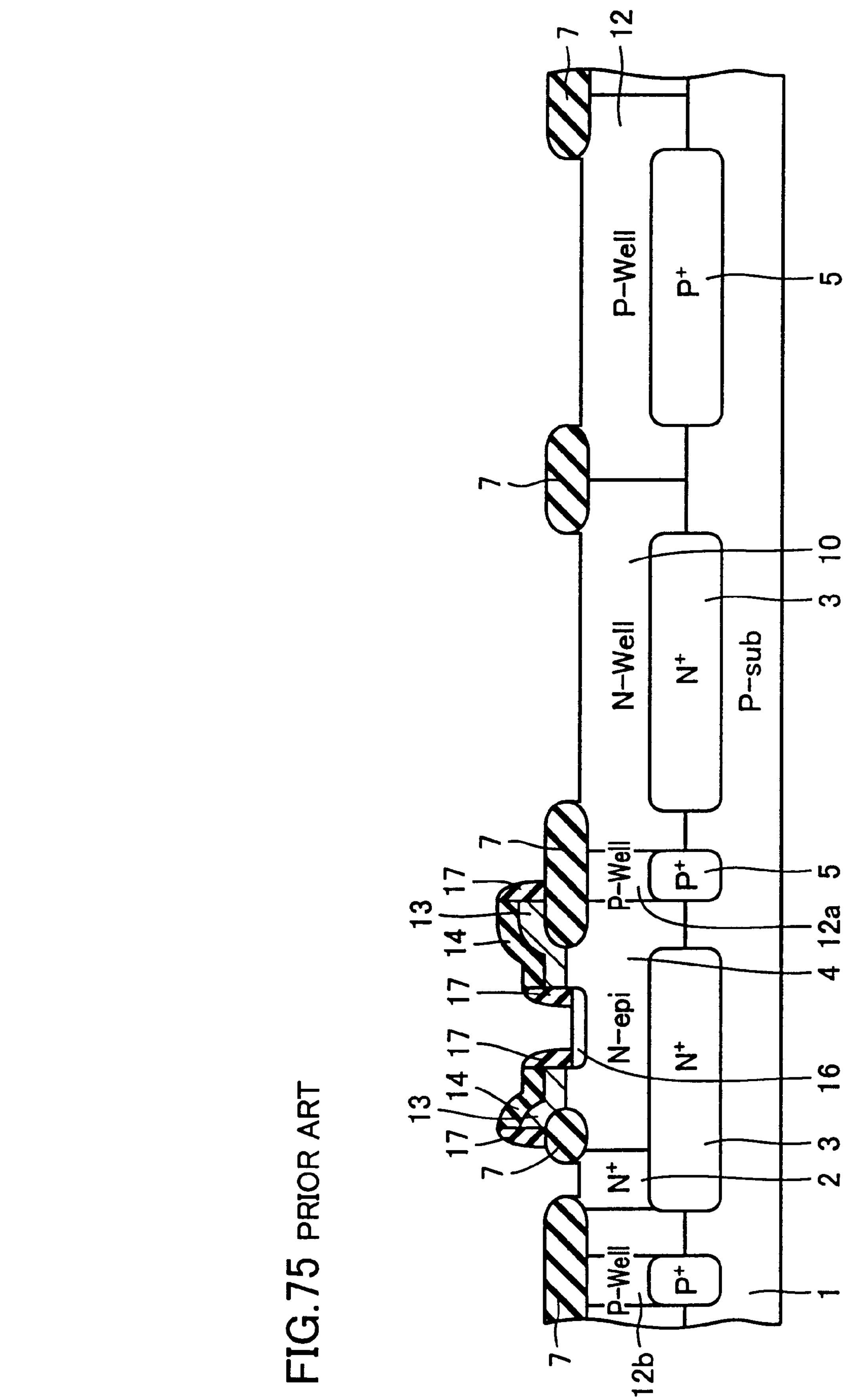
Figure 76:
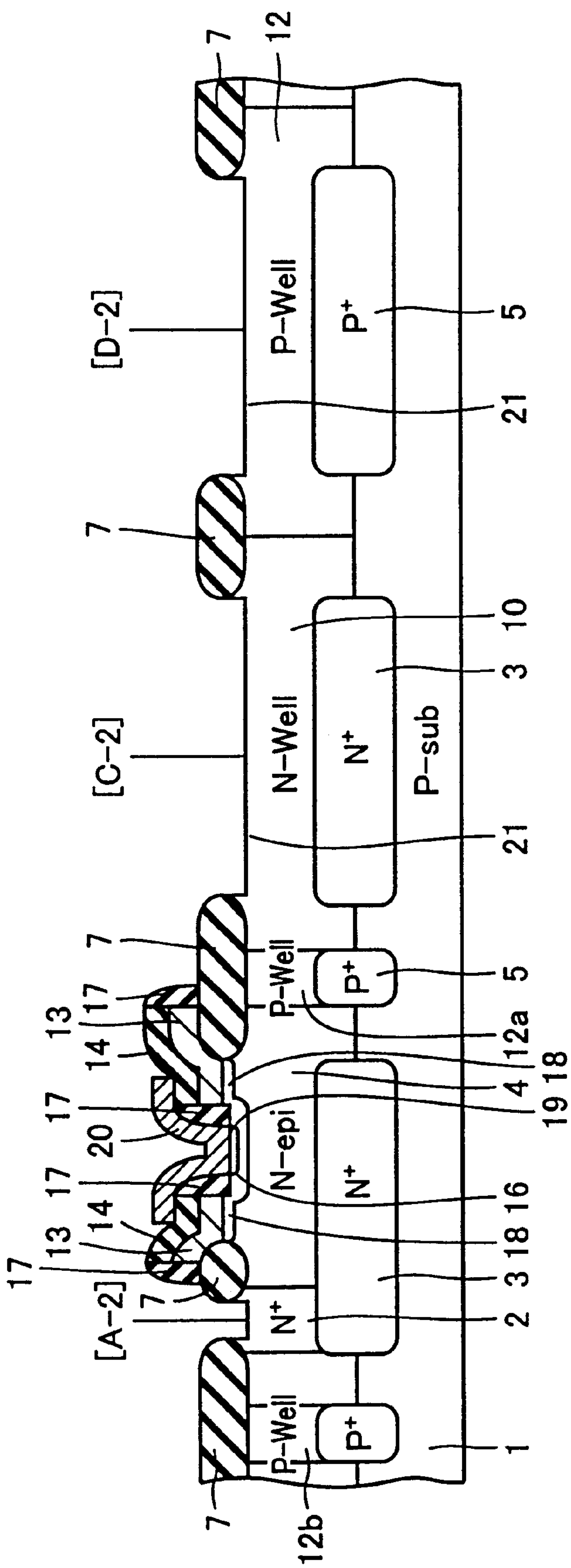
Figure 77:
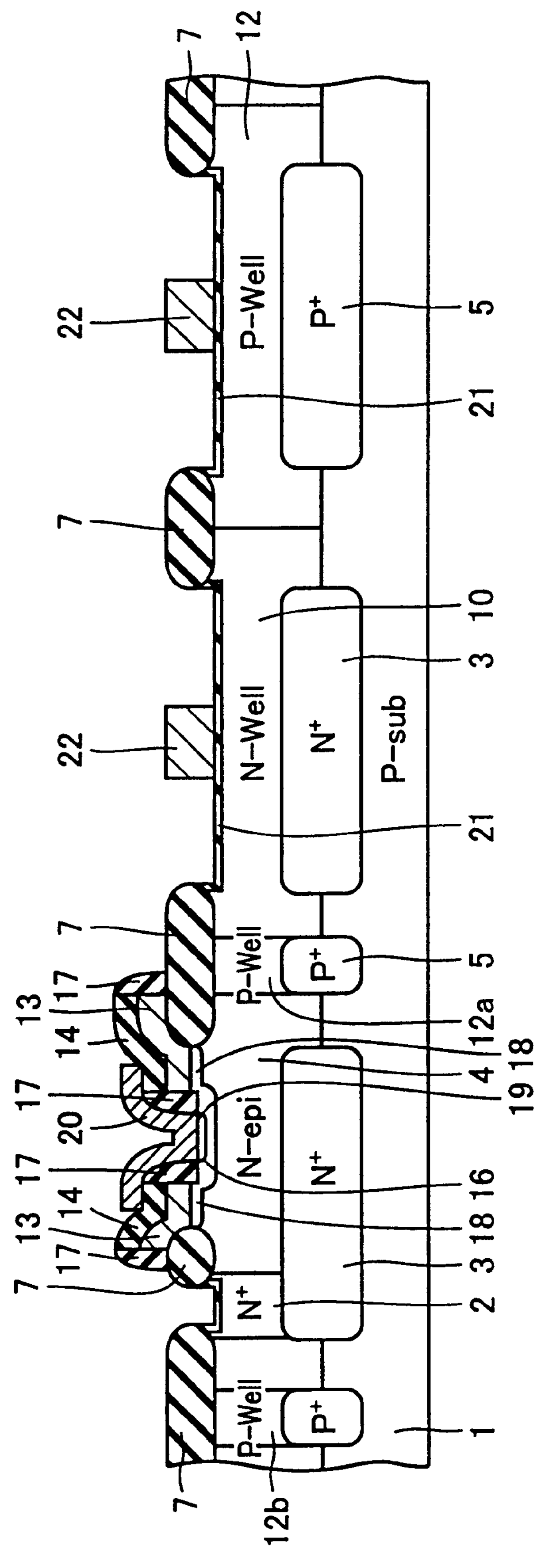
Figure 78:
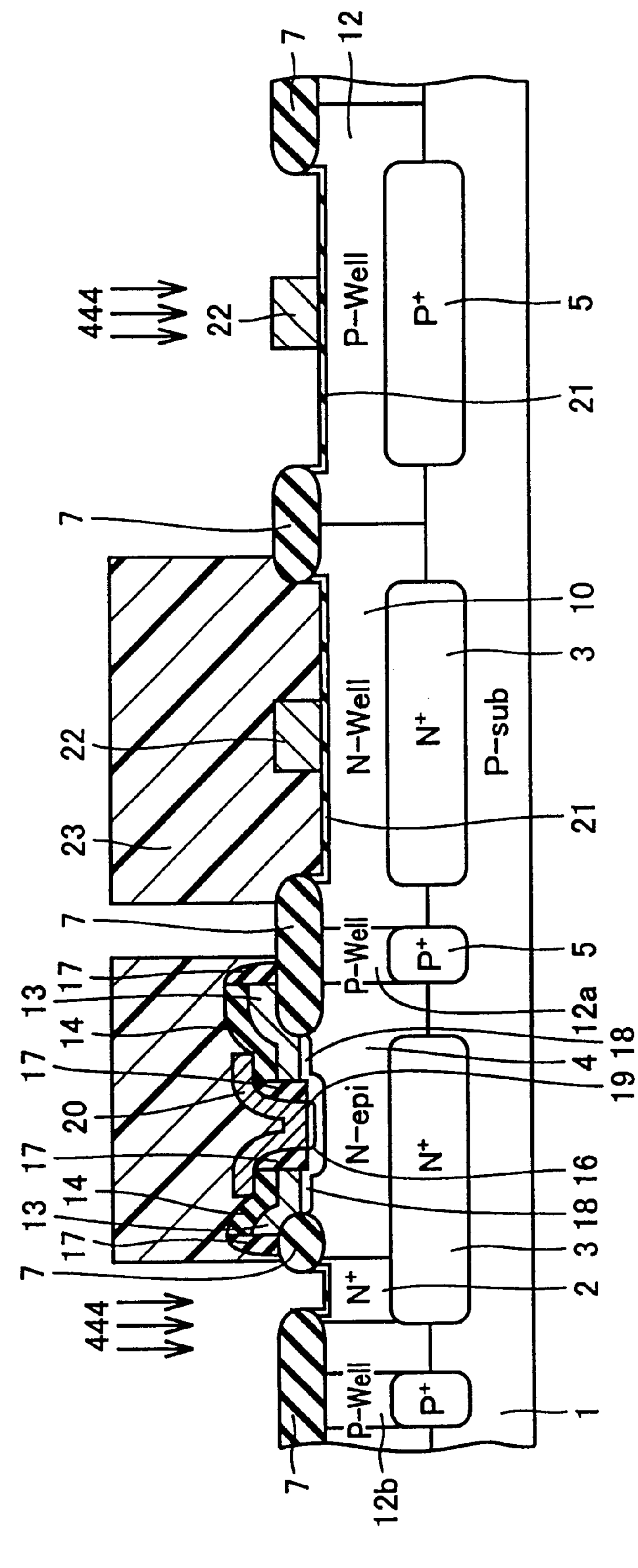
Figure 79:
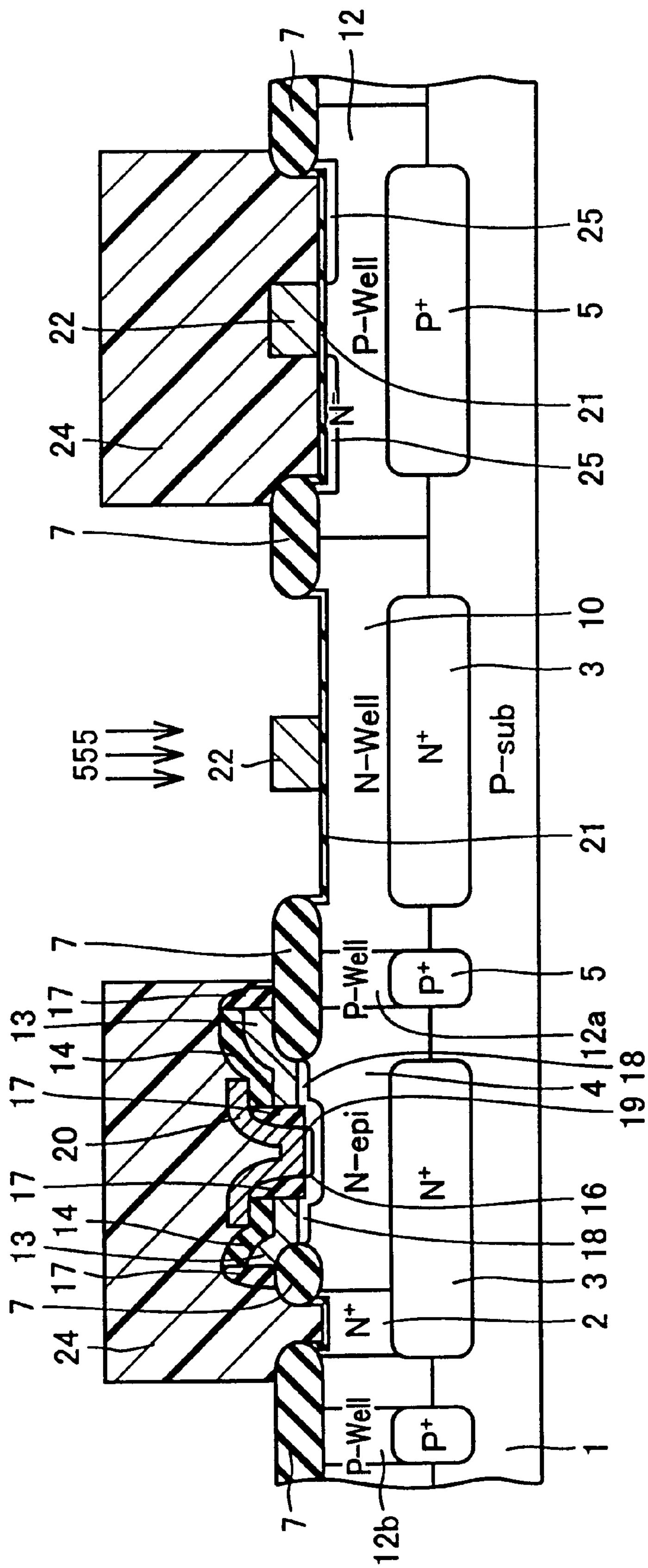
Figure 80:
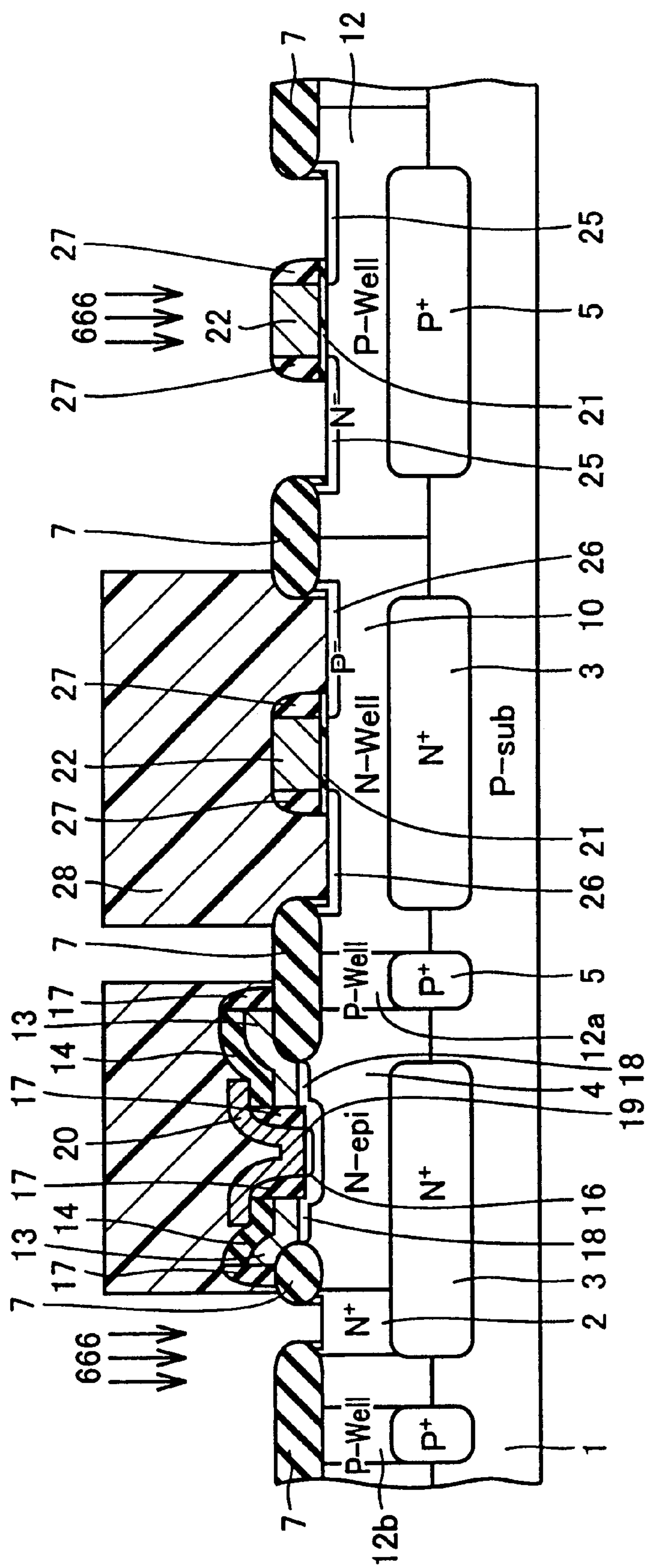
Figure 81:
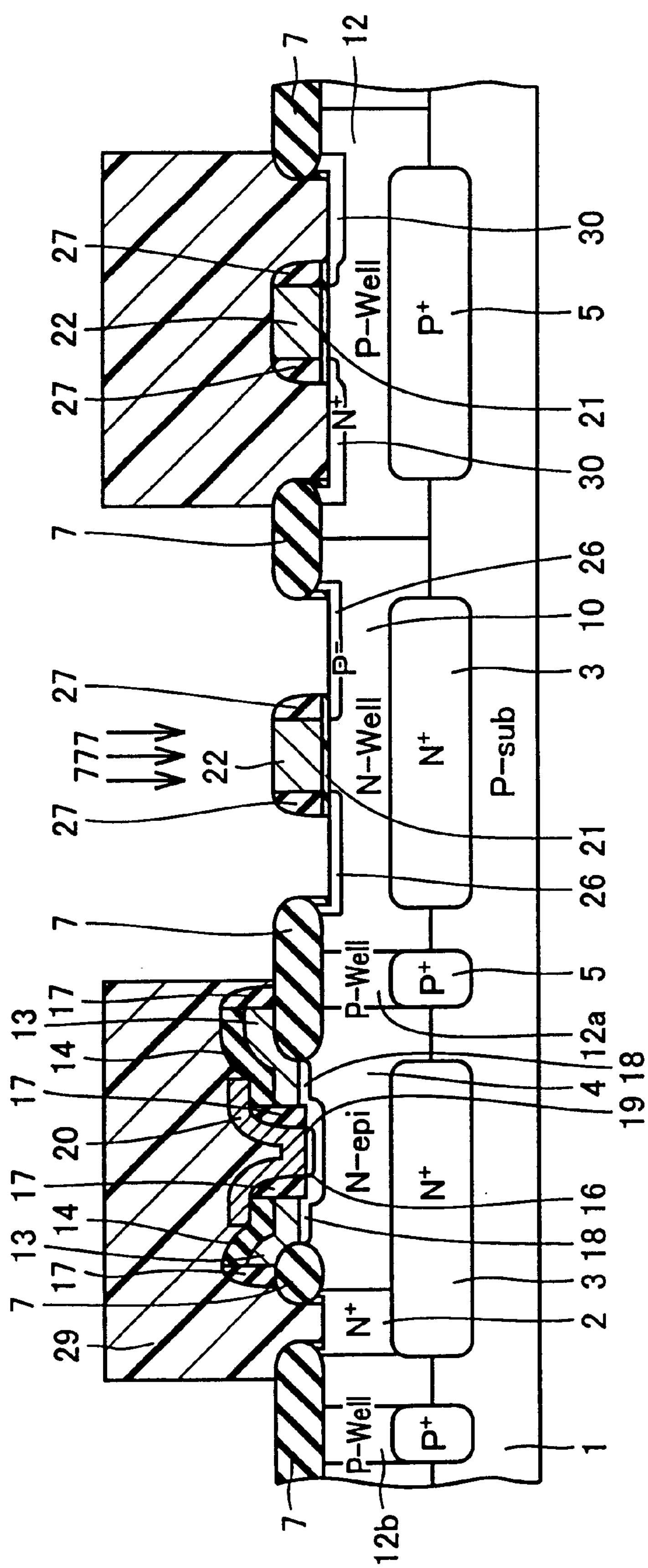
Figure 82:
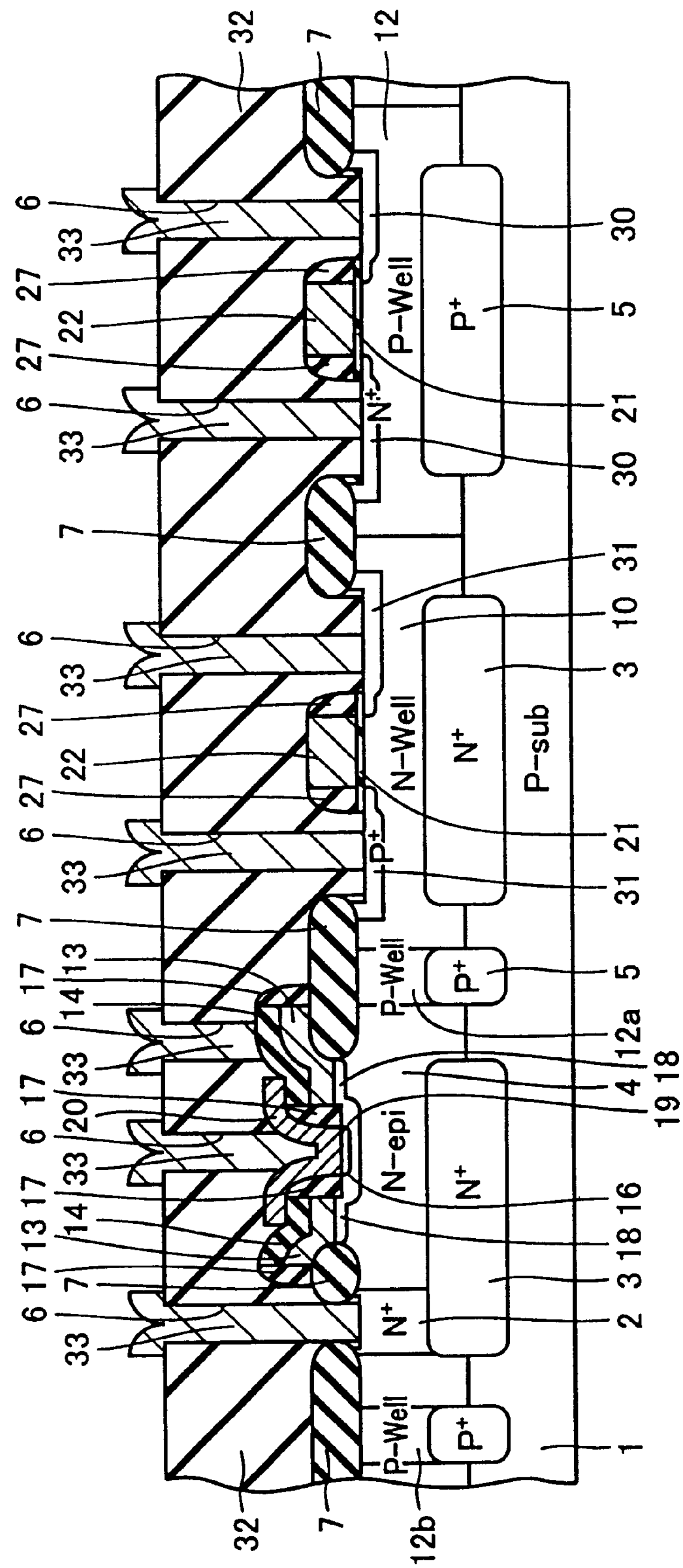

FIG. 69 is a sectional view for illustrating the structure of a BiCMOS device obtained by the method according to the present invention.

Referring to FIG. 69, the position of the interface between each gate electrode (the $N^+$-type polysilicon film 34 and the polysilicon film 13) and the gate oxide film 21 is higher than the position of the interface between the external base electrode 13 of the bipolar transistor and the silicon substrate 1 in the structure of each of the BiCMOS devices according to the first to sixteenth embodiments. This is now described in detail.

As shown in FIG. 1 illustrating the BiCMOS device according to the first embodiment, for example, the surfaces of the N-type epitaxial layer 4 of the bipolar transistor part, the N-type well region 10 of the PMOS transistor part and the P-type well region 12 of the NMOS transistor part are gate-oxidized. While there is such a possibility that the thicknesses of the gate oxide films 21 differ from each other due to influence by different substrate polarities and impurity concentrations in the respective regions, the surface of the epitaxial layer 4 of the bipolar transistor part is removed by etching. Therefore, the positions of the surface parts of the gate oxide films 21 are necessarily higher than the position of the surface of the N-type epitaxial layer 4.

In the structure of the BiCMOS device fabricated by any of the methods according to the first to sixteenth embodiments, therefore, the position of the interface between each gate electrode (the $N^+$-type polysilicon film 34 and the polysilicon film 13) and the gate oxide film 21 is higher than the position of the interface between the external base electrode 13 of the bipolar transistor and the silicon substrate 1.

Further, the source/drain regions 30 and 31 are slightly scraped off (up to about 20 nm) when the side wall oxide films 27 of the CMOS transistors are formed. When silicide films are formed as in the fifteenth or sixteenth embodiment, further, the source/drain regions 30 and 31 are further slightly scraped off (up to about 10 nm) due to etching of the CVD oxide film 38.

However, the amount of this scraping is extremely small as compared with the amount (up to about 200 nm) of etching of the external base electrode 13 and the emitter electrode 20 observed in the prior art.

According to the inventive structure, therefore, the step between the bipolar transistor and each CMOS transistor can be reduced. Further, the difference between the depths of the contact holes 6 can be reduced due to such reduction of the step. Also when a long etching time is set in the deep contact holes 6 with a margin, therefore, the shallow contact hole 6 can be prevented from punch-through on the emitter electrode 20 or in the external base electrode 13, for example.

The contact hole 6 located on the emitter electrode 20 has a conical shape and hence contact etching rapidly progresses on the surface of the emitter electrode 20 around the contact hole 6 to disadvantageously expose the surface of the emitter electrode 20 if the depths of the contact holes 6 are different from each other. This problem can be solved by the present invention.

According to the present invention, as hereinabove described, stable bipolar and CMOS transistor characteristics can be effectively attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device having a bipolar transistor and a field-effect transistor formed on a semiconductor substrate, comprising steps of:

successively forming a first oxide film for defining a gate oxide film and a first conductor film for defining a lower portion of a gate electrode on said semiconductor substrate formed with a collector region;

selectively etching said first conductor film and said first oxide film for exposing a surface portion of said semiconductor substrate located on a region for forming said bipolar transistor;

forming a second conductor film for defining an external base electrode and an upper portion of said gate electrode on said semiconductor substrate to come into contact with said exposed surface portion and cover a region for forming said field-effect transistor and said collector region;

forming a second oxide film on said semiconductor substrate to cover said second conductor film;

selectively etching said second conductor film and said second oxide film for exposing a surface portion of said semiconductor substrate thereby opening an emitter region;

forming a third conductor film for defining an emitter electrode on said second oxide film to come into contact with said emitter region;

patterning said third conductor film for forming said emitter electrode on said semiconductor substrate; and patterning said second oxide film, said second conductor film and said first conductor film for simultaneously forming said external base electrode and said gate electrode.

2. The method of fabricating a semiconductor device according to claim 1, further comprising a step of partially removing said second conductor film by etching around a portion for defining said external base electrode after forming said second conductor film in advance of forming said second oxide film.

3. The method of fabricating a semiconductor device according to claim 1, further comprising a step of annealing said semiconductor substrate after simultaneously forming said external base electrode and said gate electrode.

4. The method of fabricating a semiconductor device according to claim 1, patterning said second conductor film to simultaneously form a resistive element in said step of patterning said second oxide film, said second conductor film and said first conductor film.

5. The method of fabricating a semiconductor device according to claim 1, patterning said third conductor film to simultaneously form a resistive element in said step of patterning said third conductor film for forming said emitter electrode on said semiconductor substrate.

6. The method of fabricating a semiconductor device according to claim 1, wherein said step of patterning said second oxide film, said second conductor film and said first conductor film for simultaneously forming said external base electrode and said gate electrode includes a step of:

first removing said second oxide film located on said external base electrode and said gate electrode by etching and thereafter patterning said second conductor film and said first conductor film for simultaneously forming said external base electrode and said gate electrode.

7. The method of fabricating a semiconductor device according to claim 6, further comprising a step of forming a silicide film on a surface of said emitter electrode, a surface of said external base electrode, a surface of said gate electrode and a surface of a source/drain region of said field-effect transistor.

8. A method of fabricating a semiconductor device having a bipolar transistor and a field-effect transistor formed on a semiconductor substrate, comprising steps of:

successively forming a first oxide film for defining a gate oxide film and a first conductor film for defining a lower portion of a gate electrode on said semiconductor substrate formed with a collector region;

selectively etching said first conductor film and said first oxide film for exposing a surface portion of said semiconductor substrate located on a region for forming said bipolar transistor;

forming a second conductor film for defining an external base electrode and an upper portion of said gate electrode on said semiconductor substrate to come into contact with said exposed surface portion and cover a region for forming said field-effect transistor and said collector region;

forming a second oxide film on said semiconductor substrate to cover said second conductor film;

selectively etching said second conductor film and said second oxide film for opening an emitter region while simultaneously partially removing said second conductor film by etching around a portion for defining said external base electrode thereby forming said external base electrode;

forming a third conductor film for defining an emitter electrode on said second oxide film to come into contact with said emitter region;

patterning said third conductor film for forming said emitter electrode on said semiconductor substrate; and patterning said second oxide film, said second conductor film and said first conductor film for forming said gate electrode.

9. The method of fabricating a semiconductor device according to claim 8, partially removing said second conductor film by etching around a resistive element thereby simultaneously forming said resistive element in said step of selectively etching said second conductor film and said second oxide film for opening said emitter region while simultaneously partially removing said second conductor film by etching around said portion for defining said external base electrode by etching thereby forming said external base electrode.

10. A method of fabricating a semiconductor device having a bipolar transistor and a field-effect transistor formed on a semiconductor substrate, comprising steps of:

successively forming a first oxide film for defining a gate oxide film and a first conductor film for defining a lower portion of a gate electrode on said semiconductor substrate formed with a collector region;

selectively etching said first conductor film and said first oxide film for exposing a surface portion of said semiconductor substrate located on a region for forming said bipolar transistor;

forming a second conductor film for defining an external base electrode and an upper portion of said gate electrode on said semiconductor substrate to come into contact with said exposed surface portion and cover a region for forming said field-effect transistor and said collector region;

forming a second oxide film on said semiconductor substrate to cover said second conductor film;

selectively etching said second conductor film and said second oxide film for opening an emitter region;

forming a third conductor film for defining an emitter electrode on said second oxide film to come into contact with said emitter region;

patterning said third conductor film for forming said emitter electrode on said semiconductor substrate;

removing said second oxide film located on said external base electrode and said gate electrode by etching;

patterning said second conductor film and said first conductor film for simultaneously forming said external base electrode, said gate electrode and a resistive element;

forming an insulator film on a partial surface of said resistive element; and forming a silicide film on a surface of said collector region, a surface of said emitter electrode, a surface of said external base electrode, a surface of said gate electrode and a surface of a source/drain region of said field-effect transistor.

* * * * *